(12) United States Patent
Nakamura et al.

(10) Patent No.: US 10,861,869 B2
(45) Date of Patent: Dec. 8, 2020

(54) THREE-DIMENSIONAL MEMORY DEVICE HAVING A SLIMMED ALUMINUM OXIDE BLOCKING DIELECTRIC AND METHOD OF MAKING SAME

(71) Applicant: SANDISK TECHNOLOGIES LLC, Addison, TX (US)

(72) Inventors: Ryo Nakamura, Yokkaichi (JP); Yu Ueda, Yokkaichi (JP); Tatsuya Hinoue, Yokkaichi (JP); Shigehisa Inoue, Yokkaichi (JP); Genta Mizuno, Yokkaichi (JP); Masanori Tsutsumi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/242,245

(22) Filed: Jan. 8, 2019

(65) Prior Publication Data

US 2020/0020715 A1    Jan. 16, 2020

Related U.S. Application Data

(60) Provisional application No. 62/698,775, filed on Jul. 16, 2018.

(51) Int. Cl.
*H01L 27/11582* (2017.01)
*H01L 21/28* (2006.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ........... H01L 21/768; H01L 21/823487; H01L 21/8239; H01L 21/11519; H01L 27/11556;
(Continued)

(56) References Cited

U.S. PATENT DOCUMENTS

| 5,915,167 A | 6/1999 | Leedy |
| 9,230,974 B1 | 1/2016 | Pachamuthu et al. |

(Continued)

OTHER PUBLICATIONS

U.S. Appl. No. 15/804,692, filed Jan. 17, 2017, SanDisk Technologies LLC.

(Continued)

*Primary Examiner* — Joseph M Galvin, III
(74) *Attorney, Agent, or Firm* — The Marbury Law Group LLC

(57) ABSTRACT

An alternating stack of insulating layers and sacrificial material layers is formed over a substrate. Memory stack structures are formed through the alternating stack. Each of the memory stack structures includes respective charge storage elements and a respective vertical semiconductor channel contacting an inner sidewall of the respective charge storage elements. The sacrificial material layers are replaced with electrically conductive layers. A polycrystalline aluminum oxide blocking dielectric layer is provided between each charge storage element and a neighboring one of the electrically conductive layers. The polycrystalline aluminum oxide blocking dielectric layer is formed by: depositing an amorphous aluminum oxide layer, converting the amorphous aluminum oxide layer into an in-process polycrystalline aluminum oxide blocking dielectric layer, and by thinning the in-process polycrystalline aluminum oxide blocking dielectric layer.

9 Claims, 55 Drawing Sheets

(51) Int. Cl.
*H01L 27/11556* (2017.01)
*H01L 27/11519* (2017.01)
*H01L 27/11524* (2017.01)
*H01L 27/11529* (2017.01)
*H01L 27/11573* (2017.01)
*H01L 27/11565* (2017.01)
*H01L 27/1157* (2017.01)

(52) U.S. Cl.
CPC .. *H01L 27/11524* (2013.01); *H01L 27/11529* (2013.01); *H01L 27/11556* (2013.01); *H01L 27/11565* (2013.01); *H01L 27/11573* (2013.01); *H01L 29/40114* (2019.08); *H01L 29/40117* (2019.08)

(58) Field of Classification Search
CPC ......... H01L 27/11565; H01L 27/11573; H01L 27/11575; H01L 27/11582; H01L 27/11519; H01L 27/11524; H01L 27/11529; H01L 27/1157; H01L 29/40114; H01L 29/40117
See application file for complete search history.

(56) References Cited

U.S. PATENT DOCUMENTS

| | | |
|---|---|---|
| 9,305,937 B1 | 4/2016 | Tsutsumi et al. |
| 9,478,558 B2 | 10/2016 | Koka et al. |
| 9,613,977 B2 | 4/2017 | Sharangpani et al. |
| 9,659,955 B1 | 5/2017 | Sharangpani et al. |
| 9,659,956 B1 | 5/2017 | Pachamuthu et al. |
| 9,875,929 B1 | 1/2018 | Pachamuthu et al. |
| 2016/0111439 A1 | 4/2016 | Tsutsumi et al. |
| 2016/0172366 A1* | 6/2016 | Koka ................ H01L 21/02356 257/314 |
| 2016/0211272 A1 | 7/2016 | Koka et al. |
| 2016/0343718 A1* | 11/2016 | Lu .................... H01L 27/11575 |
| 2016/0379989 A1 | 12/2016 | Sharangpani et al. |
| 2017/0125436 A1* | 5/2017 | Sharangpani ..... H01L 27/11582 |
| 2018/0374866 A1 | 12/2018 | Makala et al. |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

* cited by examiner

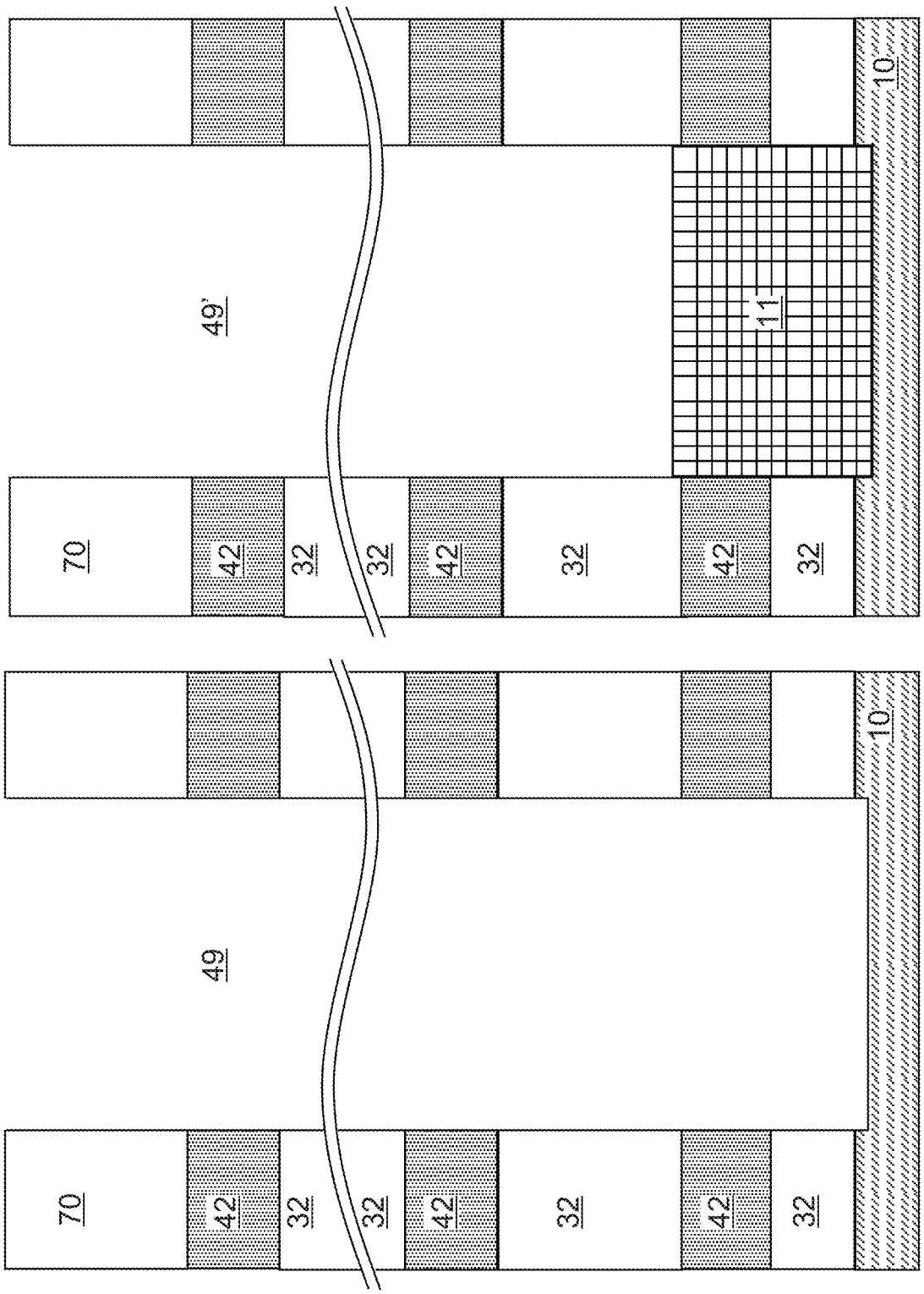

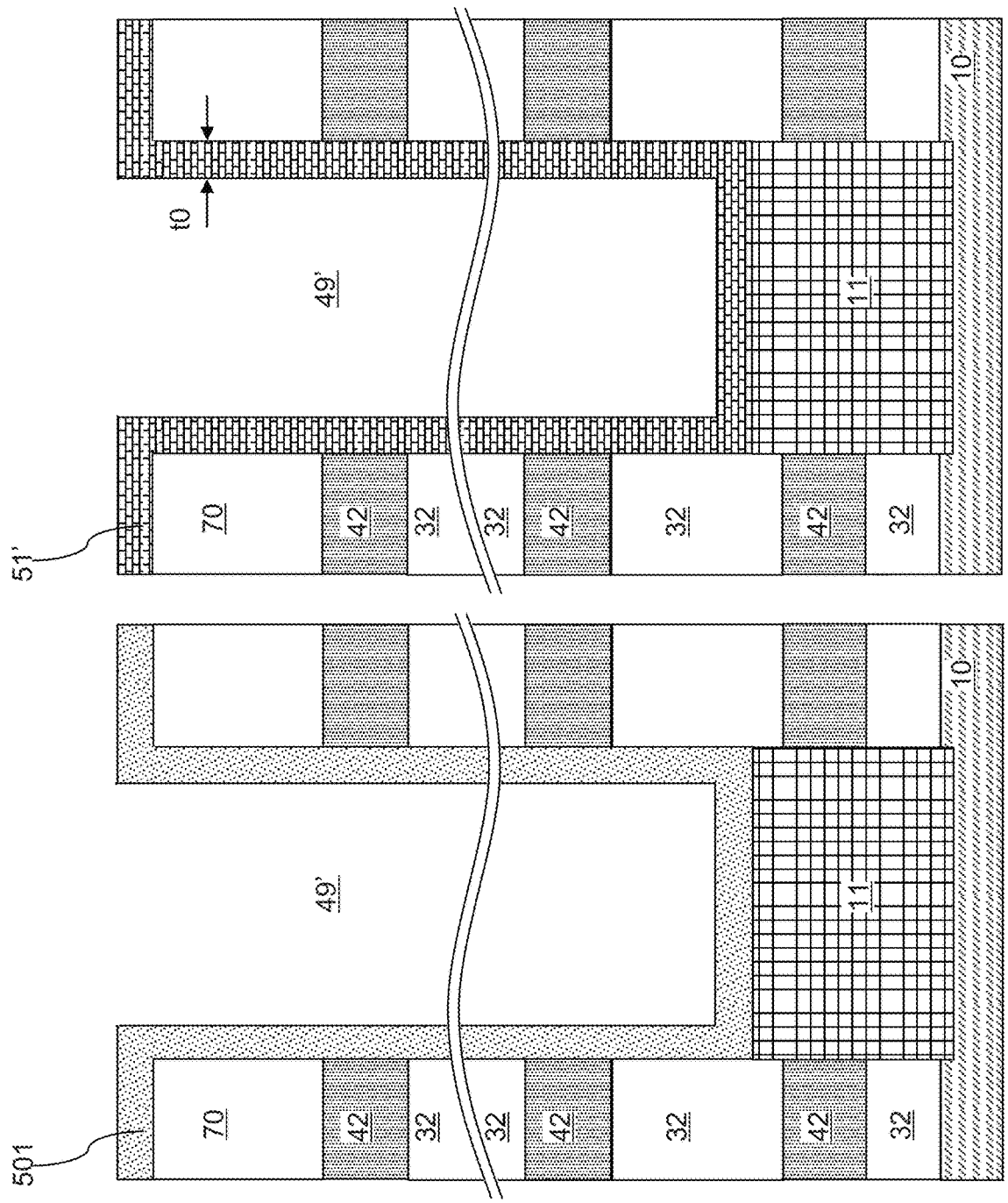

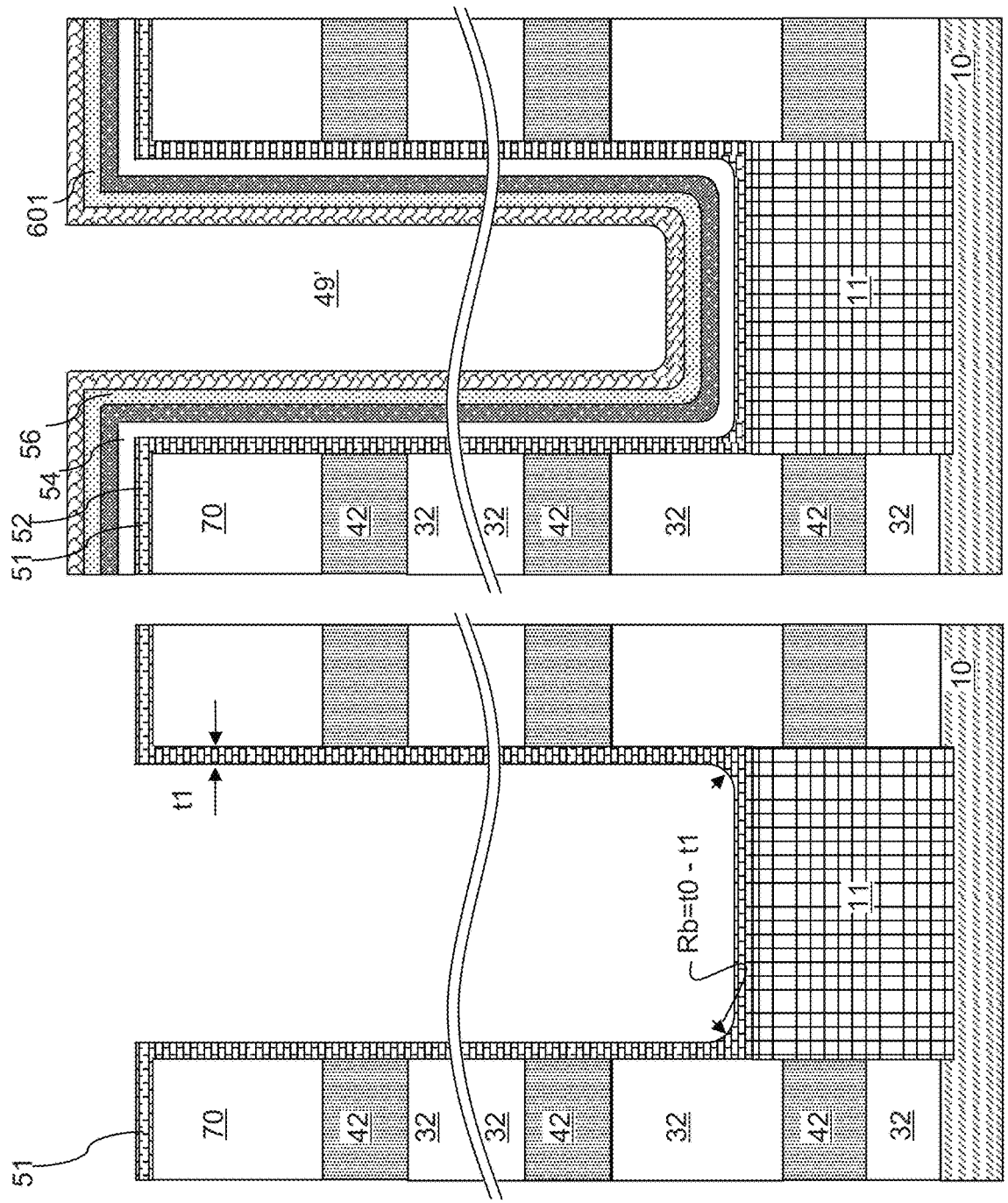

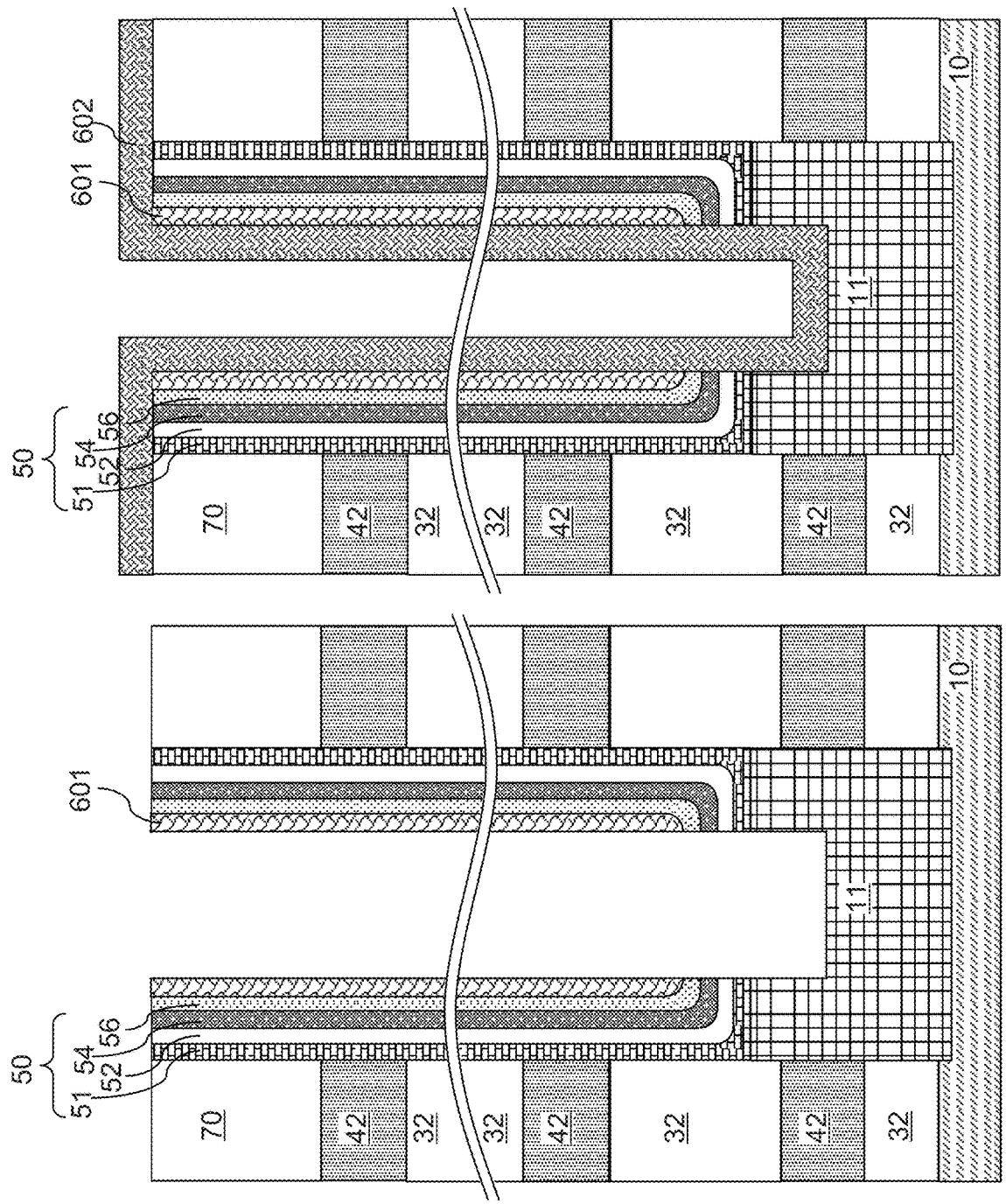

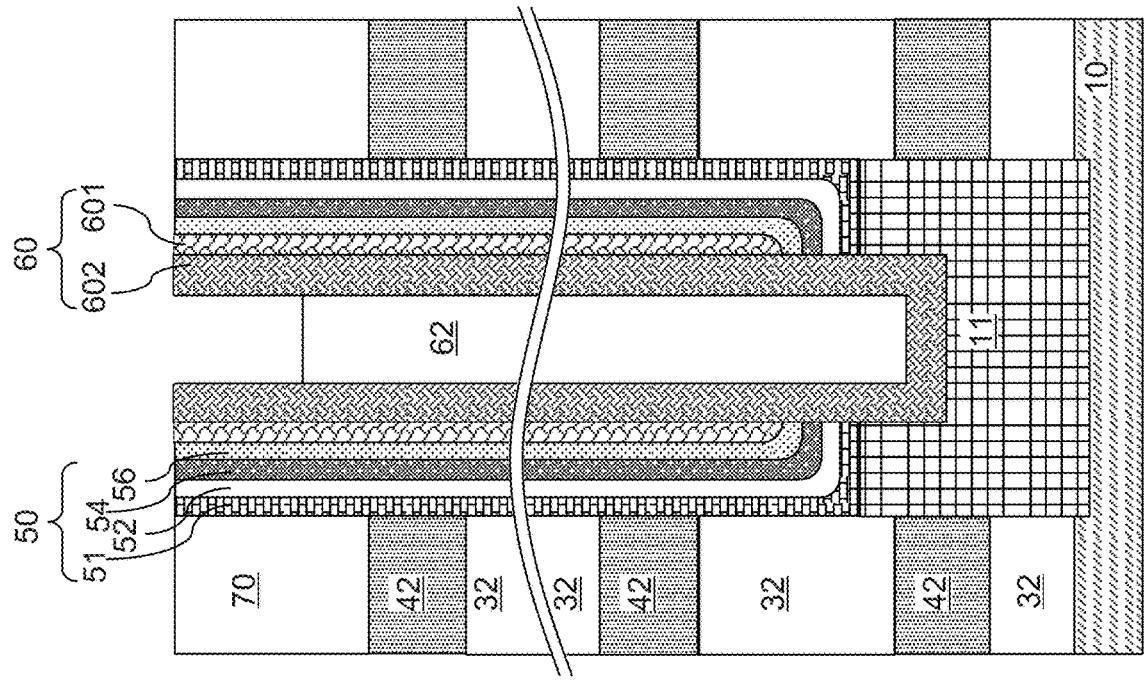
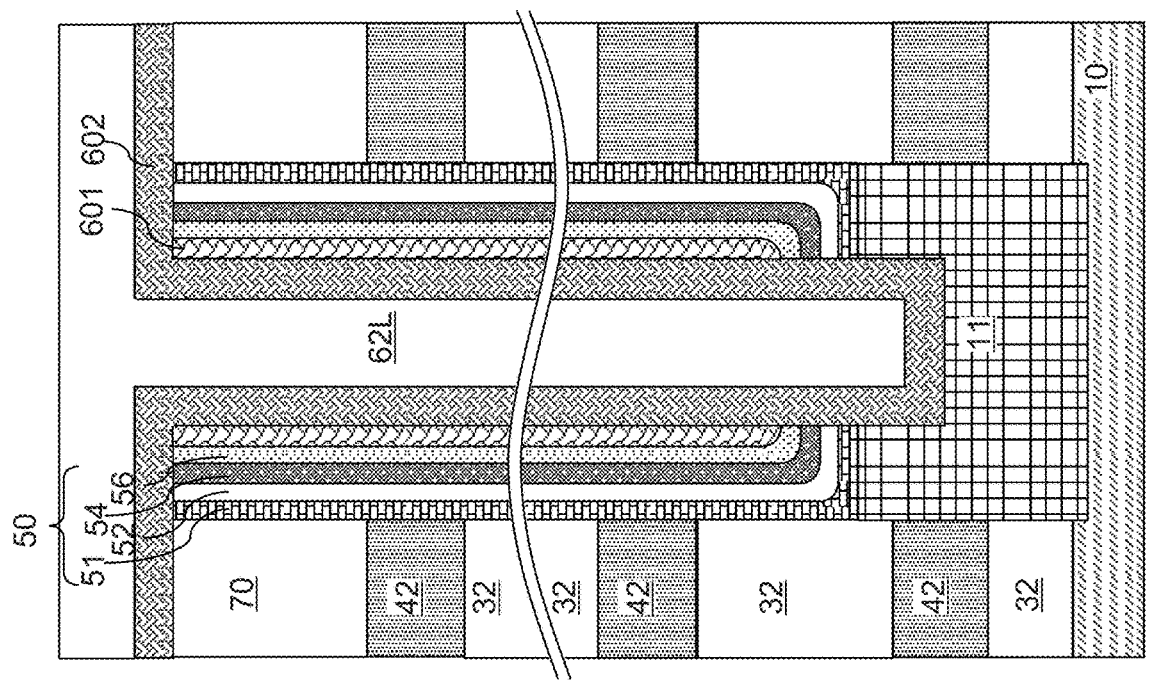

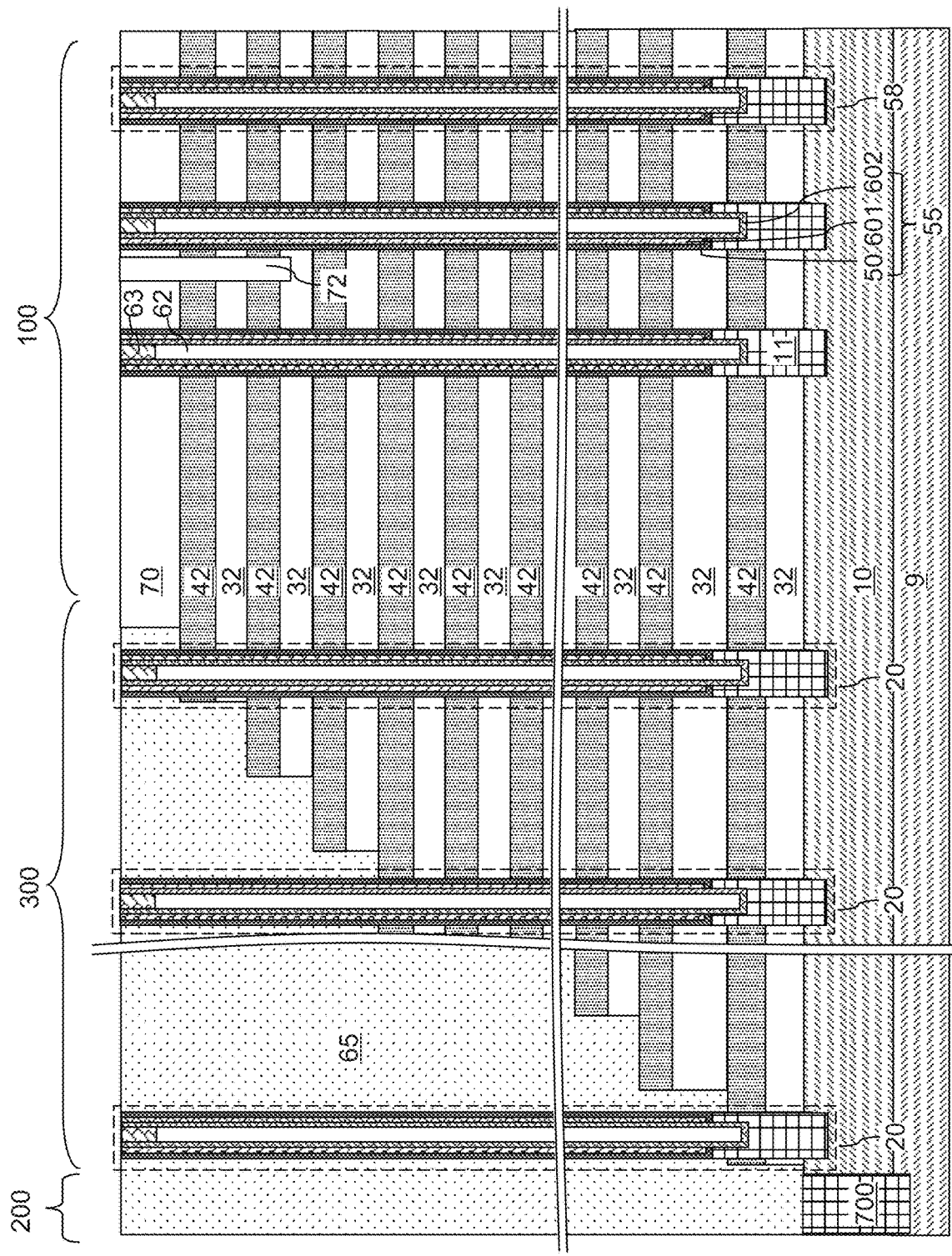

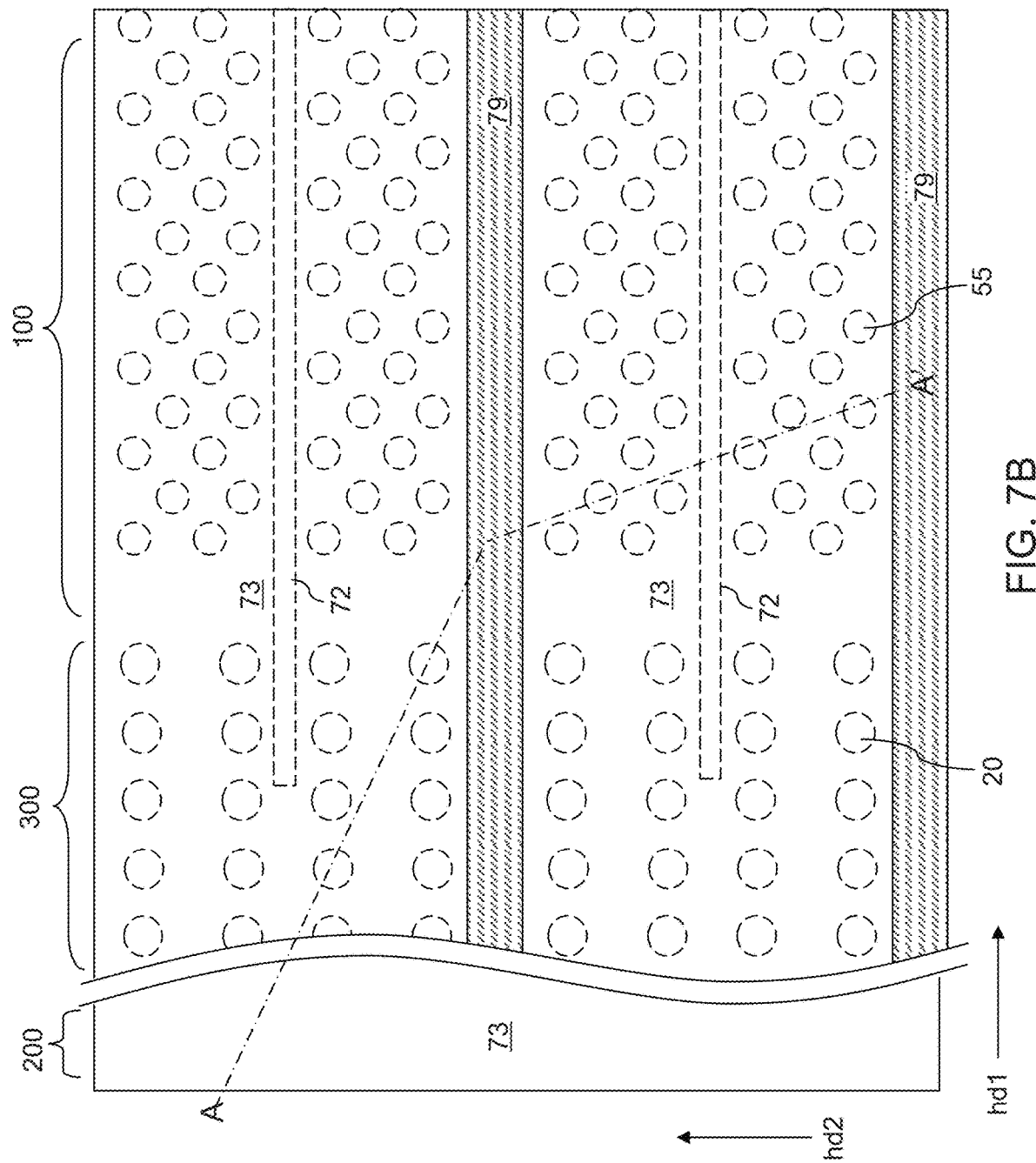

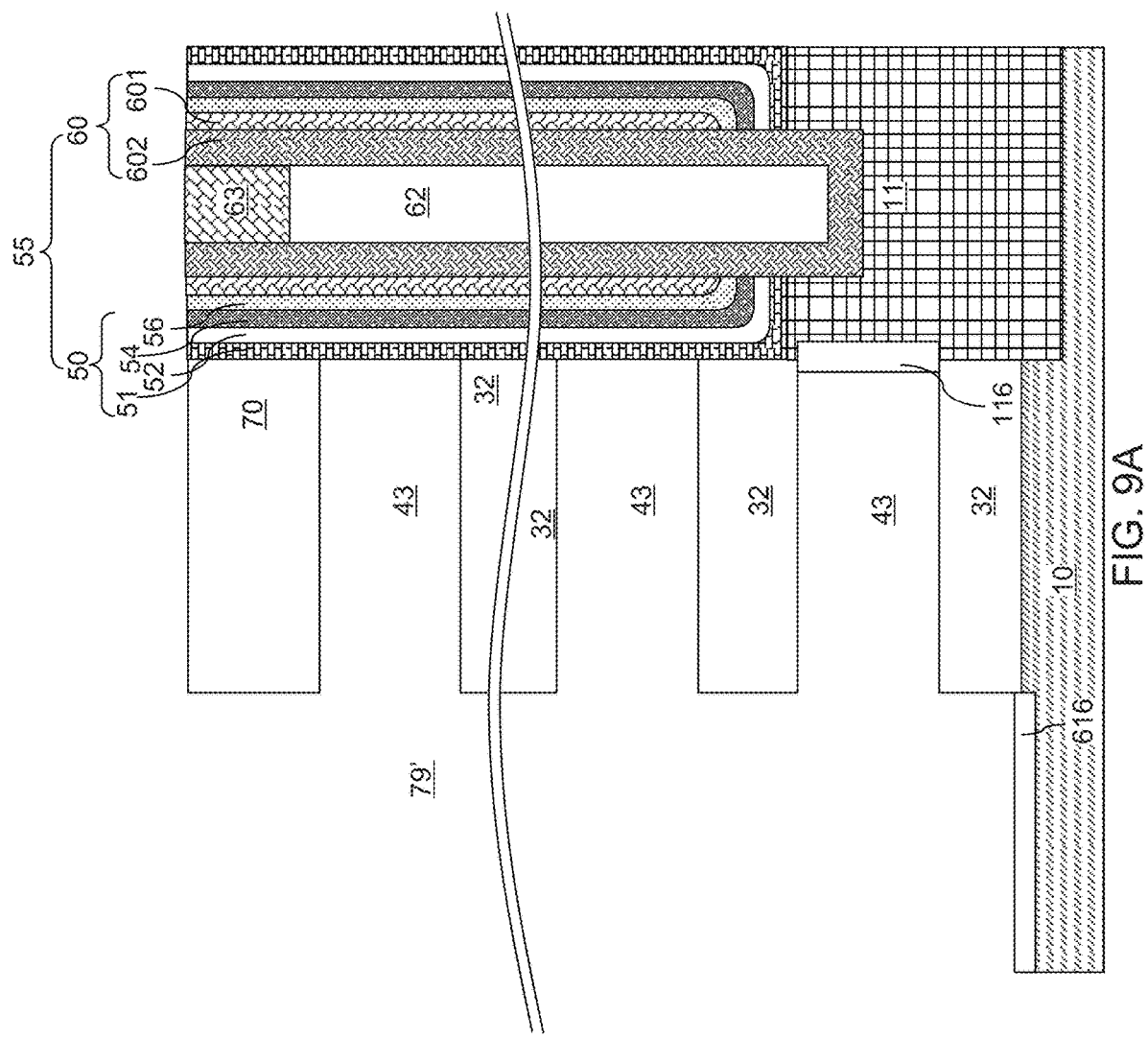

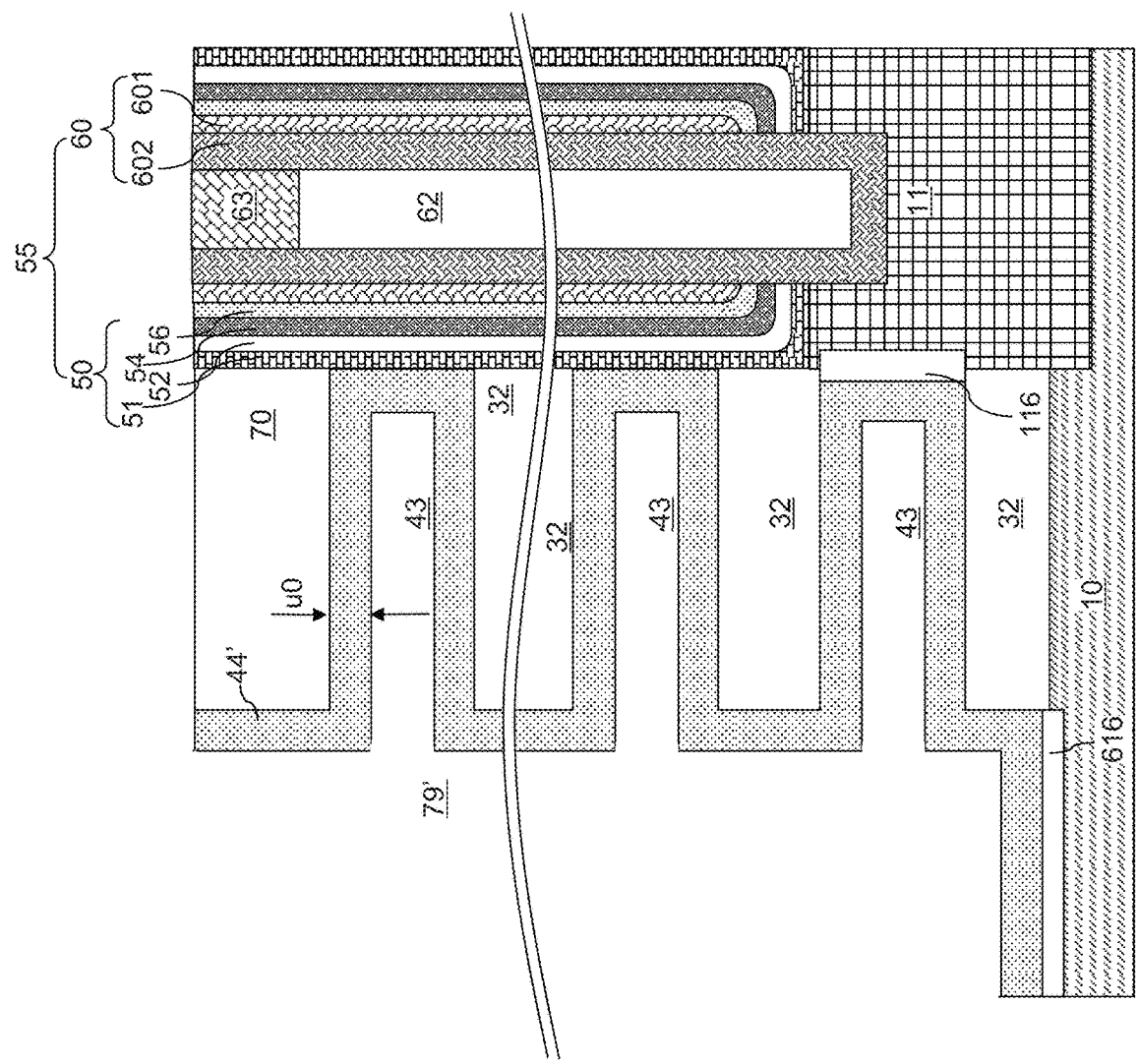

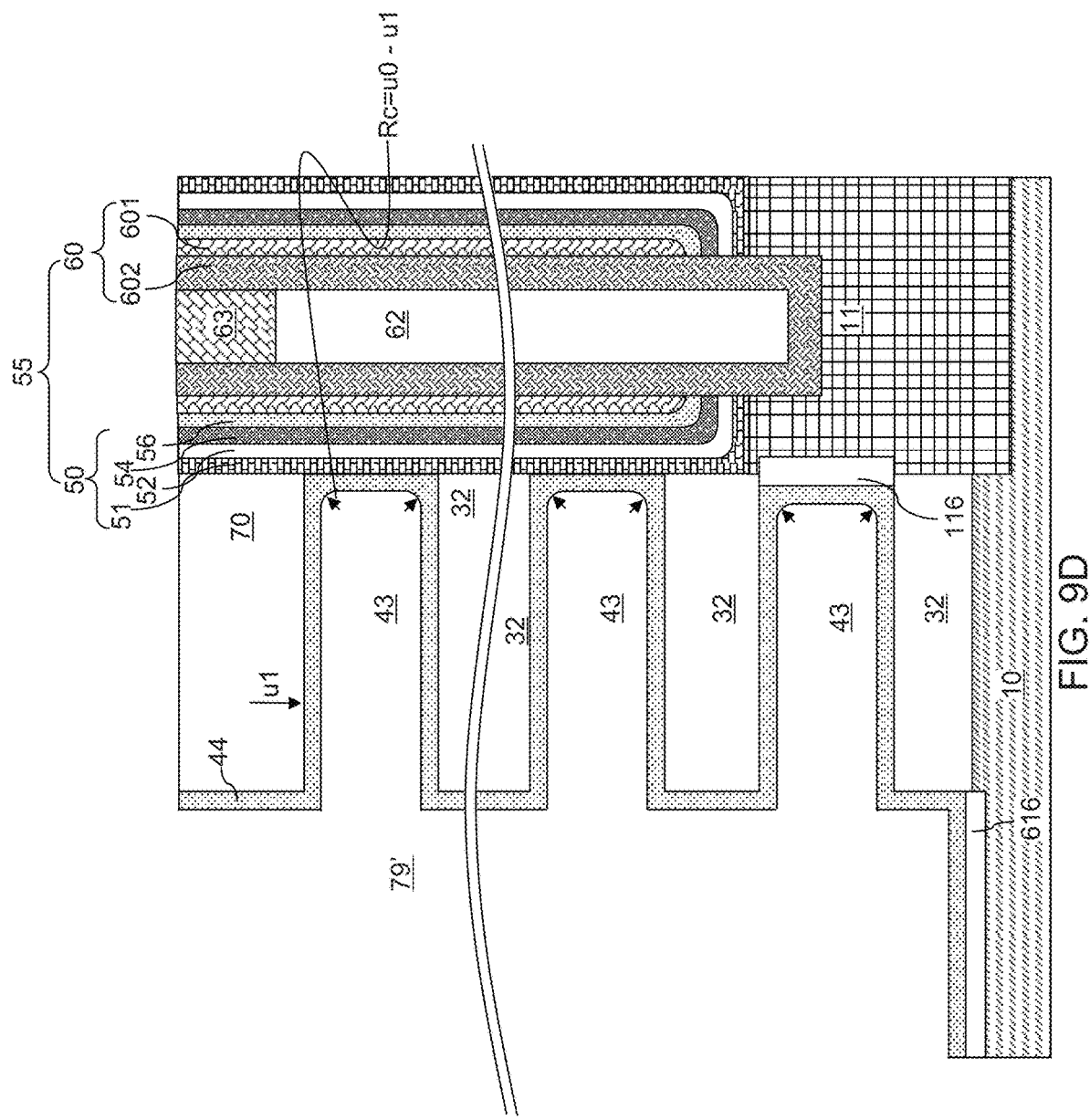

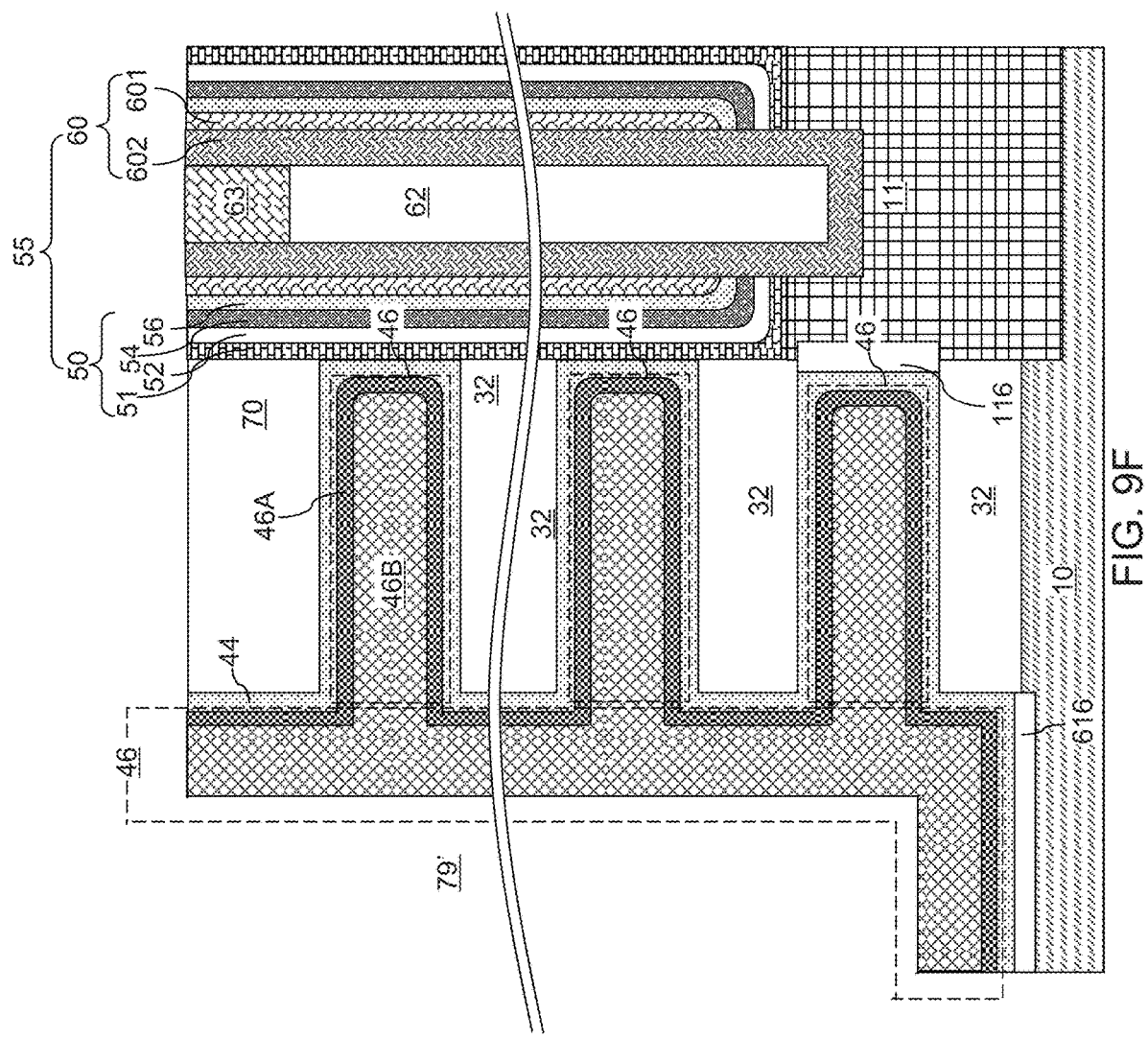

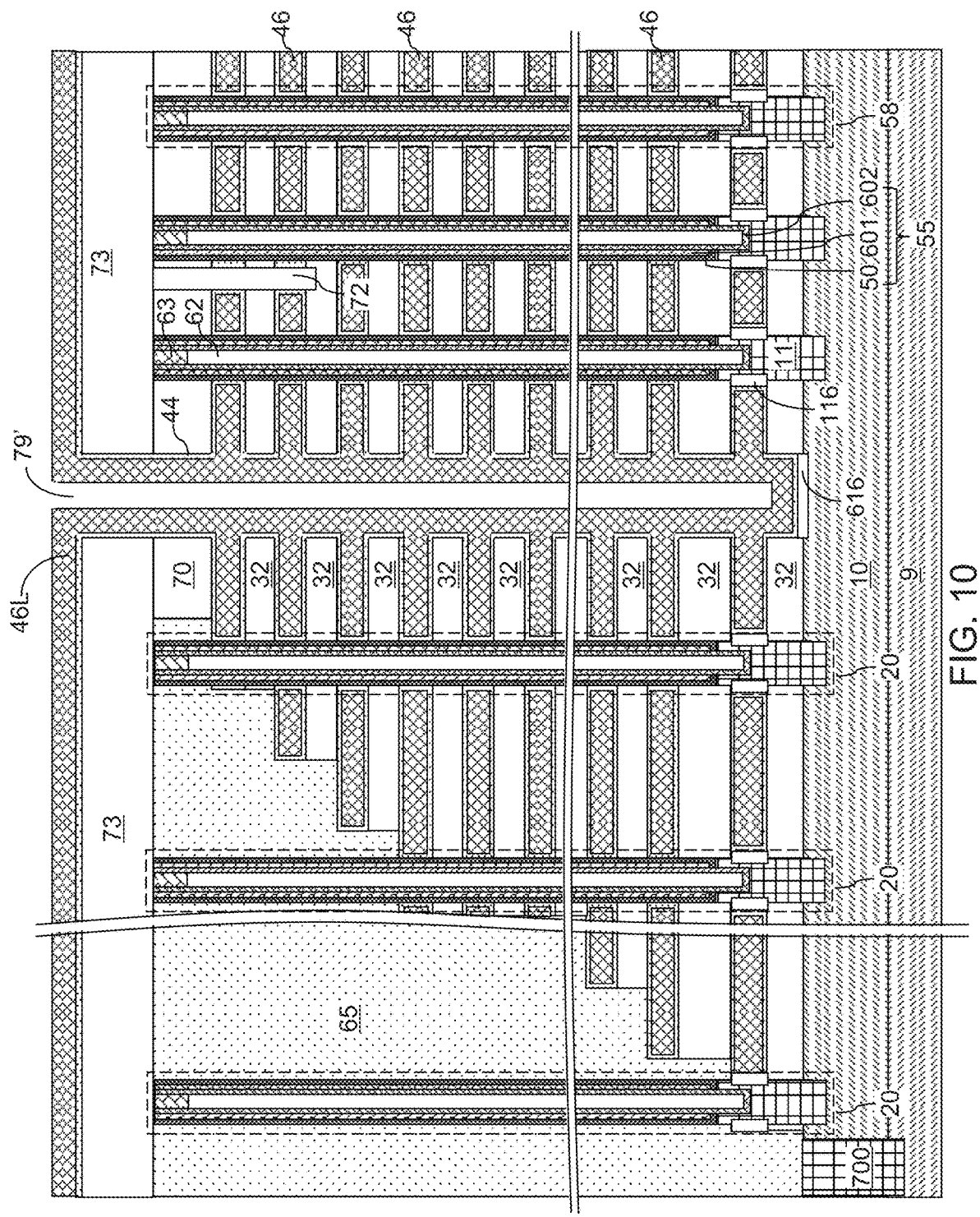

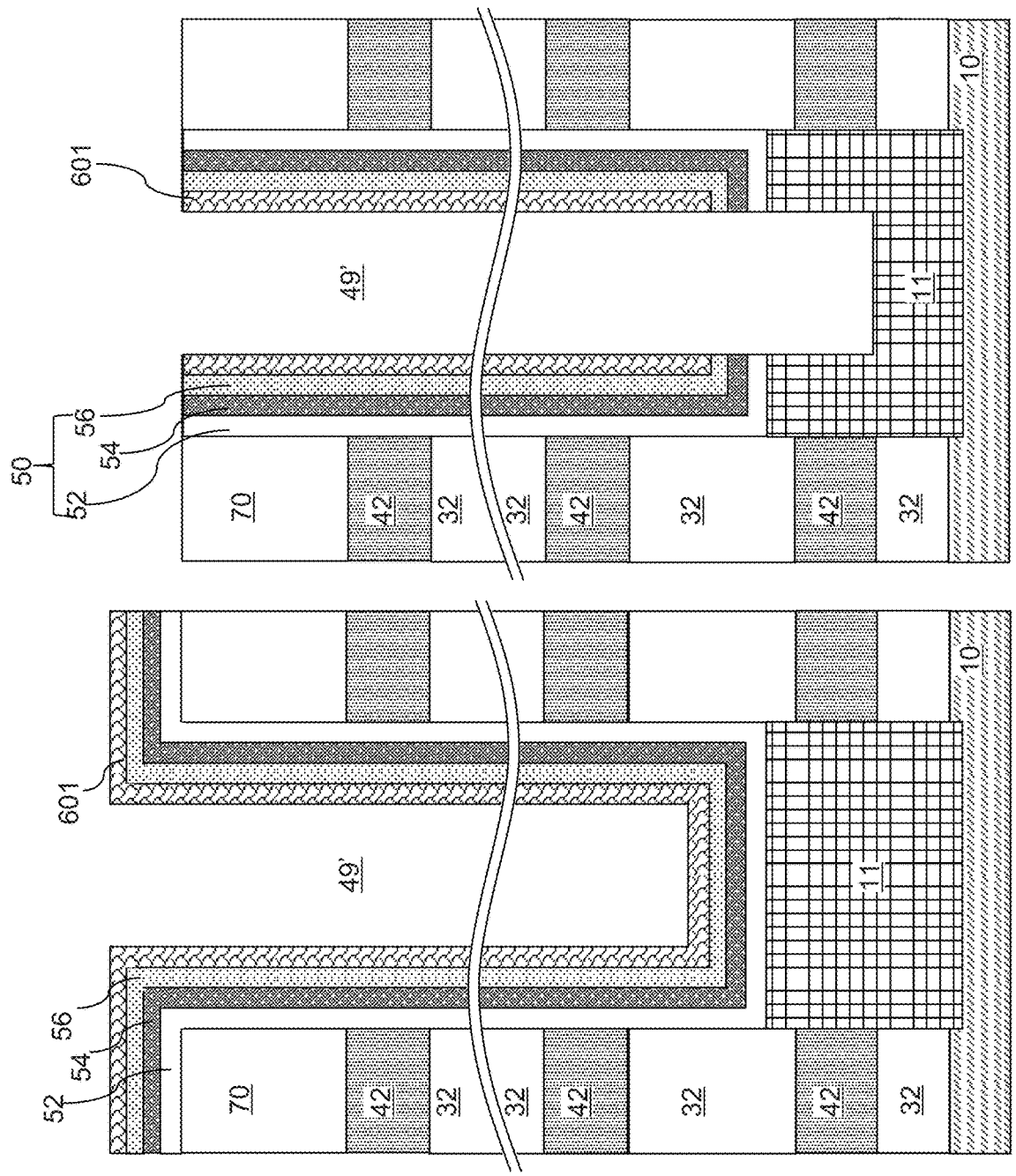

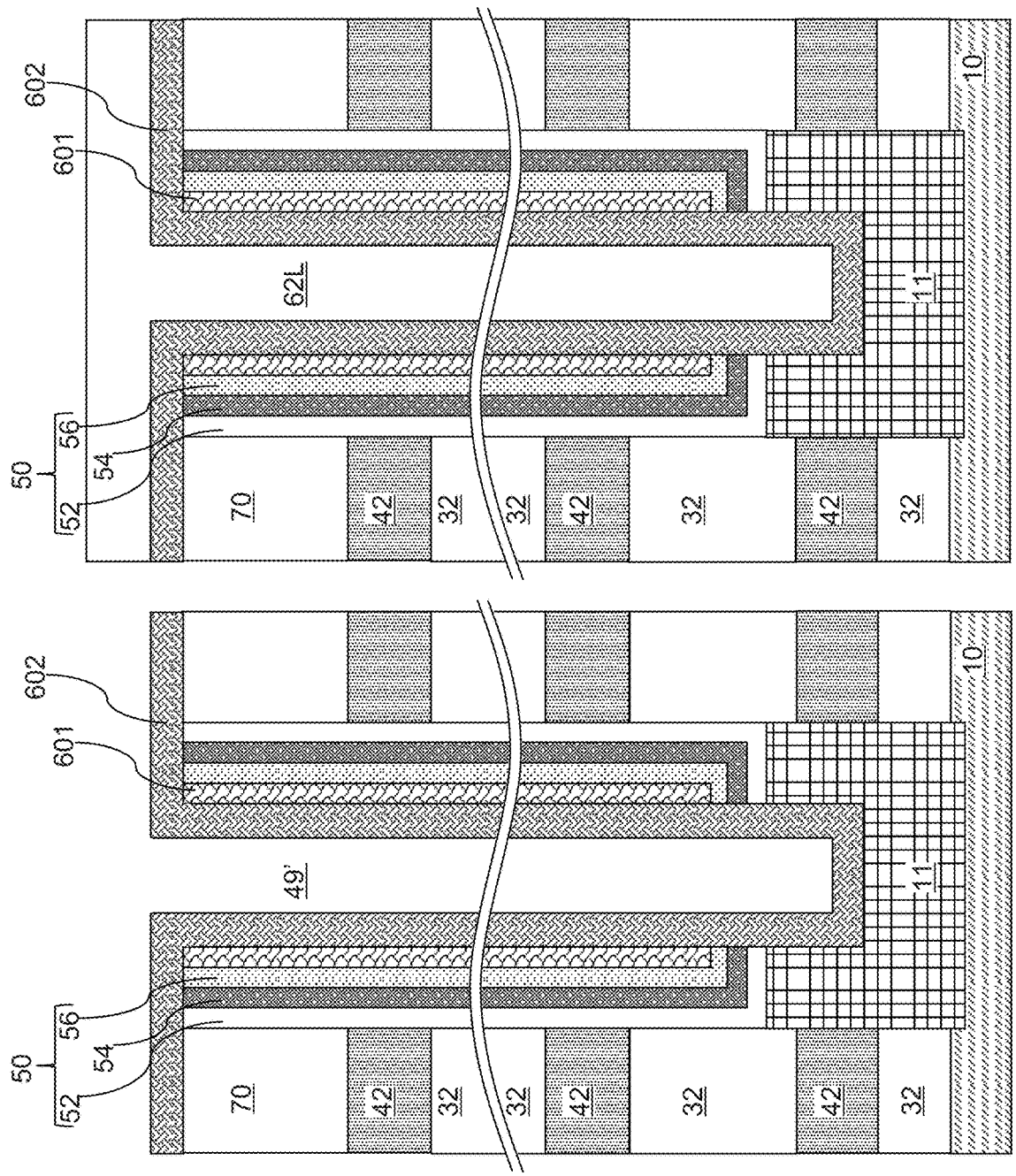

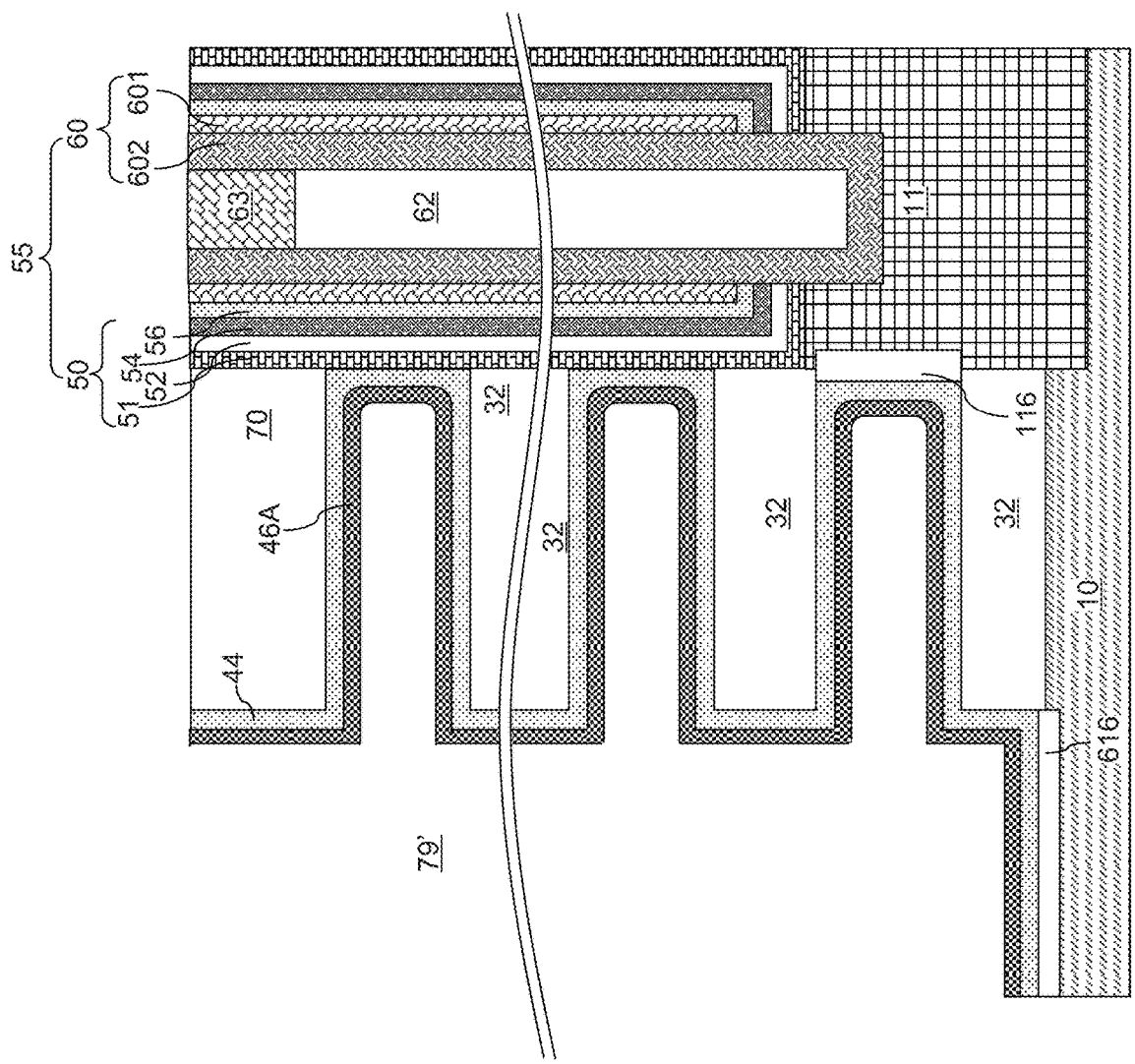

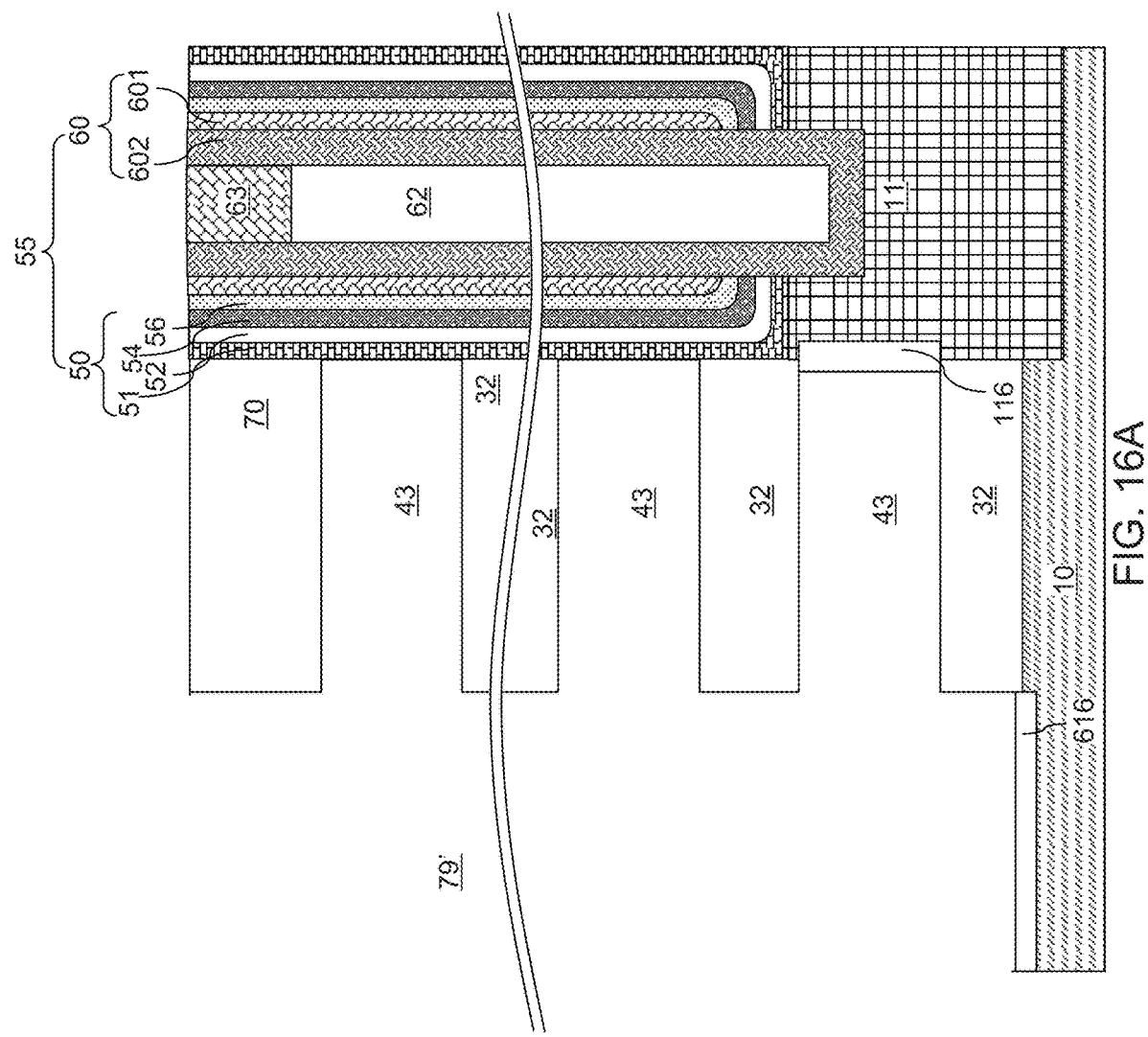

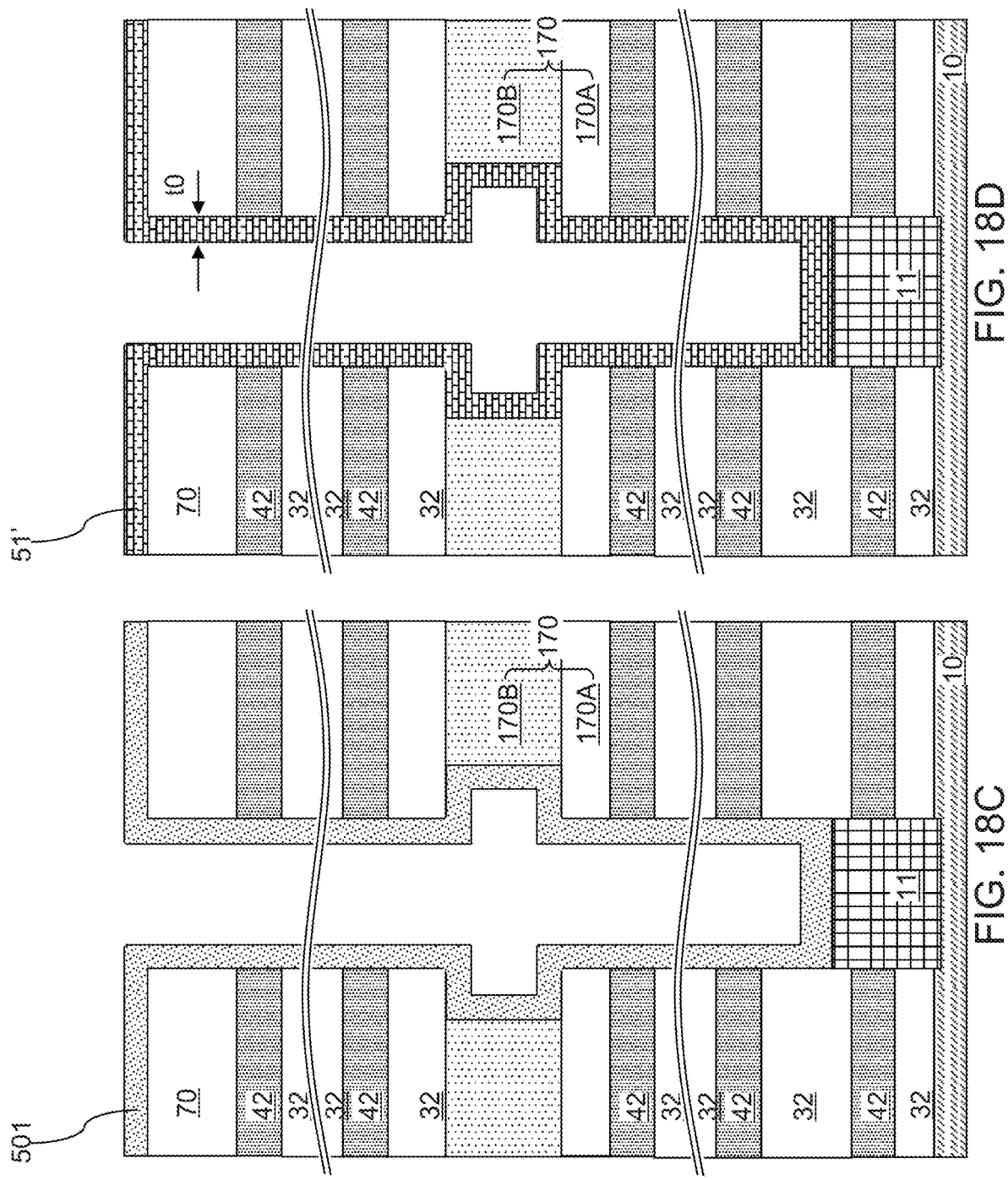

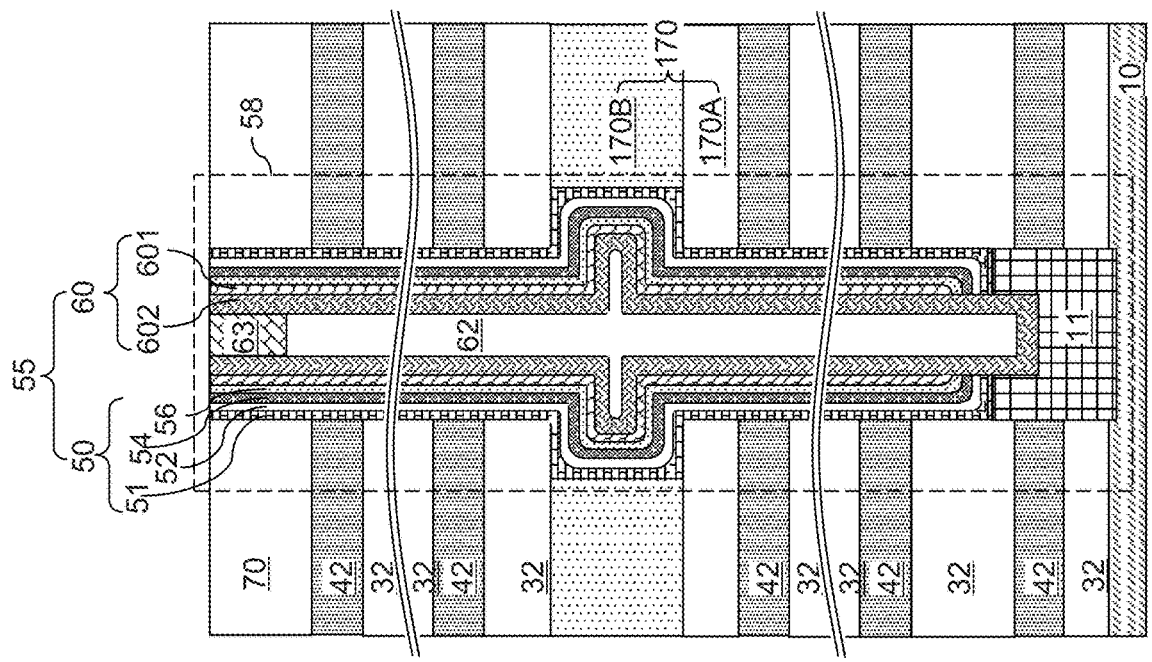
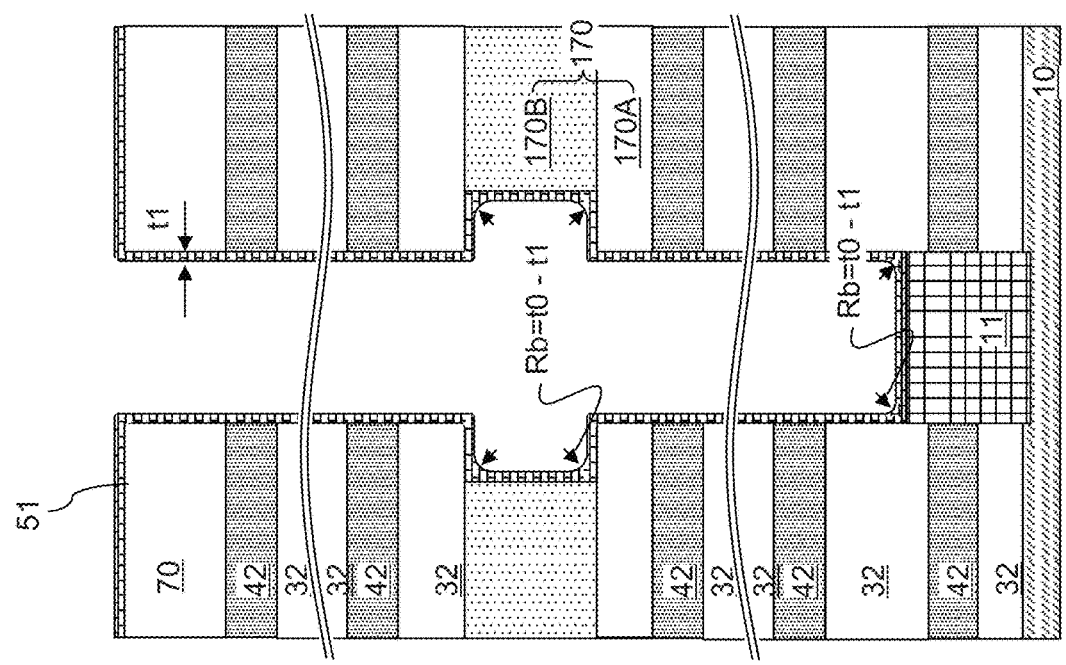

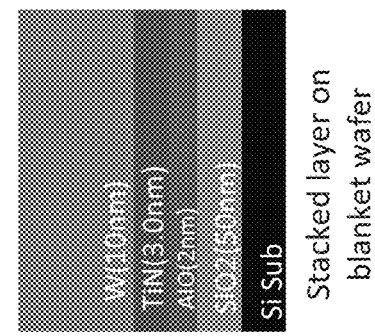
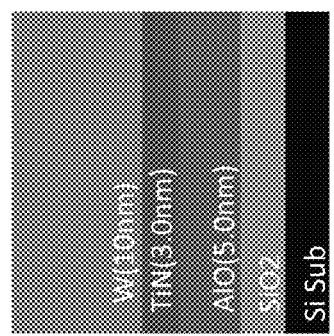
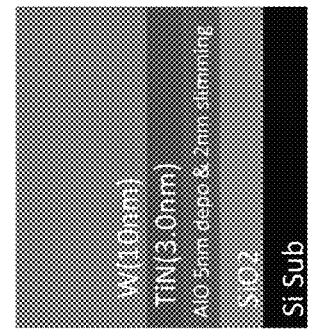
FIG. 21

US 10,861,869 B2

THREE-DIMENSIONAL MEMORY DEVICE HAVING A SLIMMED ALUMINUM OXIDE BLOCKING DIELECTRIC AND METHOD OF MAKING SAME

RELATED APPLICATIONS

The present application claims the benefit of priority from U.S. Provisional Application Ser. No. 62/698,775 filed on Jul. 16, 2018, the entire contents of which are incorporated herein by reference.

FIELD

The present disclosure relates generally to the field of semiconductor devices, and particular to a method of making a three-dimensional memory device having a slimmed aluminum oxide blocking dielectric, and a structure formed by the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a three-dimensional memory device is provided, which comprises: forming an alternating stack of insulating layers and sacrificial material layers over a substrate; forming a memory stack structure through the alternating stack, wherein the memory stack structure comprises a vertical semiconductor channel laterally surrounded by a vertical stack of charge storage elements; and replacing the sacrificial material layers with material portions comprising electrically conductive layers, wherein: a polycrystalline aluminum oxide blocking dielectric layer is provided between each charge storage element and a neighboring one of the electrically conductive layers; and the polycrystalline aluminum oxide blocking dielectric layer is formed by: depositing an amorphous aluminum oxide layer; converting the amorphous aluminum oxide layer into an in-process polycrystalline aluminum oxide blocking dielectric layer by an anneal; and thinning the in-process polycrystalline aluminum oxide blocking dielectric layer into the polycrystalline aluminum oxide layer by etching back a surface portion of the in-process polycrystalline aluminum oxide blocking dielectric layer using an etch process to provide a slimmed aluminum oxide blocking dielectric.

According to another embodiment of the present disclosure, a three-dimensional memory device is provided, which comprises: an alternating stack of insulating layers and electrically conductive layers located over a substrate; and a memory stack structure extending through the alternating stack and comprising a vertical semiconductor channel laterally surrounded by a vertical stack of charge storage elements, wherein: a slimmed polycrystalline aluminum oxide blocking dielectric layer is located between each charge storage element and a neighboring one of the electrically conductive layers; and a diagonal thickness of the polycrystalline aluminum oxide blocking dielectric layer between an inner concave surface and outer angled surfaces is greater than a thickness of a vertical portion of the polycrystalline aluminum oxide blocking dielectric layer.

BRIEF DESCRIPTION OF THE DRAWINGS

FIGS. 5A-5K are sequential schematic vertical cross-sectional views of a memory opening within the first exemplary structure during formation of a memory stack structure including an inner polycrystalline aluminum oxide blocking dielectric layer, an optional dielectric core, and a drain region therein according to an embodiment of the present disclosure.

FIG. 6 is a schematic vertical cross-sectional view of the first exemplary structure after formation of memory stack structures and support pillar structures according to an embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 9A-9F are sequential vertical cross-sectional views of a region of the first exemplary structure during formation of outer polycrystalline aluminum oxide blocking dielectric layers and electrically conductive layers according to an embodiment of the present disclosure.

FIG. 10 is a schematic vertical cross-sectional view of the first exemplary structure at the processing step of FIG. 9F.

FIGS. 14A-14F illustrate a first alternative configuration of the first exemplary structure for a region around a memory opening during formation of a memory opening fill structure according to an embodiment of the present disclosure.

FIGS. 15A-15G illustrate the first alternative configuration of the first exemplary structure for a region around a memory opening and a backside trench during formation of an outer polycrystalline aluminum oxide blocking dielectric layer, electrically conductive layers, and a backside contact via structure according to an embodiment of the present disclosure.

FIGS. 16A-16D illustrate a second alternative configuration of the first example structure for a region around a memory opening and a backside trench during formation of an outer polycrystalline aluminum oxide blocking dielectric layer, electrically conductive layers, and a backside contact via structure according to an embodiment of the present disclosure.

FIGS. 18A-18F are sequential vertical cross-sectional views of an inter-tier memory opening during formation of a memory opening fill structure that includes an inner polycrystalline aluminum oxide blocking dielectric layer according to an embodiment of the present disclosure.

FIG. 21 shows vertical cross-sectional views of four first exemplary structures that were tested during demonstration of an embodiment of the present disclosure.

DETAILED DESCRIPTION

Figure 1:
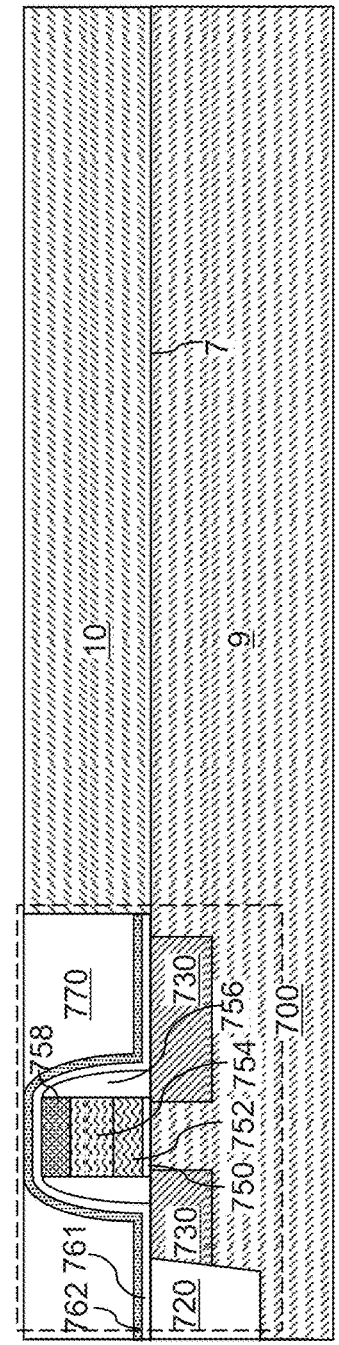
FIG. 1 is a schematic vertical cross-sectional view of a first exemplary structure after formation of at least one peripheral device, a semiconductor material layer, and a gate dielectric layer according to an embodiment of the present disclosure.

As discussed above, the present disclosure is directed to a method of making a three-dimensional memory device having a slimmed aluminum oxide blocking dielectric, and a structure formed by the same, the various aspects of which are described below. The embodiments of the disclosure may be used to form various structures including a multi-level memory structure, non-limiting examples of which include semiconductor devices such as three-dimensional monolithic memory array devices comprising a plurality of NAND memory strings. By providing a 3D memory device with a slimmed aluminum oxide blocking dielectric the reliability and performance may be improved.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element maybe located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor die, or a semiconductor package, may include a memory chip. Each semiconductor package contains one or more dies (for example one, two, or four). The die is the smallest unit that may independently execute commands or report status. Each die contains one or more planes (typically one or two). Identical, concurrent operations may take place on each plane, although with some restrictions. Each plane contains a number of blocks, which are the smallest unit that may be erased by in a single erase operation. Each block contains a number of pages, which are the smallest unit that may be programmed, i.e., a smallest unit on which a read operation may be performed.

Referring to FIG. 1, a first exemplary structure according to an embodiment of the present disclosure is illustrated, which may be used, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by a selective semiconductor material deposition process (such as selective epitaxy). The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
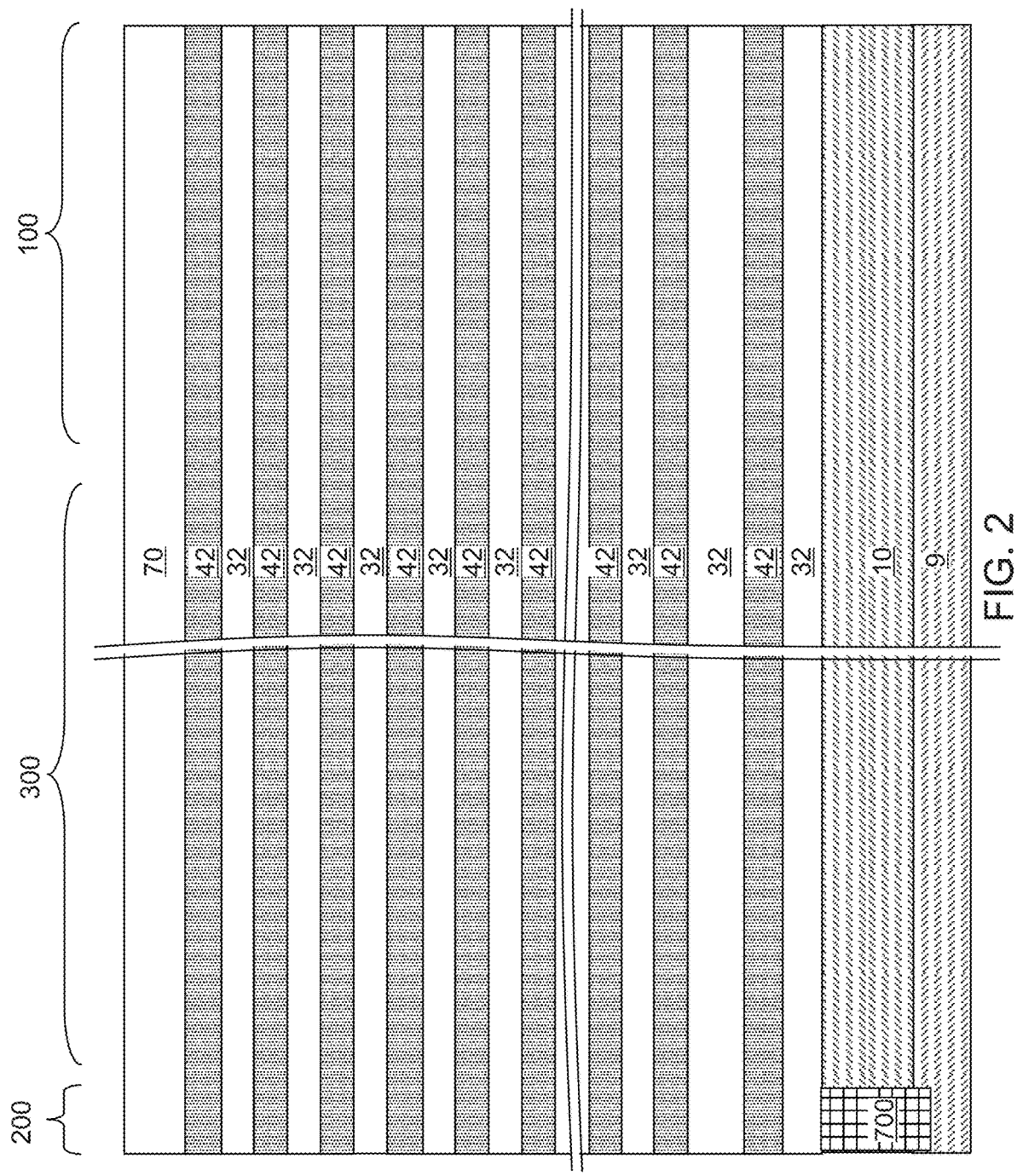
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
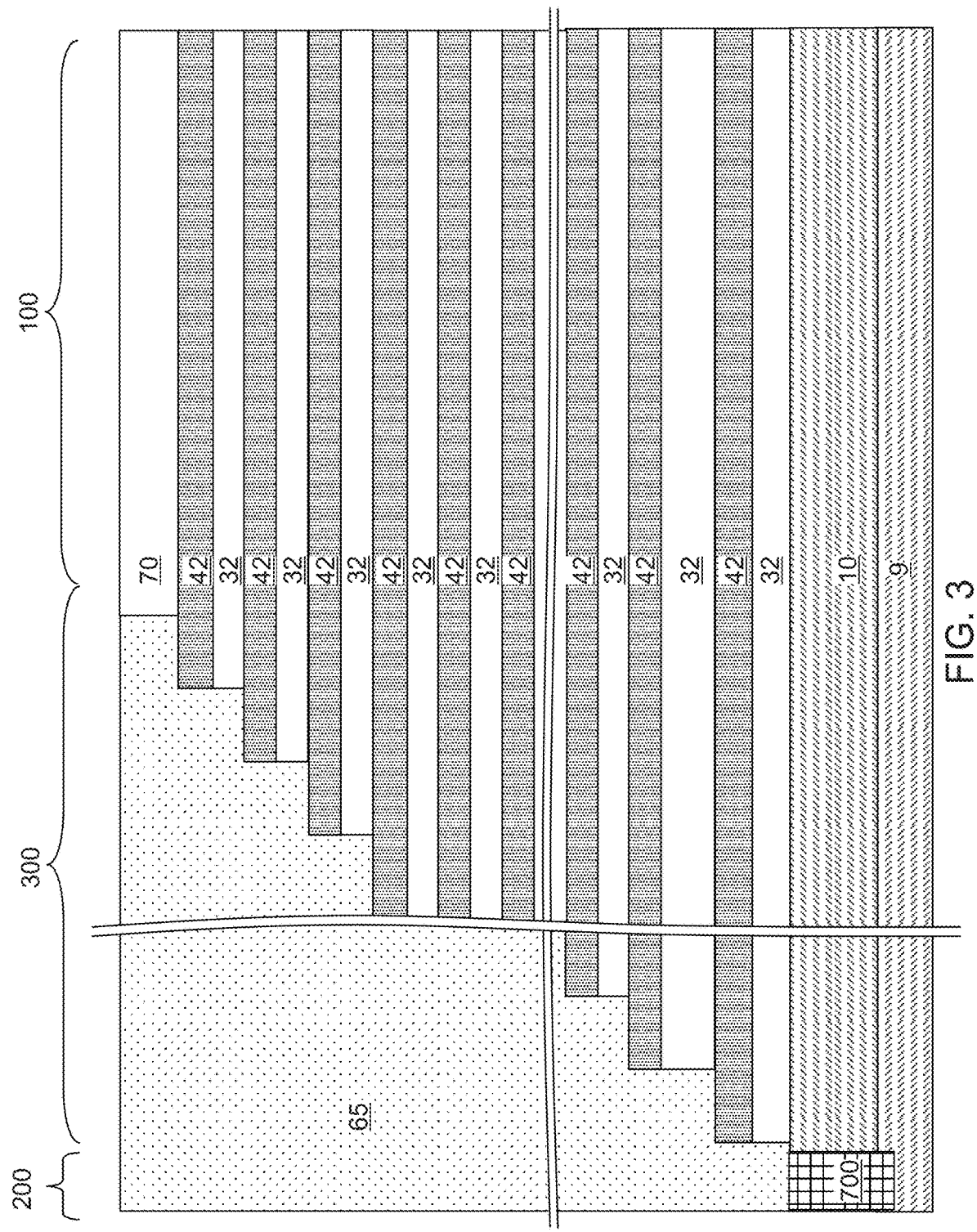
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
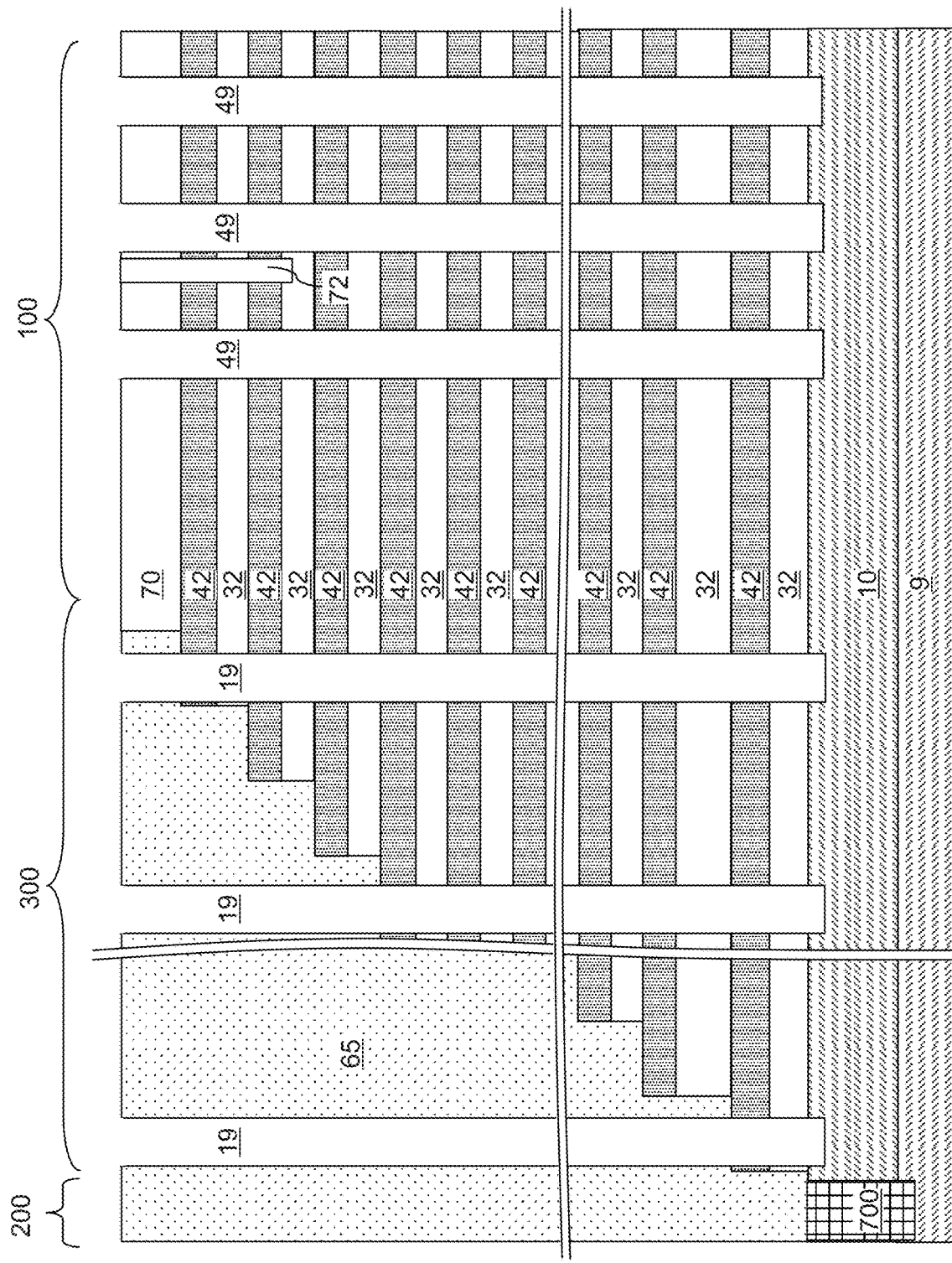
FIG. 4A is a schematic vertical cross-sectional view of the first exemplary structure after formation of memory openings and support openings according to an embodiment of the present disclosure.
Figure 4B:
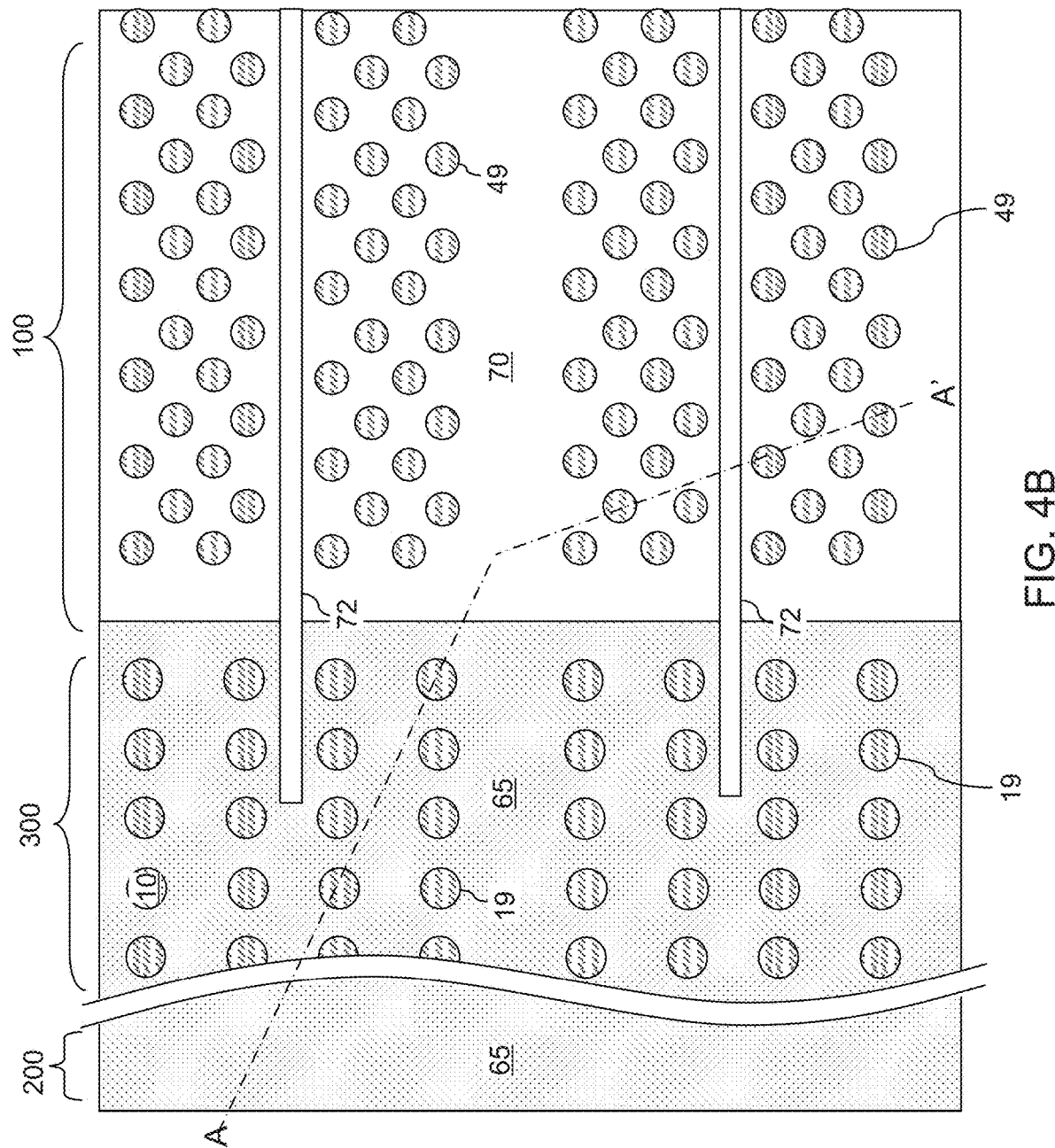
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the first exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by a selective semiconductor material deposition process (such as selective epitaxy). Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, an amorphous aluminum oxide layer 501 is deposited in the memory openings 49 and over the insulating cap layer 70 as a continuous dielectric material layer. The amorphous aluminum oxide layer 510 may be deposited directly on physically exposed surfaces of the insulating layers 32 and the sacrificial material layers 42. The thickness of the amorphous aluminum oxide layer 501 may be, for example, in a range from 3 nm to 15 nm, such as from 4 nm to 10 nm, although lesser and greater thicknesses may also be used. The amorphous aluminum oxide layer 501 may be formed by a conformal deposition process such as atomic layer deposition (ALD).

Referring to FIG. 5D, a thermal anneal process may be performed to convert the amorphous aluminum oxide layer 501 into a polycrystalline aluminum oxide layer that is used as a blocking dielectric layer. The polycrystalline aluminum oxide layer is herein referred to as an in-process polycrystalline aluminum oxide blocking dielectric layer 51'. The temperature of the thermal anneal process may be in a range from 900 degrees Celsius to 1,100 degrees Celsius, such as from 950 degrees Celsius to 1,070 degrees Celsius. The duration of the thermal anneal process may be in a range from 1 second to 60 seconds. The in-process polycrystalline aluminum oxide blocking dielectric layer 51' may have an initial thickness t0, which may be less than the thickness of the amorphous aluminum oxide layer 501 by about 20% of the thickness of the amorphous aluminum oxide layer 501. The thickness of the in-process polycrystalline aluminum oxide blocking dielectric layer 51' may be in a range from 2.5 nm to 12.5 nm, although lesser and greater thicknesses may also be used. The in-process polycrystalline aluminum oxide blocking dielectric layer 51' may comprise an edge at which a physically exposed vertical surface of the in-process polycrystalline aluminum oxide blocking dielectric layer 51' directly adjoins a physically exposed horizontal surface of the in-process polycrystalline aluminum oxide blocking dielectric layer 51'. For example, a circular or elliptical bottom edge of a physically exposed inner vertical surface of the in-process polycrystalline aluminum oxide blocking dielectric layer 51' may directly adjoin a physically exposed horizontal top surface of the in-process polycrystalline aluminum oxide blocking dielectric layer 51' at the bottom of each memory opening 49.

Referring to FIG. 5E, the in-process polycrystalline aluminum oxide blocking dielectric layer 51' is slimmed by an isotropic etch process. The isotropic etch process reduces the thickness of each vertical portion and each horizontal portion of the in-process polycrystalline aluminum oxide blocking dielectric layer 51' by a percentage in a range from 15% to 85%. The remaining portion of the in-process polycrystalline aluminum oxide blocking dielectric layer 51' constitutes an inner polycrystalline aluminum oxide blocking dielectric layer 51.

The isotropic etch process may include a wet etch process using a basic etchant such as ammonium hydroxide and/or methyl hydroxide, or an acidic etchant such as phosphoric acid. In one embodiment, the isotropic etch process comprises a wet etch process using at least one of phosphoric acid, potassium hydroxide, and ammonium hydroxide. A slow etch process may be used to provide a controlled isotropic etch process. Physically exposed surfaces of the in-process polycrystalline aluminum oxide blocking dielectric layer 51' are isotropically recessed at a same etch rate. The duration of the isotropic etch process may be controlled such that the thickness of the inner polycrystalline aluminum oxide blocking dielectric layer 51 after the etch process is in a range from 2 nm to 4 nm. Corner rounding of the in-process polycrystalline aluminum oxide blocking dielectric layer 51' may occur as a result of the isotropic etch process.

The thickness of the inner polycrystalline aluminum oxide blocking dielectric layer 51 after the isotropic etch process is herein referred to as a slimmed thickness t1. The material of the in-process polycrystalline aluminum oxide blocking dielectric layer 51' is isotropically etched from a bottom periphery of each inner sidewall of the in-process polycrystalline aluminum oxide blocking dielectric layer 51' that adjoins a planar bottom portion of the in-process polycrystalline aluminum oxide blocking dielectric layer 51' that contacts an underlying pedestal channel portion 11. The isotropic etch process removes the annular physical edge between each inner sidewall and a horizontal top surface of the in-process polycrystalline aluminum oxide blocking dielectric layer 51', and forms a concave surface having a uniform radius of curvature within a region in which a physically exposed vertical surface of the inner polycrystalline aluminum oxide blocking dielectric layer 51 indirectly adjoins a physically exposed horizontal surface of the inner polycrystalline aluminum oxide blocking dielectric layer 51 through the concave surface.

A continuous concave surface that encircles the planar bottom portion of the inner polycrystalline aluminum oxide blocking dielectric layer 51 is formed at the bottom of each memory opening 49 underneath a respective memory cavity 49'. The continuous concave surface may have a radius of curvature Rb, which may be the same as the etch distance of the isotropic etch process. The radius of curvature Rb may be the same as the difference between the initial thickness t0 and the slimmed thickness t1.

Referring to FIG. 5F, a stack of layers including a silicon oxide blocking dielectric layer 52, a charge storage layer 54, a tunneling dielectric layer 56, and an optional first semiconductor channel layer 601 may be sequentially deposited in the memory openings 49. Each of the silicon oxide blocking dielectric layer 52, the charge storage layer 54, the tunneling dielectric layer 56 may be formed with a continuous convex outer surface and a continuous concave inner surface at a respective annular peripheral region that surrounds a respective horizontal bottom portion inside each memory opening 49.

The silicon oxide blocking dielectric layer 52 may include silicon oxide. The thickness of the dielectric semiconductor compound may be in a range from 1 nm to 20 nm, such as from 2 nm to 10 nm, although lesser and greater thicknesses may also be used.

The charge storage layer 54 may be formed directly on the silicon oxide blocking dielectric layer 52. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (51, 52, 54, 56, 601).

Referring to FIG. 5G, the optional first semiconductor channel layer 601, the tunneling dielectric layer 56, the charge storage layer 54, the silicon oxide blocking dielectric layer 52, and the inner polycrystalline aluminum oxide blocking dielectric layer 51 are sequentially anisotropically etched using at least one anisotropic etch process. The portions of the first semiconductor channel layer 601, the tunneling dielectric layer 56, the charge storage layer 54, the silicon oxide blocking dielectric layer 52, and the inner polycrystalline aluminum oxide blocking dielectric layer 51 located above the top surface of the insulating cap layer 70 may be removed by the at least one anisotropic etch process. Further, the horizontal portions of the first semiconductor channel layer 601, the tunneling dielectric layer 56, the charge storage layer 54, the silicon oxide blocking dielectric layer 52, and the inner polycrystalline aluminum oxide blocking dielectric layer 51 at a bottom of each memory cavity 49' may be removed to form openings in remaining portions thereof. Each of the first semiconductor channel layer 601, the tunneling dielectric layer 56, the charge storage layer 54, the silicon oxide blocking dielectric layer 52, and the inner polycrystalline aluminum oxide blocking dielectric layer 51 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, the silicon oxide blocking dielectric layer 52, and the inner polycrystalline aluminum oxide blocking dielectric layer 51. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of an inner polycrystalline aluminum oxide blocking dielectric layer 51, a silicon oxide blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the silicon oxide blocking dielectric layer 52 and the tunneling dielectric layer 56. In one embodiment, the first semiconductor channel layer 601, the tunneling dielectric layer 56, the charge storage layer 54, and the silicon oxide blocking dielectric layer 52 may have vertically coincident sidewalls.

Referring to FIG. 5H, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5I, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5J, the horizontal portion of the dielectric core layer 62L may be removed, for example, by a recess etch from above the top surface of the insulating cap layer 70. Each remaining portion of the dielectric core layer 62L constitutes a dielectric core 62. The top surface of each dielectric core 62 may be further recessed within each memory opening, for example, by a recess etch to a depth that is located between the top surface of the insulating cap layer 70 and the bottom surface of the insulating cap layer 70. Further, the horizontal portion of the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of an inner polycrystalline aluminum oxide blocking dielectric layer 51, a silicon oxide blocking dielectric layer 52, a charge storage layer 54, and a tunneling dielectric layer 56 collectively constitute a memory film 50, which may store electrical charges with a macroscopic retention time. In some embodiments, a silicon oxide blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5K:
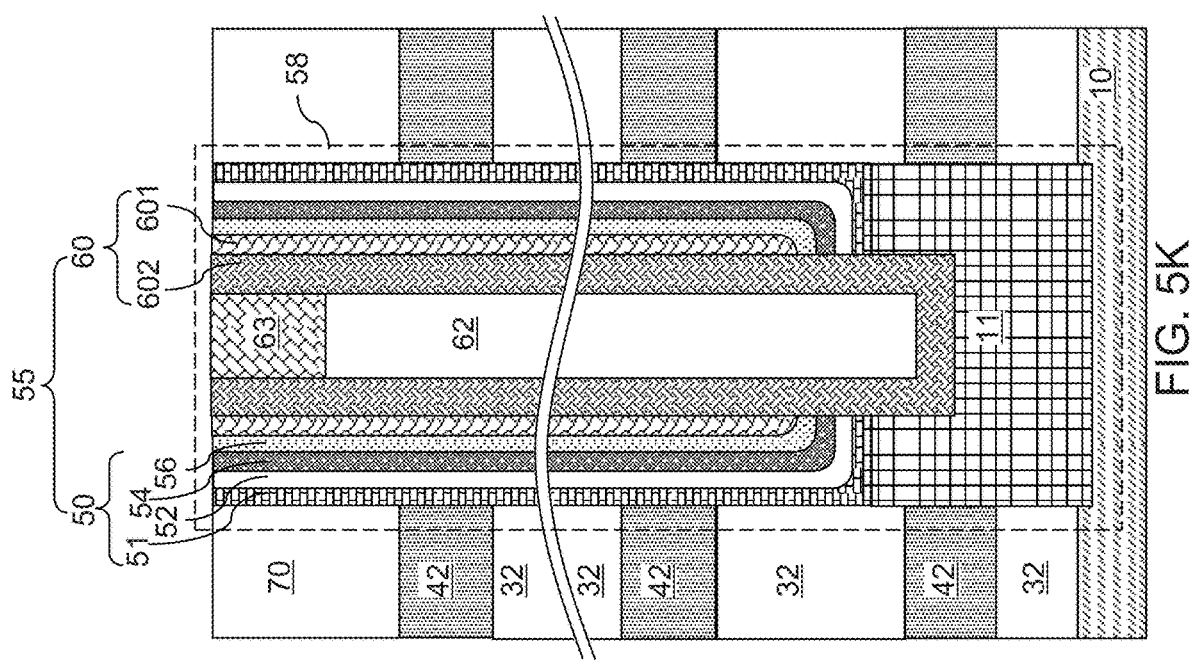

Referring to FIG. 5K, drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer, a plurality of memory elements comprising portions of the charge storage layer 54, and a silicon oxide blocking dielectric layer 52, and the top surface of each dielectric core 62 may be further recessed within each memory opening, for example, by a recess etch to a depth that is located between the top surface of the insulating cap layer 70 and the bottom surface of the insulating cap layer 70. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Referring to FIG. 6, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage elements laterally surrounding the tunneling dielectric layer 56 (comprising regions of a charge storage layer 54 located the levels of the sacrificial material layers 42), a silicon oxide blocking dielectric layer 52, and an inner polycrystalline aluminum oxide blocking dielectric layer 51. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 7A:
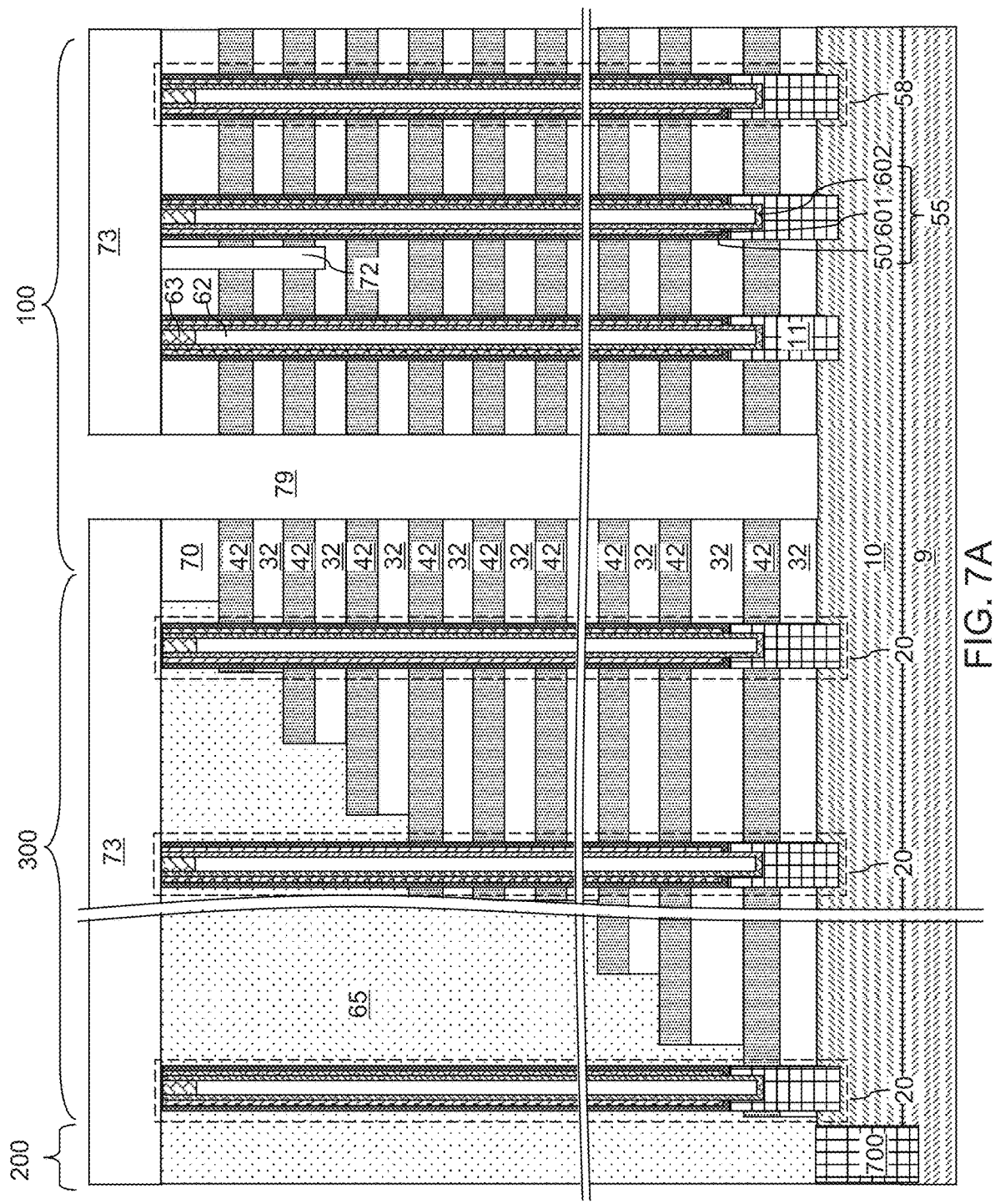
FIG. 7A is a schematic vertical cross-sectional view of the first exemplary structure after formation of backside trenches according to an embodiment of the present disclosure.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
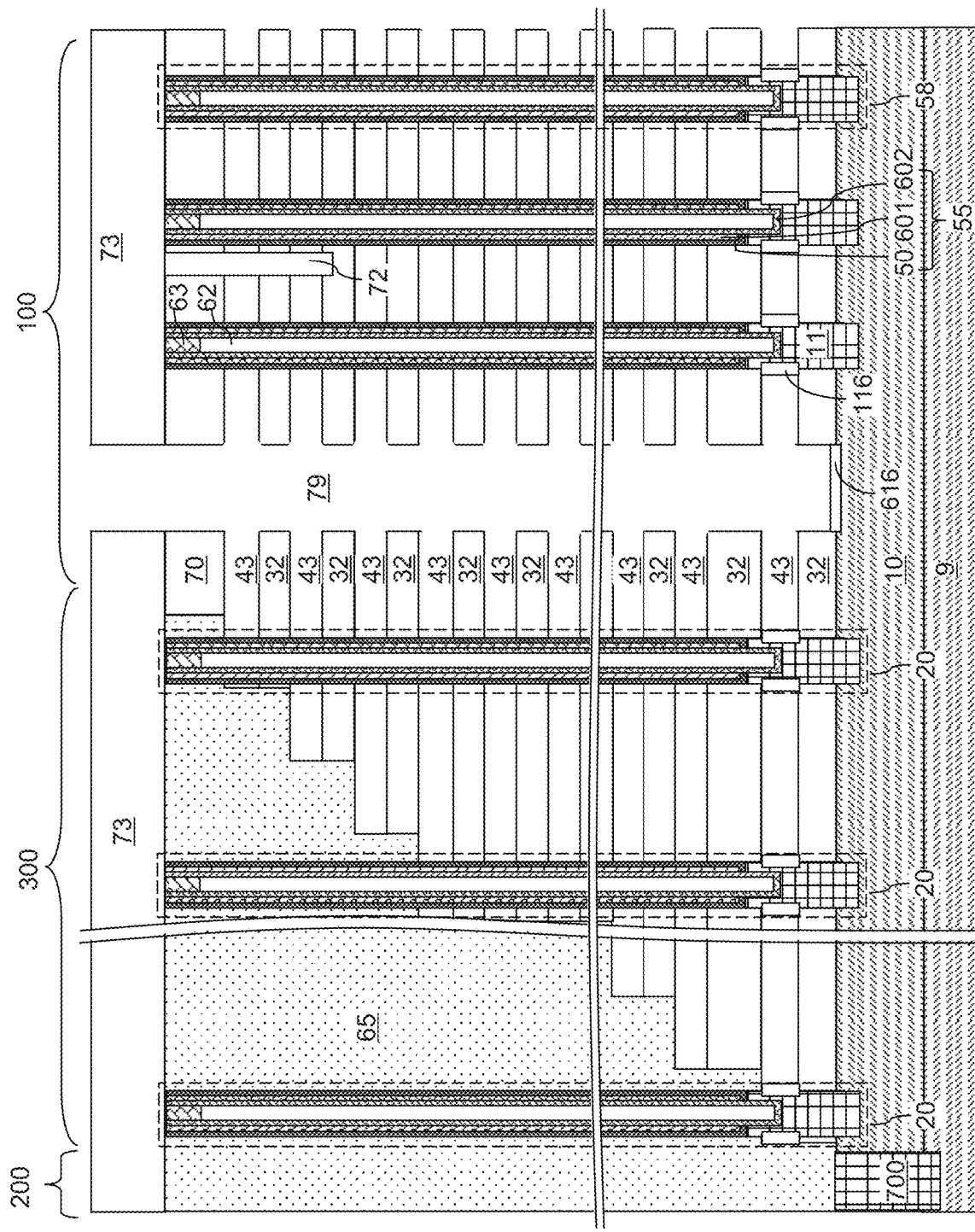
FIG. 8 is a schematic vertical cross-sectional view of the first exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a region of the first exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Figure 9B:
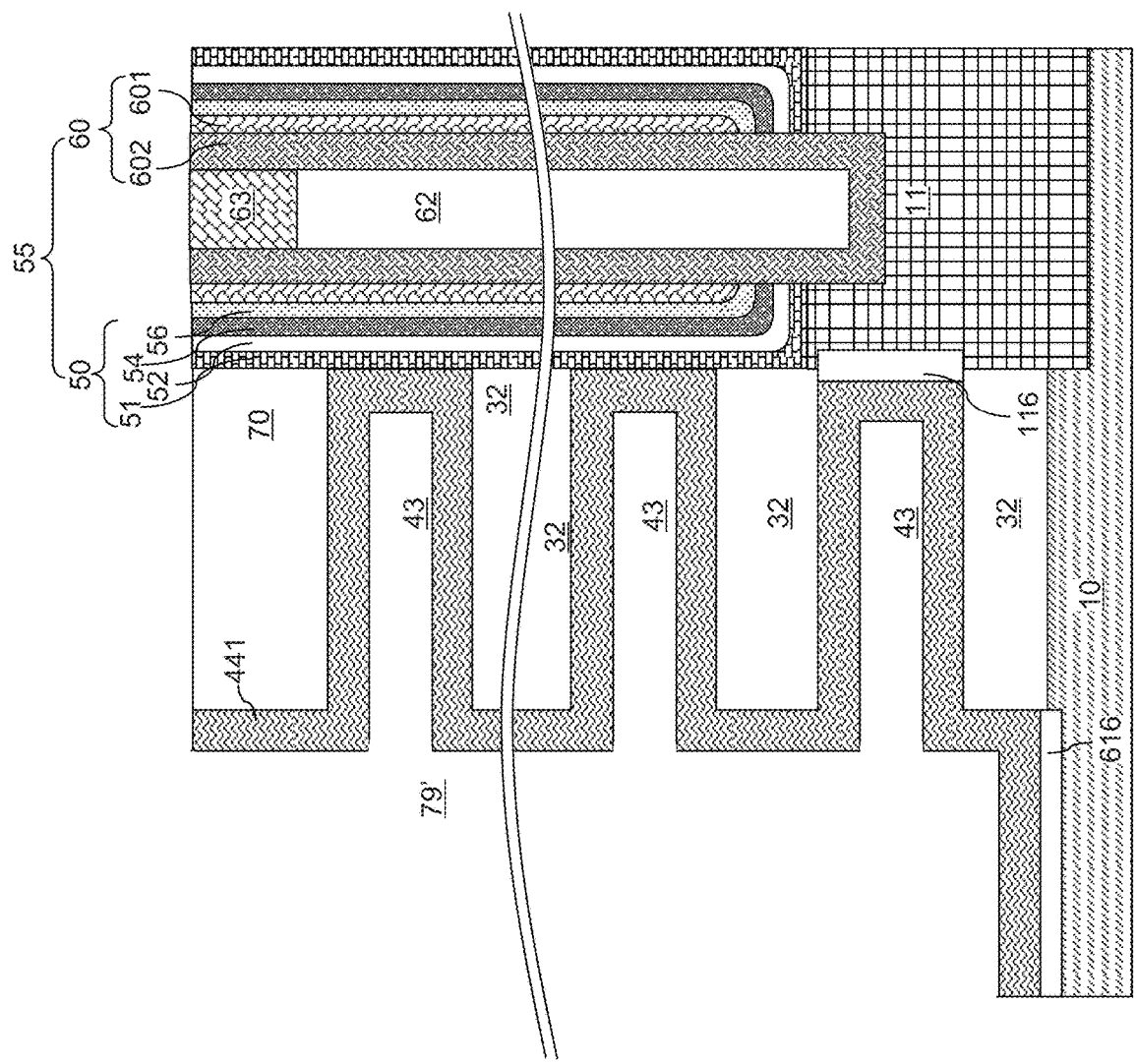

Referring to FIG. 9B, an amorphous aluminum oxide layer 441 may be formed by a conformal deposition process. The amorphous aluminum oxide layer 441 may be deposited directly on physically exposed surfaces of the insulating layers 32 and the memory opening fill structures 58 (such as outer sidewalls of the inner polycrystalline aluminum oxide blocking dielectric layer 51). The thickness of the amorphous aluminum oxide layer 441 may be, for example, in a range from 3 nm to 15 nm, such as from 4 nm to 10 nm, although lesser and greater thicknesses may also be used. The amorphous aluminum oxide layer 441 may be formed by a conformal deposition process such as atomic layer deposition (ALD).

The amorphous aluminum oxide layer 441 may be formed in the backside recesses 43 and on a sidewall of the backside trench 79. The amorphous aluminum oxide layer 441 may be formed directly on horizontal surfaces of the insulating layers 32 and sidewalls of the memory stack structures 55 within the backside recesses 43. The amorphous aluminum oxide layer 441 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the amorphous aluminum oxide layer 441.

Referring to FIG. 9C, a thermal anneal process may be performed to convert the amorphous aluminum oxide layer 441 into a polycrystalline aluminum oxide layer that is used as a backside blocking dielectric layer. The polycrystalline aluminum oxide layer is herein referred to as an in-process polycrystalline aluminum oxide blocking dielectric layer 44'. The temperature of the thermal anneal process may be in a range from 900 degrees Celsius to 1,100 degrees Celsius, such as from 950 degrees Celsius to 1,070 degrees Celsius. The duration of the thermal anneal process may be in a range from 1 second to 60 seconds. The in-process polycrystalline aluminum oxide blocking dielectric layer 44' may have an initial thickness u0, which may be less than the thickness of the amorphous aluminum oxide layer 441 by about 20% of the thickness of the amorphous aluminum oxide layer 441. The thickness of the in-process polycrystalline aluminum oxide blocking dielectric layer 44' may be in a range from 2.5 nm to 12.5 nm, although lesser and greater thicknesses may also be used. The in-process polycrystalline aluminum oxide blocking dielectric layer 44' may comprise an edge at which a physically exposed vertical surface of the in-process polycrystalline aluminum oxide blocking dielectric layer 44' directly adjoins a physically exposed horizontal surface of the in-process polycrystalline aluminum oxide blocking dielectric layer 44'. For example, a circular or elliptical bottom edge of a physically exposed vertical surface of the in-process polycrystalline aluminum oxide blocking dielectric layer 44' may directly adjoin a physically exposed horizontal surface of the in-process polycrystalline aluminum oxide blocking dielectric layer 44' in the vicinity of each annular periphery at which the in-process polycrystalline aluminum oxide blocking dielectric layer 44', an insulating layer 32, and a memory opening fill structure 58 are adjoined to one another.

Referring to FIG. 9D, the in-process polycrystalline aluminum oxide blocking dielectric layer 44' is slimmed by an isotropic etch process. The isotropic etch process reduces the thickness of each vertical portion and each horizontal portion of the in-process polycrystalline aluminum oxide blocking dielectric layer 44' by a percentage in a range from 15% to 85%. The remaining portion of the in-process polycrystalline aluminum oxide blocking dielectric layer 44' constitutes an outer polycrystalline aluminum oxide blocking dielectric layer 44, which functions as a backside blocking dielectric layer.

The isotropic etch process may include a wet etch process using a basic etchant such as ammonium hydroxide and/or methyl hydroxide, or an acidic etchant such as phosphoric acid. In one embodiment, the isotropic etch process comprises a wet etch process using at least one of phosphoric acid, potassium hydroxide, and ammonium hydroxide. A slow etch process may be used to provide a controlled isotropic etch process. Physically exposed surfaces of the in-process polycrystalline aluminum oxide blocking dielectric layer 44' are isotropically recessed at a same etch rate. The duration of the isotropic etch process may be controlled such that the thickness of the outer polycrystalline aluminum oxide blocking dielectric layer 44 after the etch process is in a range from 2 nm to 4 nm. Corner rounding of the in-process polycrystalline aluminum oxide blocking dielectric layer 44' may occur as a result of the isotropic etch process.

The thickness of the outer polycrystalline aluminum oxide blocking dielectric layer 44 after the isotropic etch process is herein referred to as a slimmed thickness u1. The material of the in-process polycrystalline aluminum oxide blocking dielectric layer 44' is isotropically etched from each edge at which a physically exposed vertical sidewall of the in-process polycrystalline aluminum oxide blocking dielectric layer 44' adjoins a physically exposed horizontal surface of the in-process polycrystalline aluminum oxide blocking dielectric layer 44'. The isotropic etch process removes the annular physical edge between each outer vertical sidewall and a horizontal surface of the in-process polycrystalline aluminum oxide blocking dielectric layer 44', and forms a concave surface having a uniform radius of curvature within a region in which a physically exposed vertical surface of the outer polycrystalline aluminum oxide blocking dielectric layer 44 indirectly adjoins a physically exposed horizontal surface of the outer polycrystalline aluminum oxide blocking dielectric layer 44 through the concave surface.

A pair of continuous concave surfaces of the planar bottom portion of the outer polycrystalline aluminum oxide blocking dielectric layer 44 is formed around each memory opening fill structure 55 at each level of the backside recesses 43. Each continuous concave surface may have a radius of curvature Rc, which may be the same as the etch distance of the isotropic etch process. The radius of curvature Rc may be the same as the difference between the initial thickness u0 and the slimmed thickness u1.

Figure 9E:
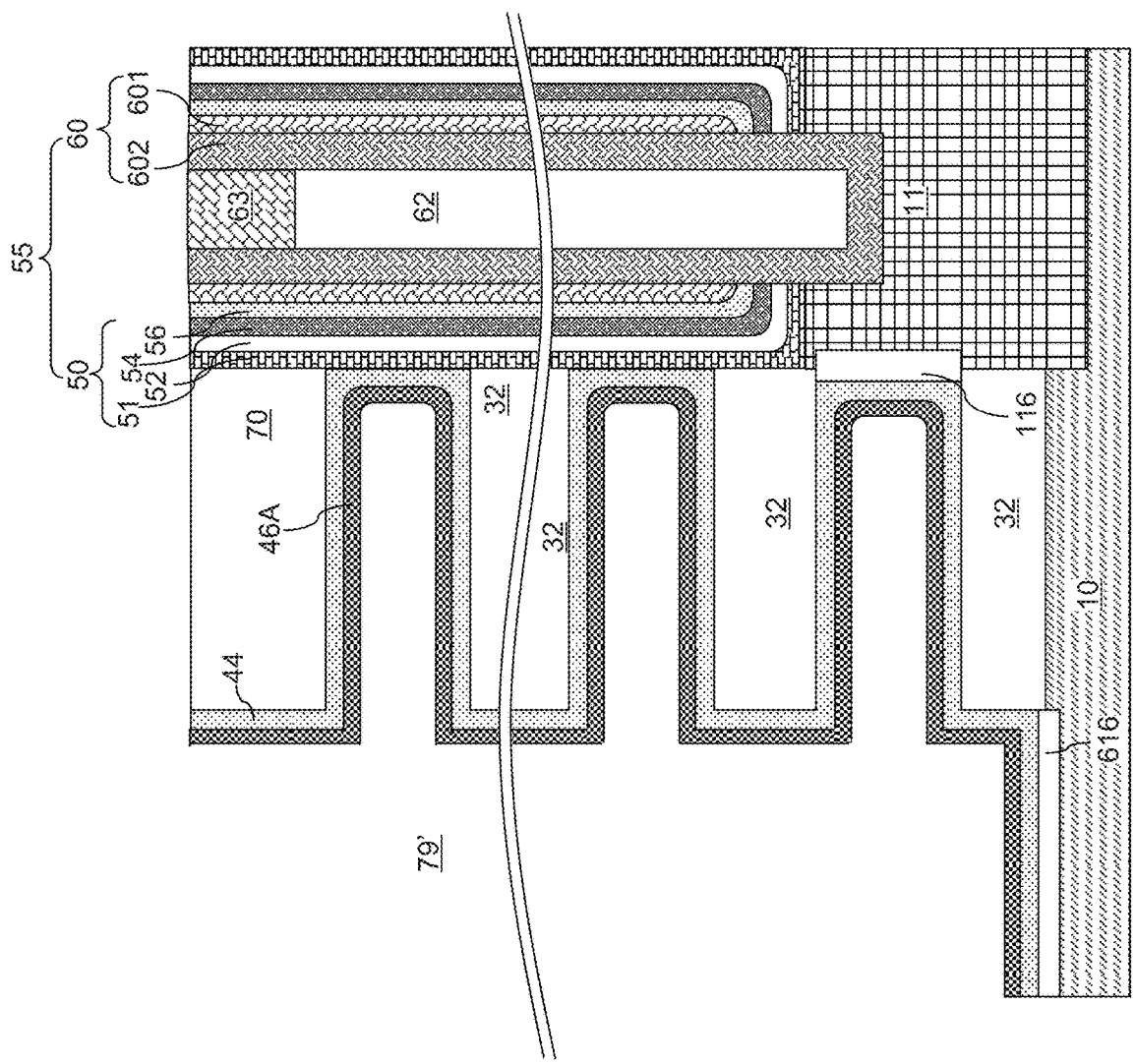

Referring to FIG. 9E, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Referring to FIGS. 9F and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with a combination of an outer polycrystalline aluminum oxide blocking dielectric layer 44 and an electrically conductive layer 46. A backside cavity 79' is present in the portion of each backside trench 79 that is not filled with the outer polycrystalline aluminum oxide blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
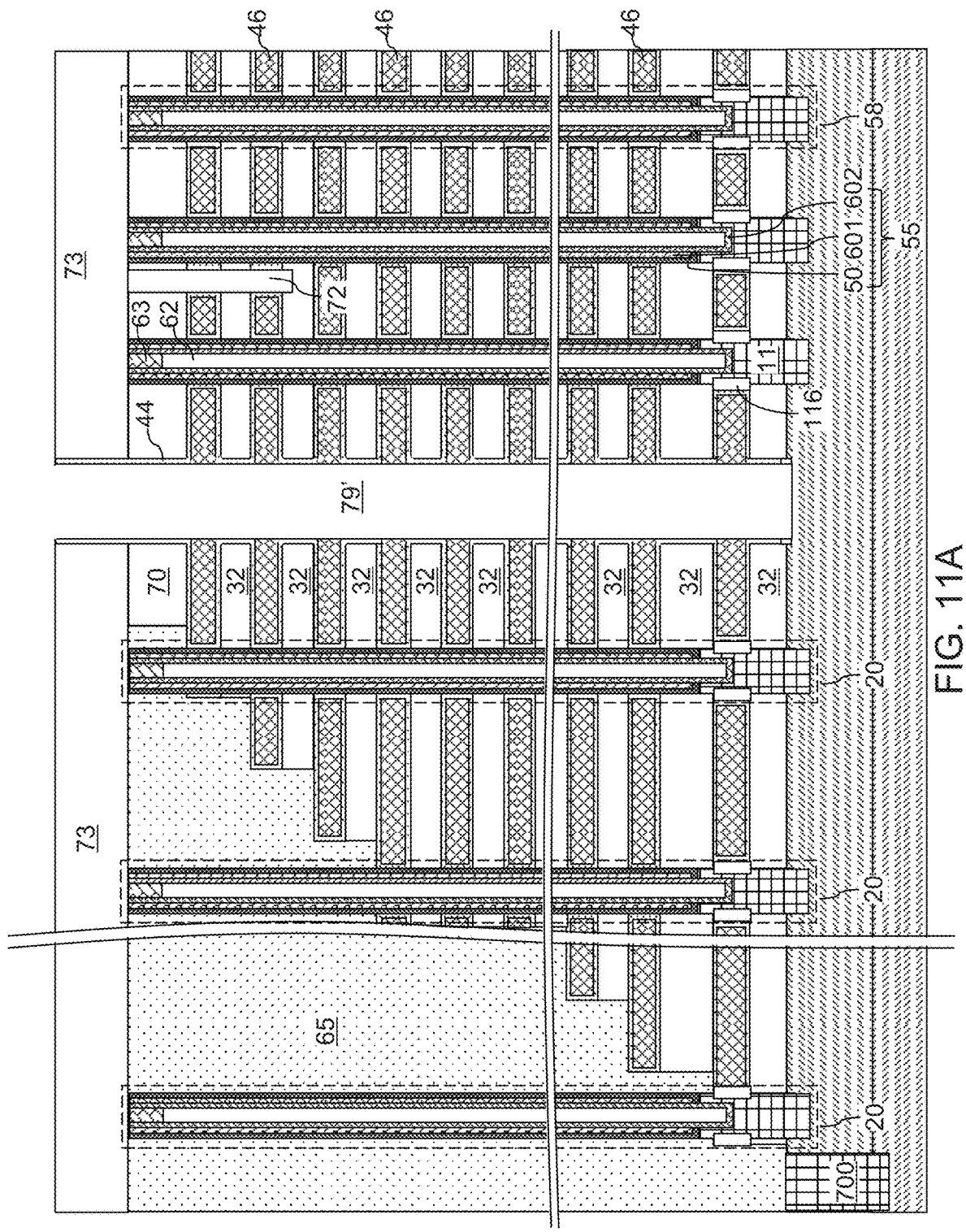
FIG. 11A is a schematic vertical cross-sectional view of the first exemplary structure after removal of a deposited conductive material from within the backside trench according to an embodiment of the present disclosure.
Figure 11B:
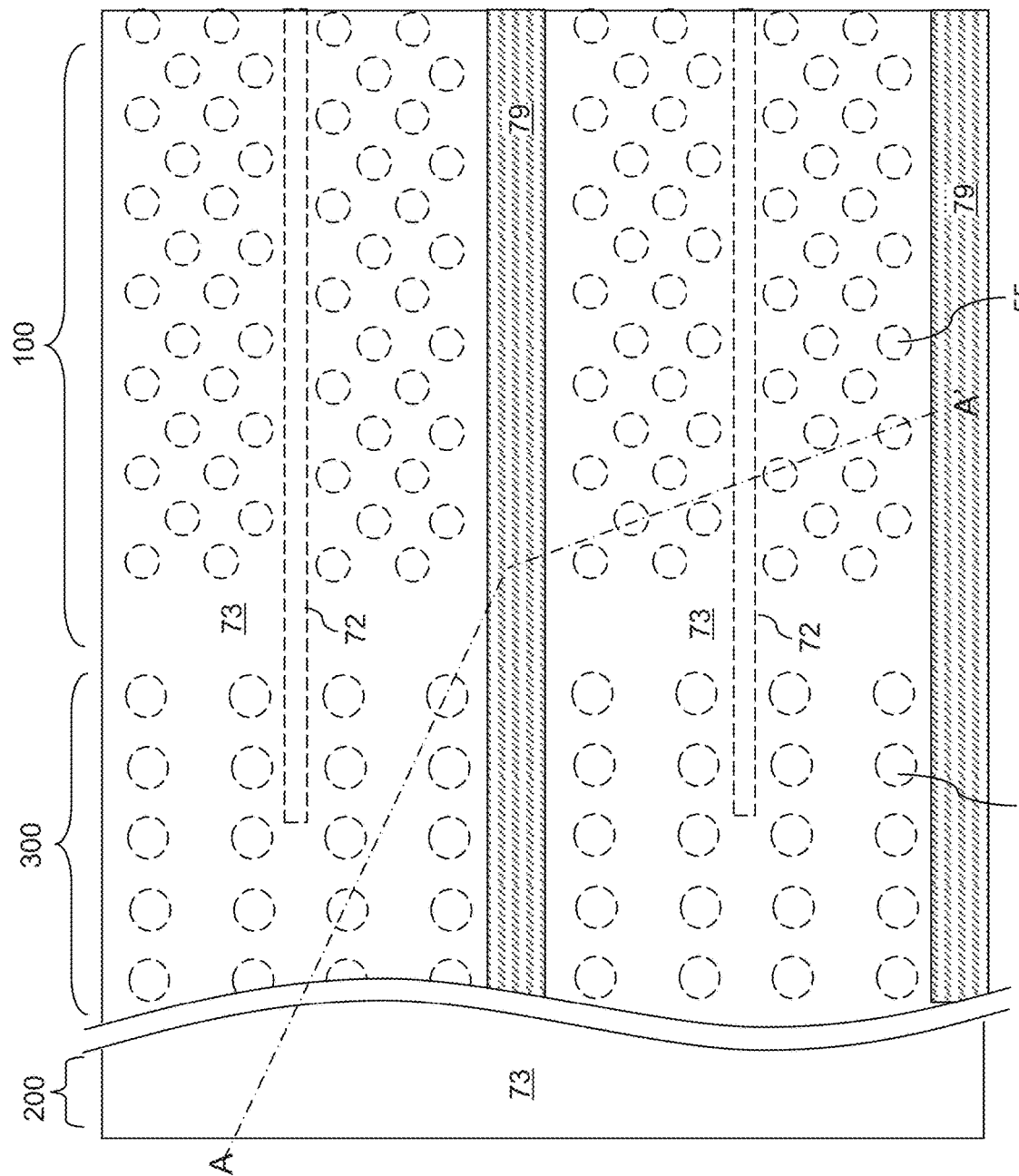
FIG. 11B is a see-through top-down view of the first exemplary structure of FIG. 11A.
Figure 11C:
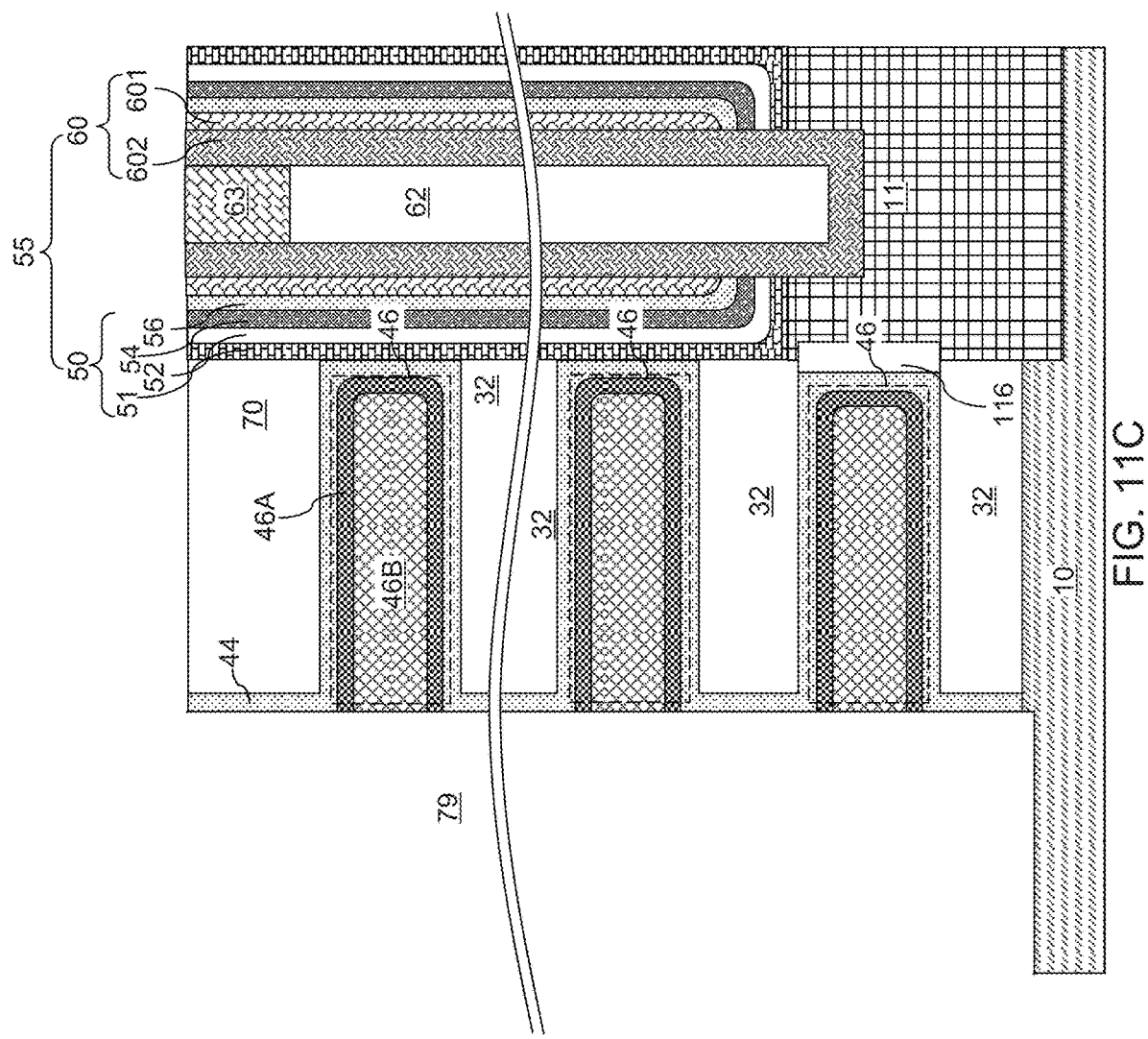
FIG. 11C is a magnified view of a region of FIG. 11A that includes a backside trench and a memory opening fill structure.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the outer polycrystalline aluminum oxide blocking dielectric layer 44. In this case, a horizontal portion of the outer polycrystalline aluminum oxide blocking dielectric layer 44 may be present at the bottom of each backside trench 79. In another embodiment, the removal of the continuous electrically conductive material layer 46L may not be selective to the material of the outer polycrystalline aluminum oxide blocking dielectric layer 44 or, the outer polycrystalline aluminum oxide blocking dielectric layer 44 may not be used. The planar dielectric portions 616 may be removed during removal of the continuous electrically conductive material layer 46L. A backside cavity 79' is present within each backside trench 79.

Figure 12A:
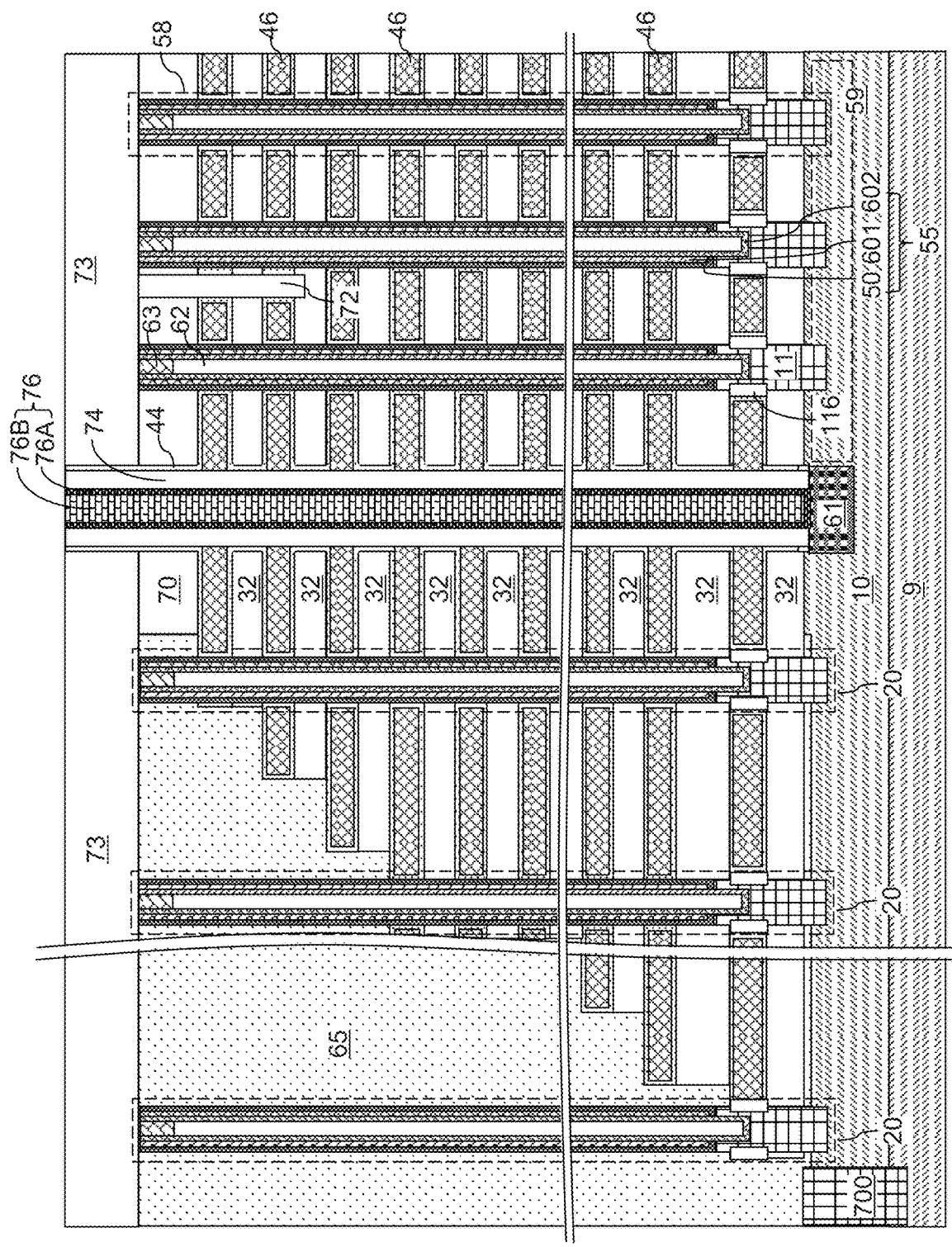
FIG. 12A is a schematic vertical cross-sectional view of the first exemplary structure after formation of an insulating spacer and a backside contact structure according to an embodiment of the present disclosure.
Figure 12B:
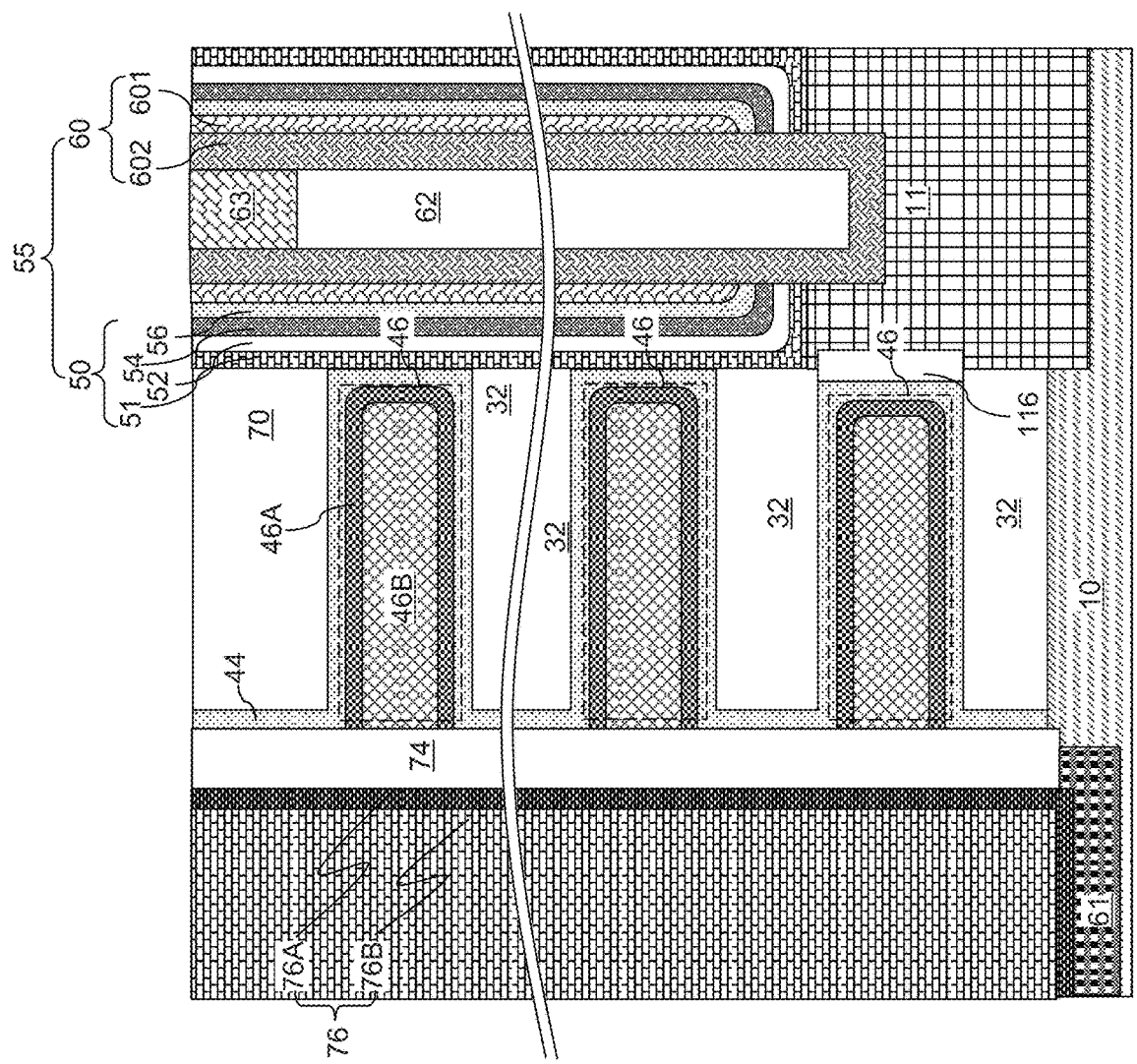
FIG. 12B is a magnified view of a region of the first exemplary structure of FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If an outer polycrystalline aluminum oxide blocking dielectric layer 44 is present, the insulating material layer may be formed directly on surfaces of the outer polycrystalline aluminum oxide blocking dielectric layer 44 and directly on the sidewalls of the electrically conductive layers 46. If an outer polycrystalline aluminum oxide blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 may be formed in an upper portion of the semiconductor material layer 10. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each backside contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If an outer polycrystalline aluminum oxide blocking dielectric layer 44 is used, the backside contact via structure 76 may contact a sidewall of the outer polycrystalline aluminum oxide blocking dielectric layer 44.

Figure 13A:
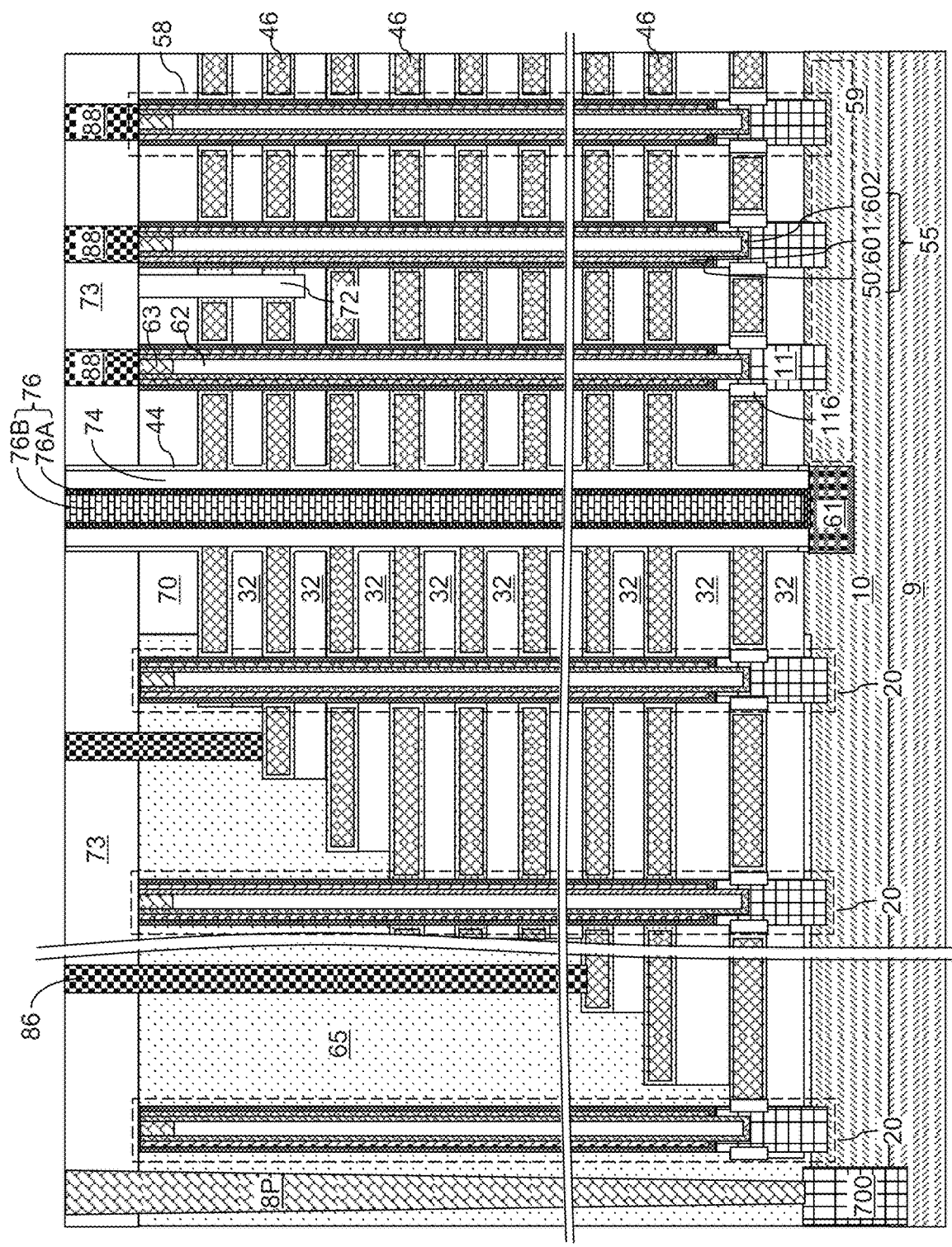
FIG. 13A is a schematic vertical cross-sectional view of the first exemplary structure after formation of additional contact via structures according to an embodiment of the present disclosure.
Figure 13B:
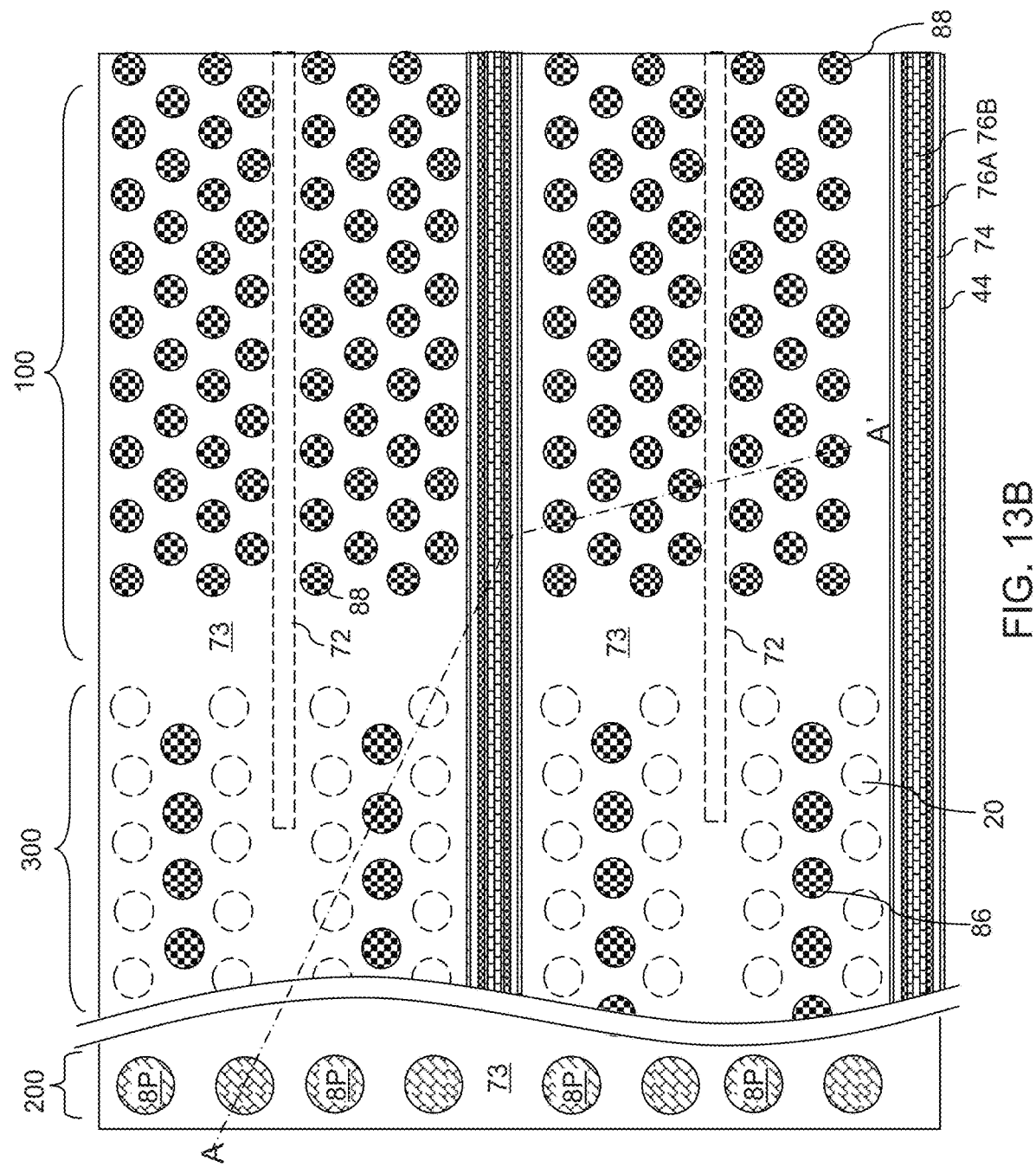
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices.

Referring to FIG. 14A, a first alternative configuration for a region around a memory opening of the first exemplary structure is illustrated. The first exemplary structure illustrated in FIG. 14A may be derived from the first example structure illustrated in FIG. 5B by omitting the processing steps of FIGS. 5C, 5D, and 5E and by performing the processing steps of FIG. 5F. In this case, the silicon oxide blocking dielectric layer 52 may be formed directly on the sidewalls of the insulating layers 32 and the sacrificial material layers, on physically exposed surfaces of the insulating cap layer 70, and on the top surfaces of the pedestal channel portions 11.

Referring to FIG. 14B, the processing steps of FIG. 5G may be performed to remove horizontal portions of the silicon oxide blocking dielectric layer 52, the charge storage layer 54, the tunneling dielectric layer 56, and the first semiconductor channel layer 601.

Referring to FIG. 14C, the processing steps of FIG. 5H may be performed to deposit a second semiconductor channel layer 602.

Referring to FIG. 14D, the processing steps of FIG. 5I may be performed to form a dielectric core layer 62L.

Figure 14E:
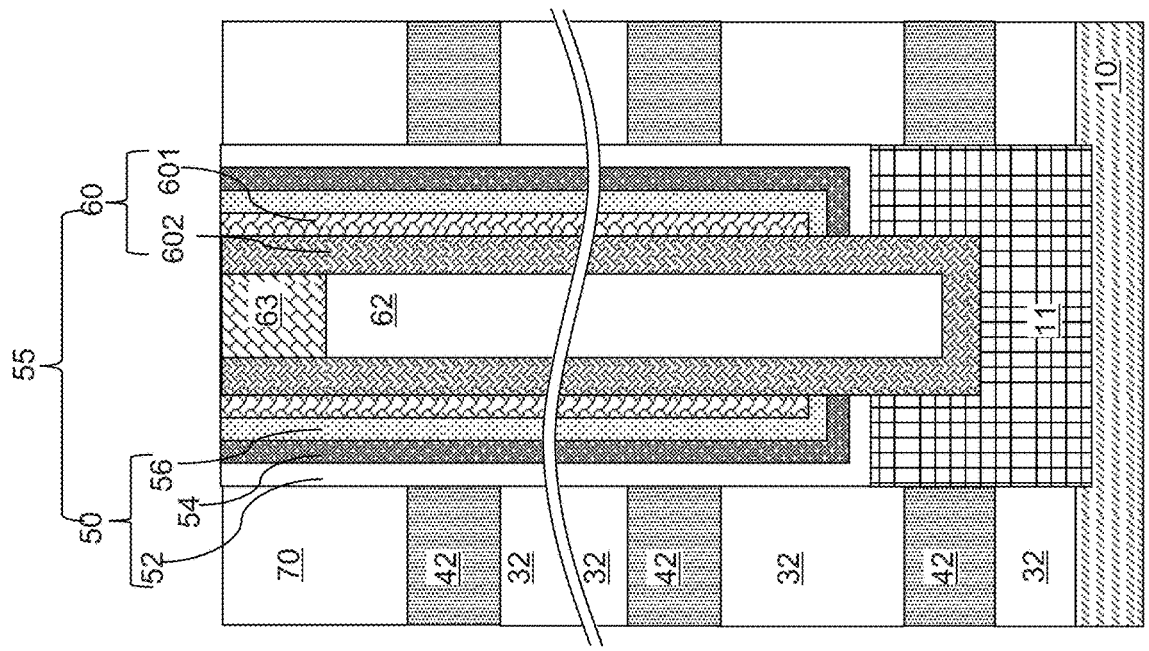

Referring to FIG. 14E, the processing steps of FIG. 5I may be performed to remove horizontal portions of the dielectric core layer 62L and the second semiconductor channel layer 602. A dielectric core 62 is formed within each memory opening.

Figure 14F:
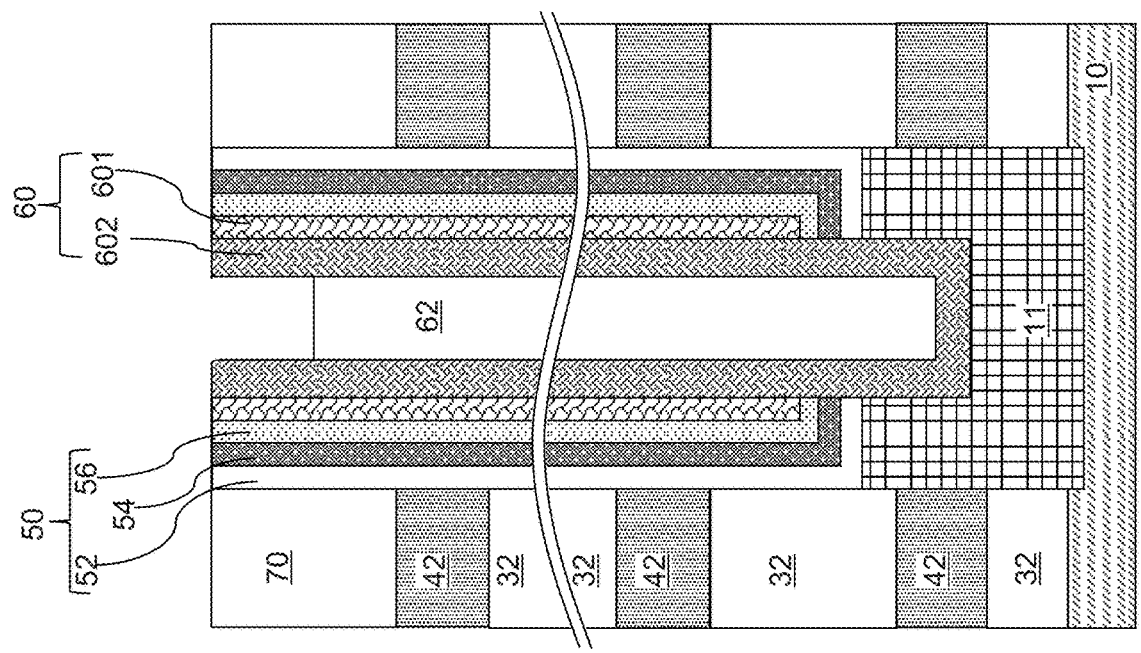

Referring to FIG. 14F, the processing steps of FIG. 5K may be performed to form a drain region 63 at an upper end of each vertical semiconductor channel 60.

Figure 15A:
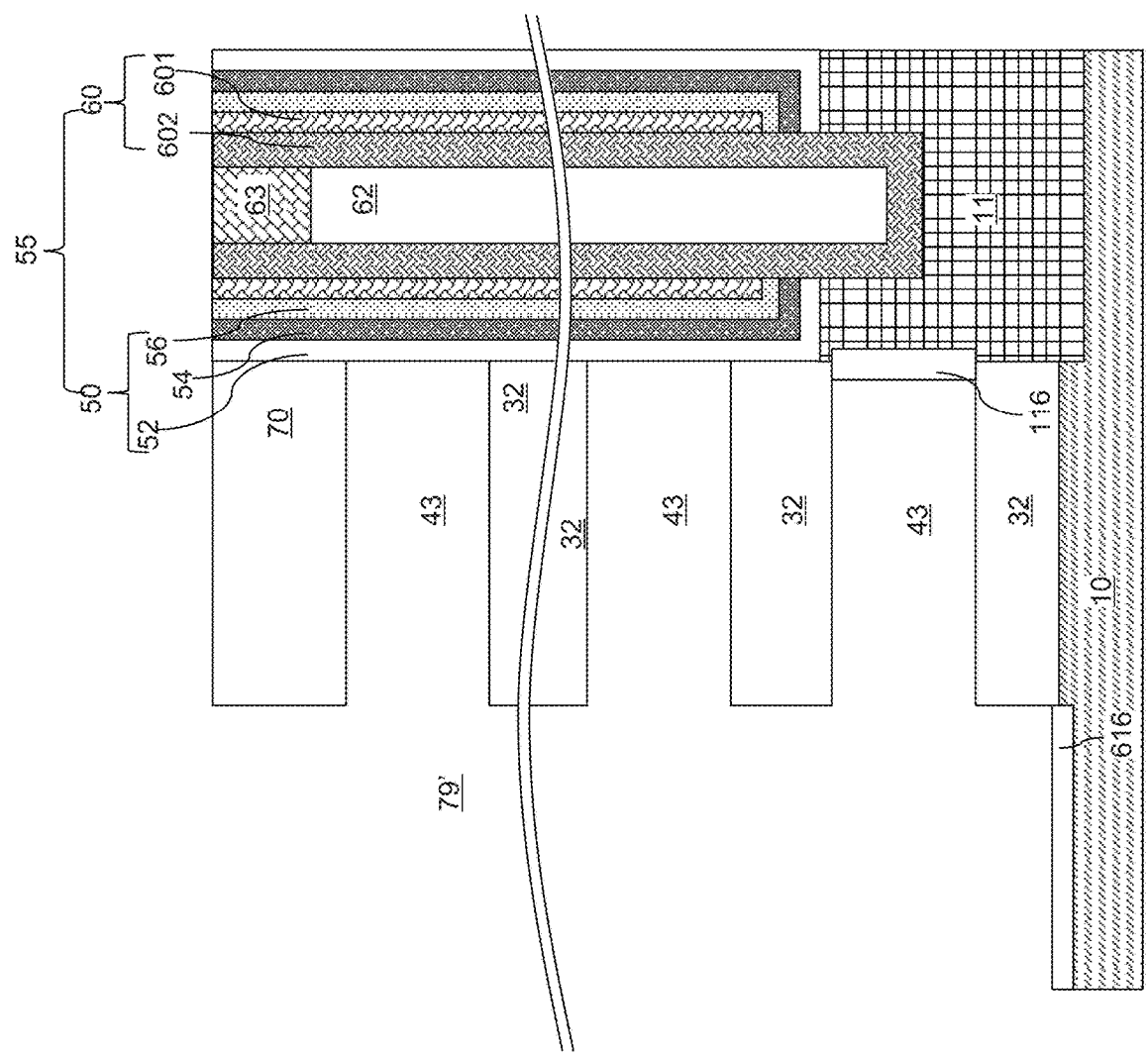

Referring to FIG. 15A, the processing steps of FIGS. 7A, 7B, 8, and 9A may be performed to form backside trenches 79, backside recesses 43, tubular dielectric spacers 116, and planar dielectric portions 616.

Figure 15B:
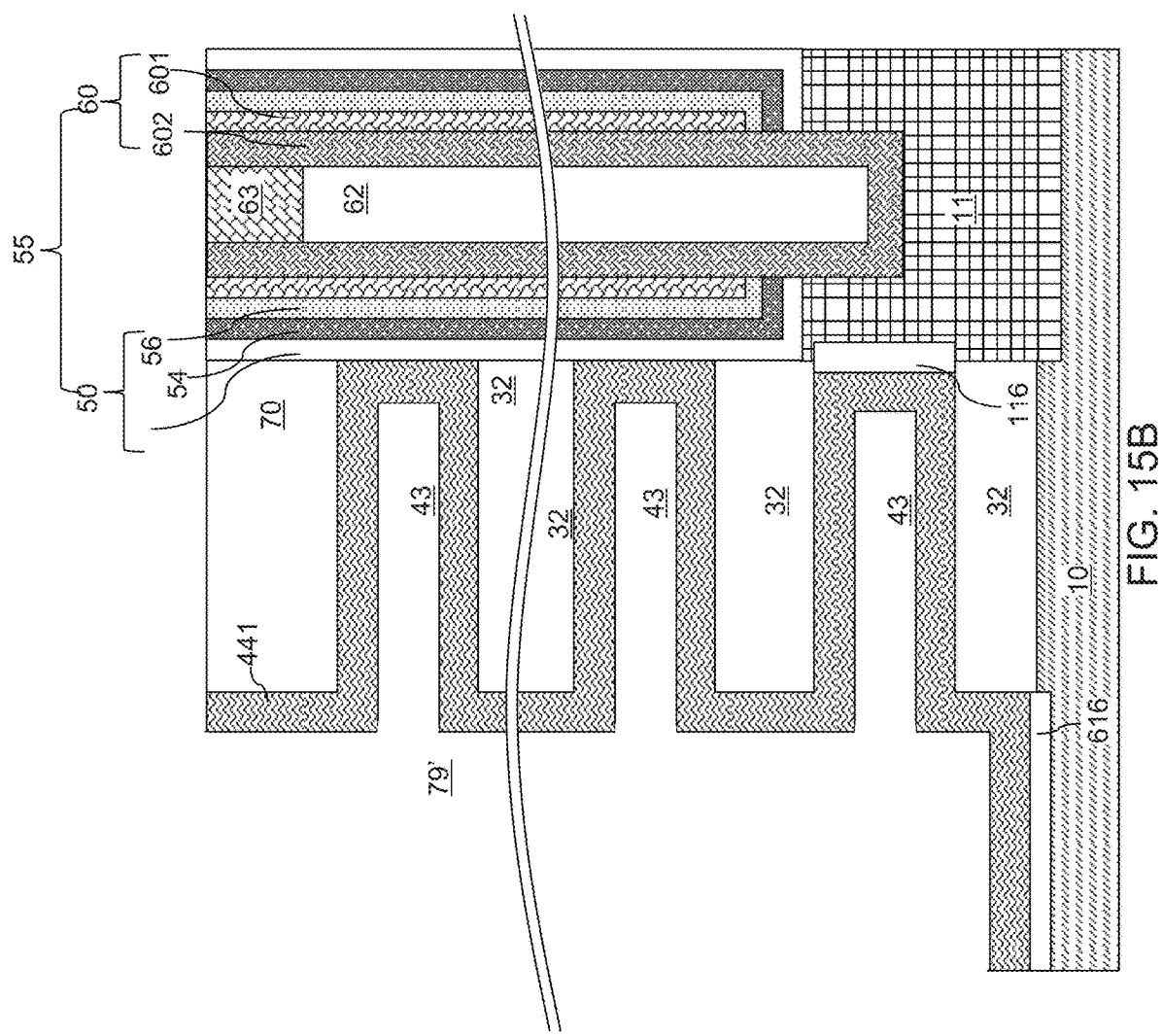

Referring to FIG. 15B, the processing steps of FIG. 9B may be performed to form an amorphous aluminum oxide layer 441 directly on physically exposed surfaces of the insulating layers 32 and the memory opening fill structures 58 (such as outer sidewalls of the silicon oxide blocking dielectric layers 52).

Figure 15C:
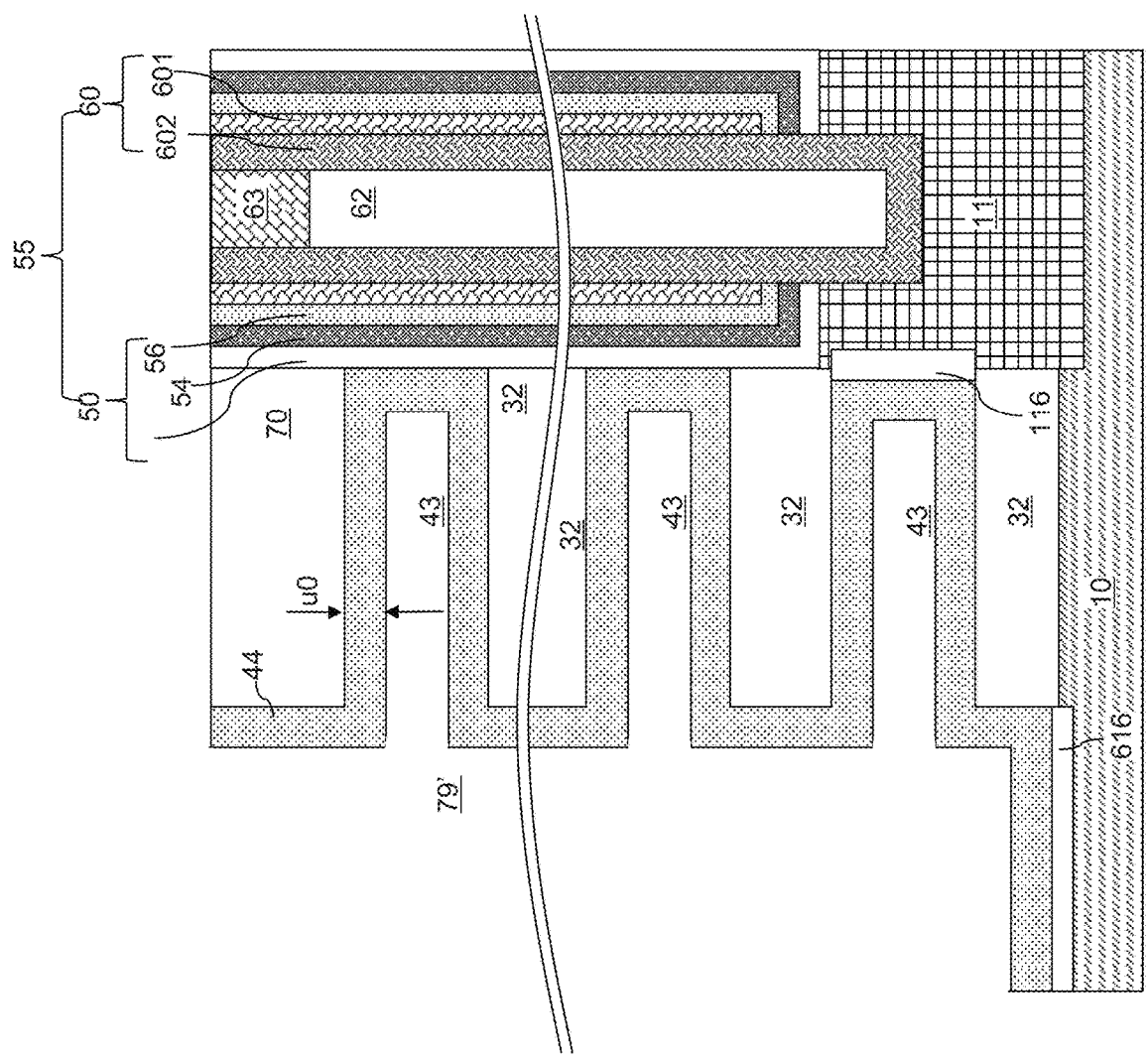

Referring to FIG. 15C, the processing steps of FIG. 9C may be performed to covert the amorphous aluminum oxide layer 441 into an in-process polycrystalline aluminum oxide blocking dielectric layer 44'.

Figure 15D:
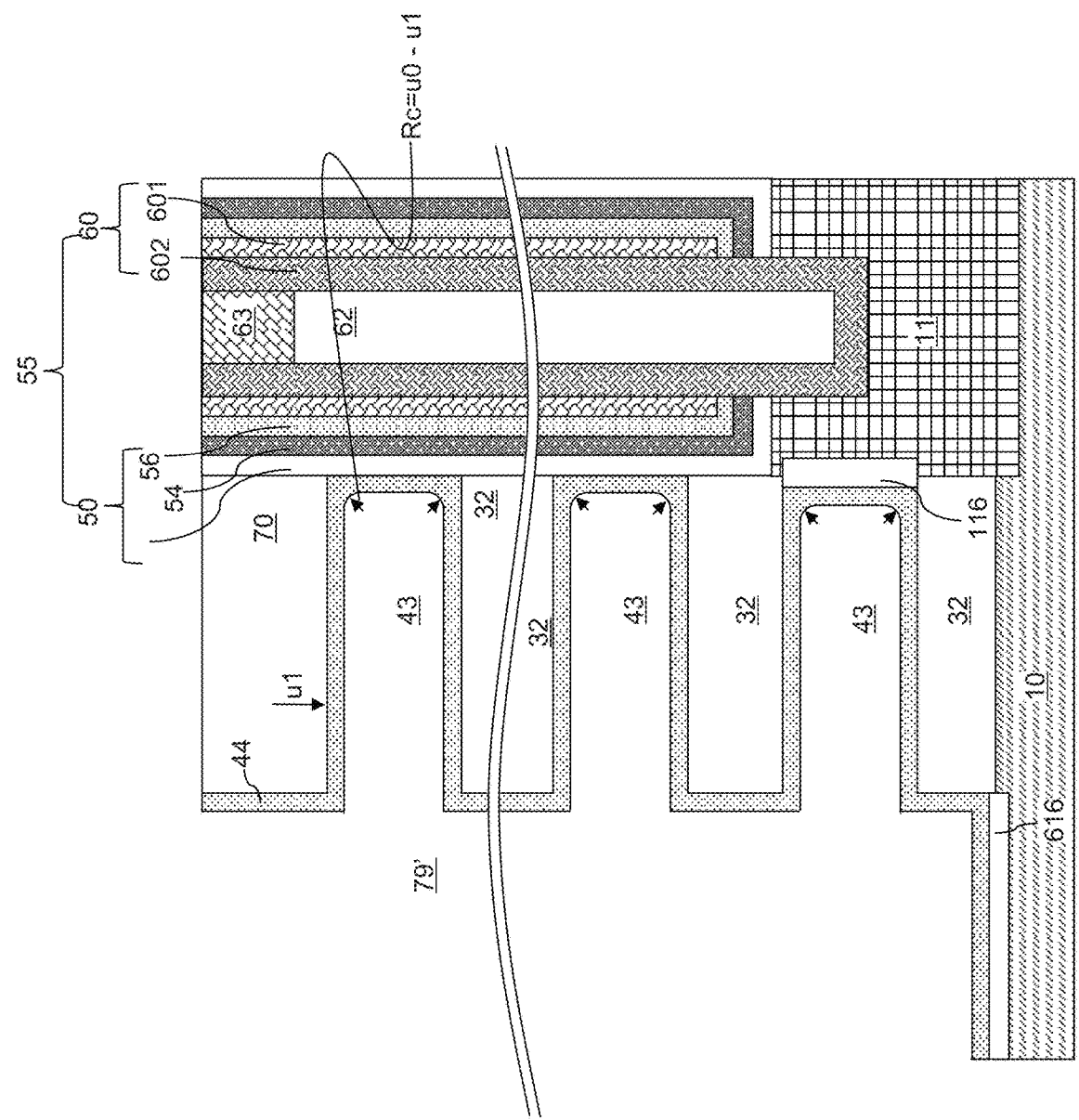

Referring to FIG. 15D, the processing steps of FIG. 9D may be performed to slim the in-process polycrystalline aluminum oxide blocking dielectric layer 44' into an outer polycrystalline aluminum oxide blocking dielectric layer 44. An isotropic etch process may reduce the thickness of each vertical portion and each horizontal portion of the in-process polycrystalline aluminum oxide blocking dielectric layer 44' by a percentage in a range from 15% to 85%. Physically exposed surfaces of the in-process polycrystalline aluminum oxide blocking dielectric layer 44' are isotropically recessed at a same etch rate. The duration of the isotropic etch process may be controlled such that the thickness of the outer polycrystalline aluminum oxide blocking dielectric layer 44 after the etch process is in a range from 2 nm to 4 nm. Corner rounding of the in-process polycrystalline aluminum oxide blocking dielectric layer 44' may occur as a result of the isotropic etch process.

The thickness of the outer polycrystalline aluminum oxide blocking dielectric layer 44 after the isotropic etch process is herein referred to as a slimmed thickness u1. The material of the in-process polycrystalline aluminum oxide blocking dielectric layer 44' is isotropically etched from each edge at which a physically exposed vertical sidewall of the in-process polycrystalline aluminum oxide blocking dielectric layer 44' adjoins a physically exposed horizontal surface of the in-process polycrystalline aluminum oxide blocking dielectric layer 44'. The isotropic etch process removes the annular physical edge between each outer vertical sidewall and a horizontal surface of the in-process polycrystalline aluminum oxide blocking dielectric layer 44', and forms a concave surface having a uniform radius of curvature within a region in which a physically exposed vertical surface of the outer polycrystalline aluminum oxide blocking dielectric layer 44 indirectly adjoins a physically exposed horizontal surface of the outer polycrystalline aluminum oxide blocking dielectric layer 44 through the concave surface.

A pair of continuous concave surfaces of the planar bottom portion of the outer polycrystalline aluminum oxide blocking dielectric layer 44 is formed around each memory opening fill structure 55 at each level of the backside recesses 43. Each continuous concave surface may have a radius of curvature Rc, which may be the same as the etch distance of the isotropic etch process. The radius of curvature Rc may be the same as the difference between the initial thickness u0 and the slimmed thickness u1.

Referring to FIG. 15E, the processing steps of FIG. 9E may be performed to deposit a metallic barrier layer 46A.

Figure 15F:
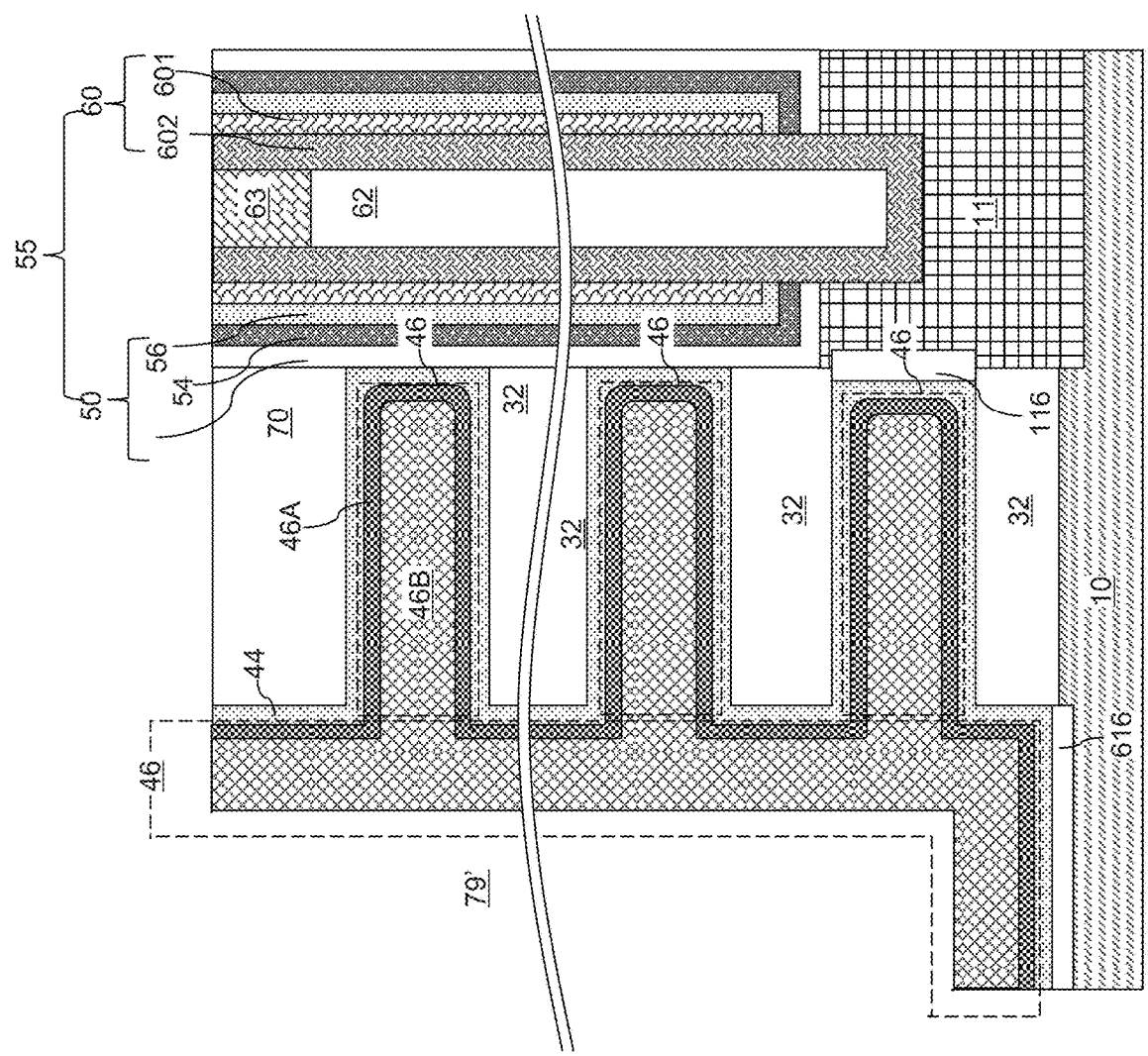

Referring to FIG. 15F, the processing steps of FIGS. 9F and 10 may be performed to form electrically conductive layers 46 and a continuous electrically conductive material layer 46L.

Figure 15G:
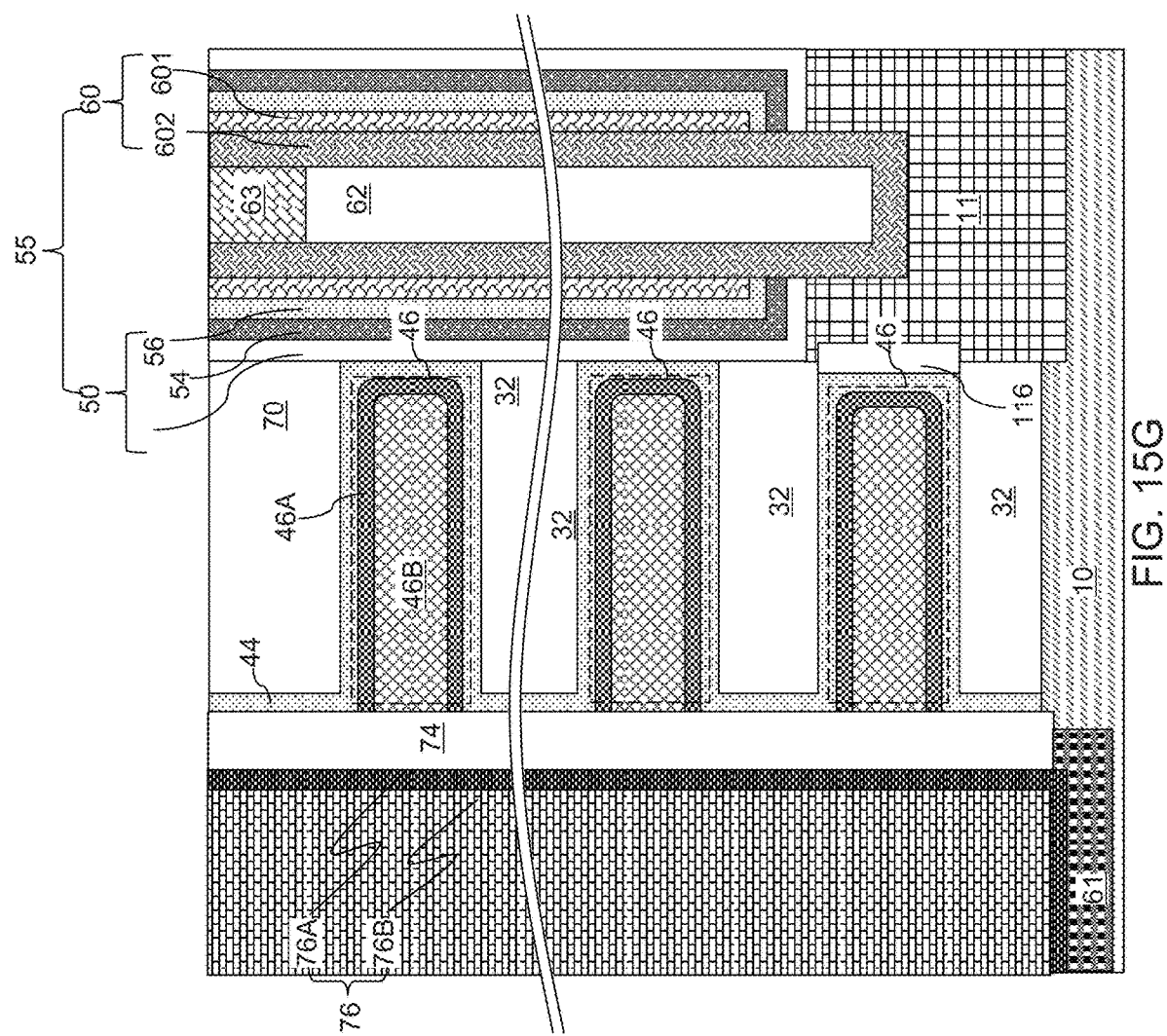

Referring to FIG. 15G, the processing steps of FIGS. 11A-11C, 12A, and 12B may be performed to remove the continuous electrically conductive material layer 46L and to form insulating spacers 74, source regions 61, and backside contact via structures 76. Subsequently, the processing steps of FIGS. 13A and 13B may be performed to form additional contact via structures (88, 86, 8P).

Referring to FIG. 16A, a second alternative configuration of the first exemplary structure may be the same as the first exemplary structure of FIGS. 8 and 9B.

Figure 16B:
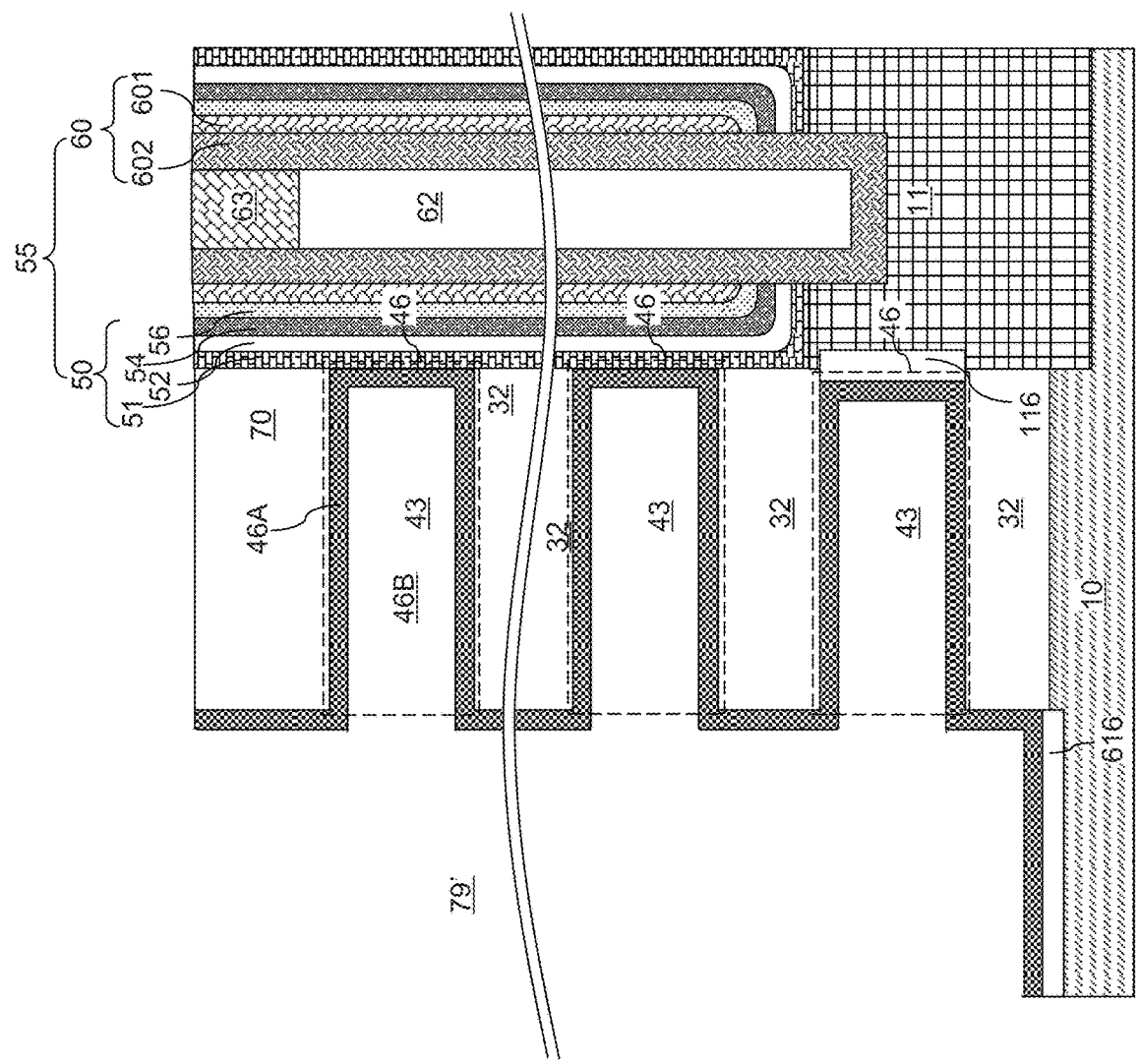

Referring to FIG. 16B, the processing steps of FIGS. 9B, 9C, and 9D are omitted, and the processing steps of FIG. 9E may be performed to deposit a metallic barrier layer 46A.

Figure 16C:
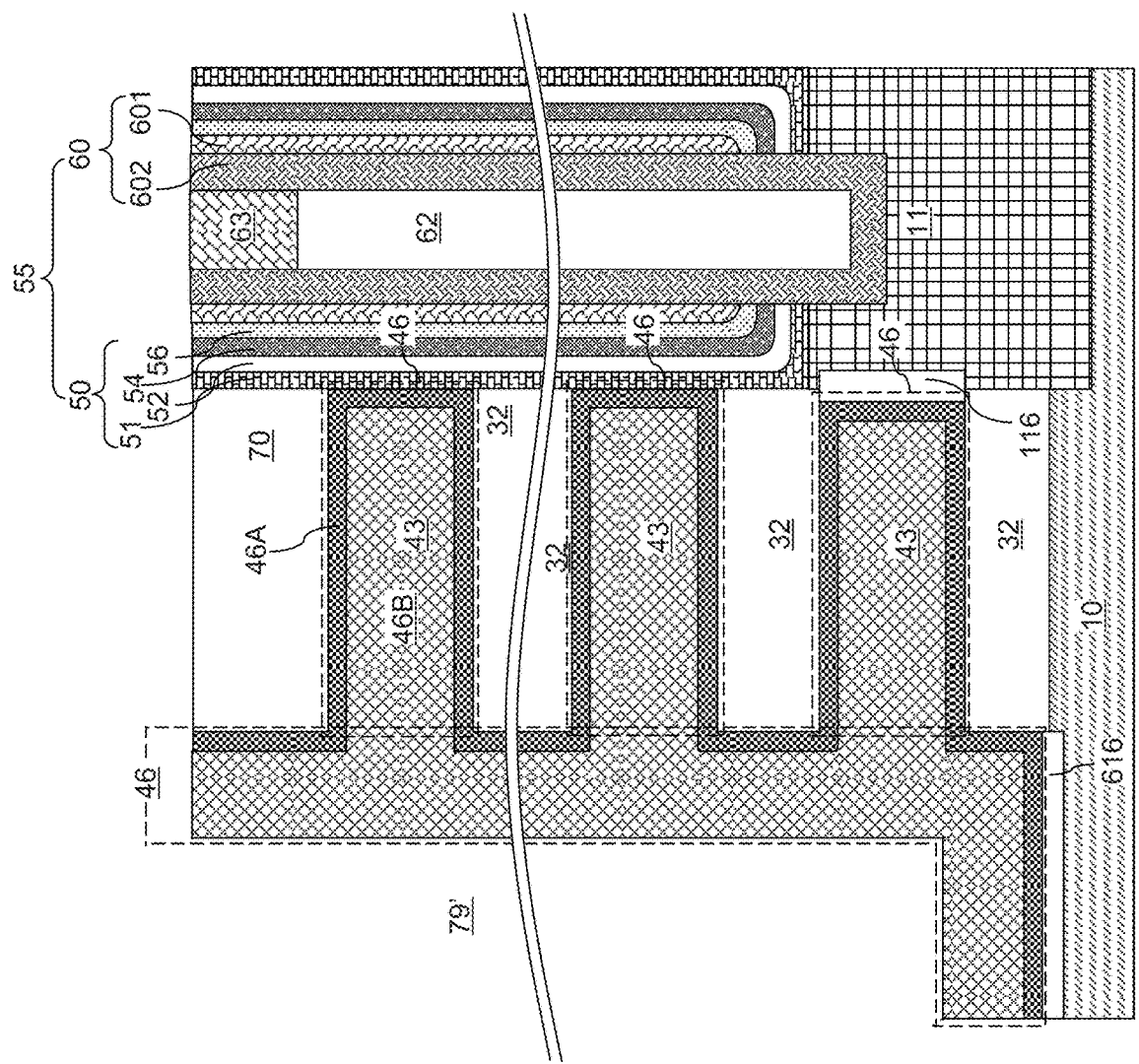

Referring to FIG. 16C, the processing steps of FIGS. 9F and 10 may be performed to form electrically conductive layers 46 and a continuous electrically conductive material layer 46L.

Referring to FIG. 15D, the processing steps of FIGS. 11A-11C, 12A, and 12B may be performed to remove the continuous electrically conductive material layer 46L and to form insulating spacers 74, source regions 61, and backside contact via structures 76. Subsequently, the processing steps of FIGS. 13A and 13B may be performed to form additional contact via structures (88, 86, 8P).

Figure 17:
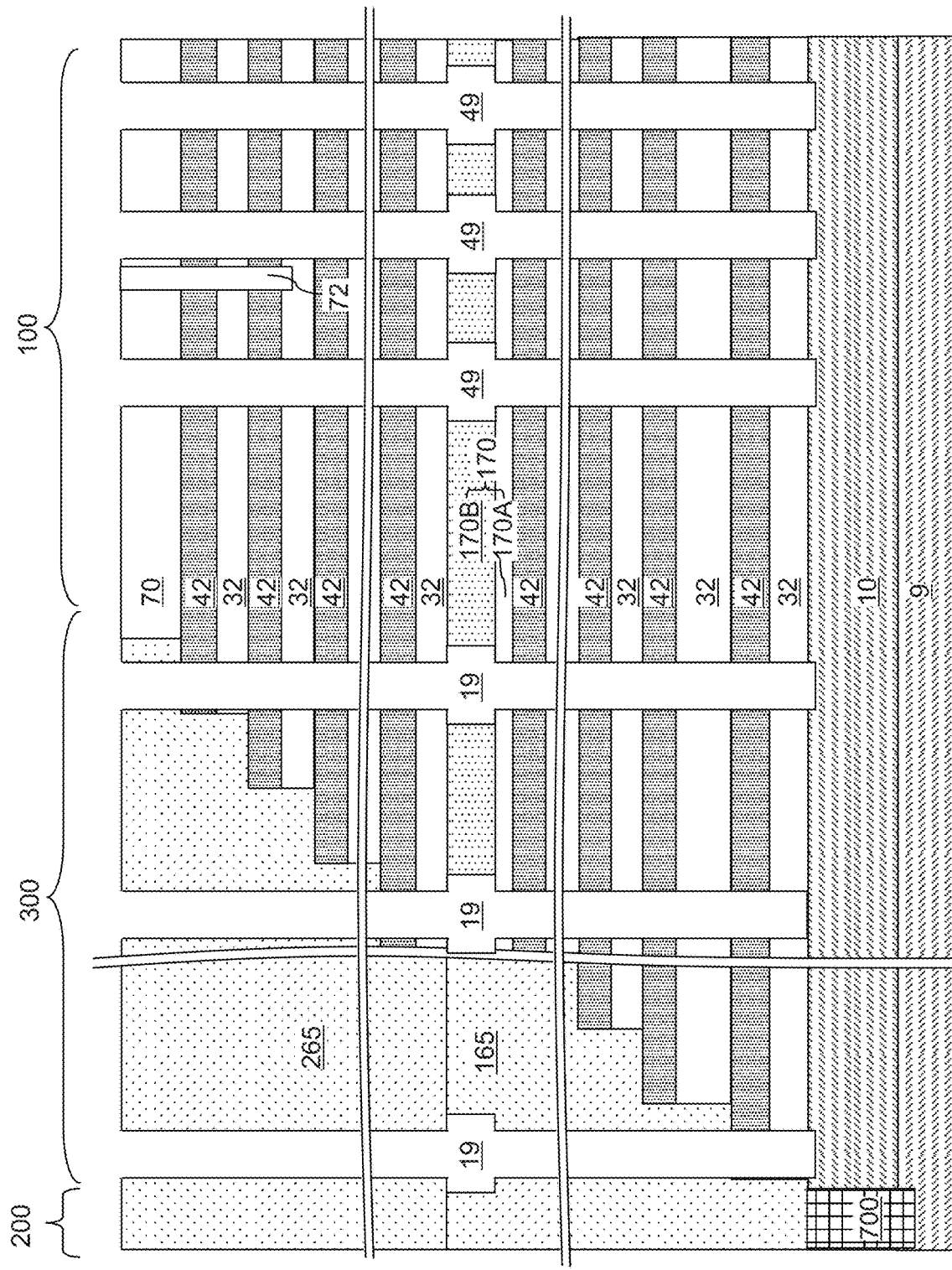
FIG. 17 is a vertical cross-sectional view of a second exemplary structure after formation of memory openings and support openings according to an embodiment of the present disclosure.
Figure 18A:
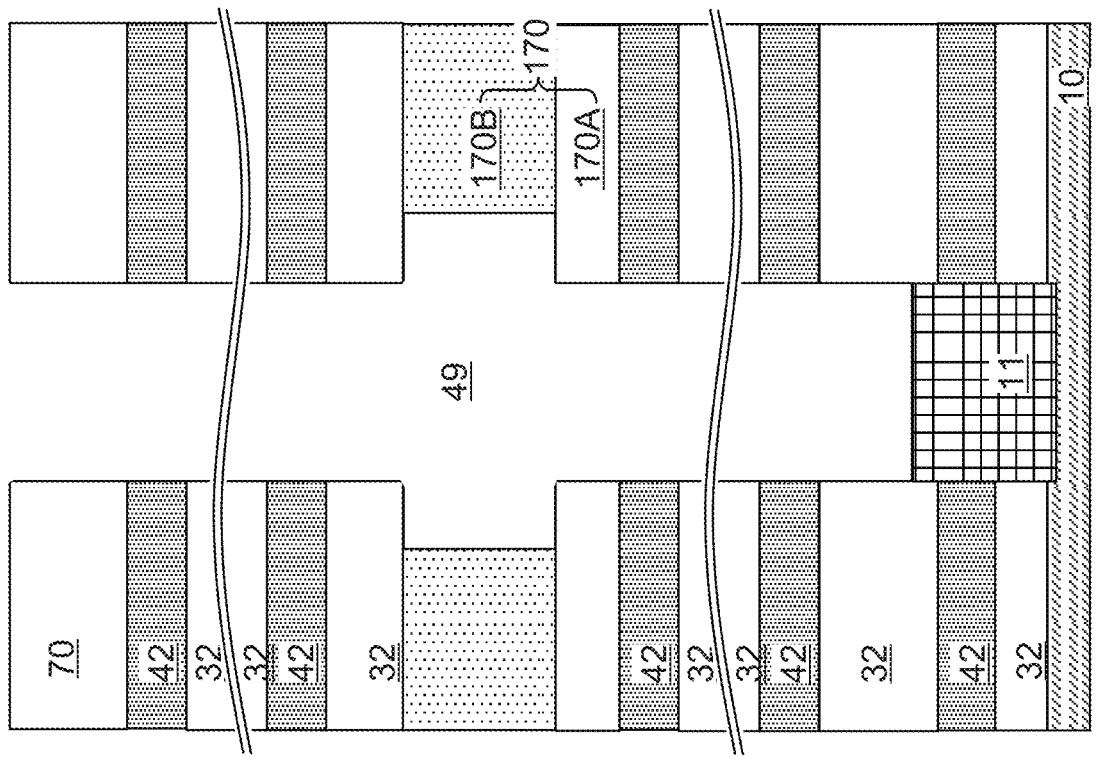

Referring to FIGS. 17 and 18A, a second exemplary structure may be derived from the first exemplary structure of FIGS. 4A and 4B by forming an intermediate insulating layer 170 in a middle portion of the alternating stack (32, 42). Specifically, the intermediate insulating layer 170 may be formed over a lower subset of the alternating stack (32, 42), and a first retro-stepped dielectric material portion 165 may be formed over first patterned stepped surfaces of the lower subset of the alternating stack (32, 42). The intermediate insulating layer 170 may include a lower intermediate insulating layer 170A including a same material as the insulating layers 32 and an upper intermediate insulating layer 170B having a greater etch rate in dilute hydrofluoric acid than the material of the insulating layers 32. For example, the insulating layers 32 and the lower intermediate insulating layer 170A may include undoped silicate glass, the upper intermediate insulating layer 170B may include borosilicate glass or borophosphosilicate glass, and the sacrificial material layers 42 may include silicon nitride. The patterned lower subset of the alternating stack (32, 42), the intermediate insulating layer 170, and first retro-stepped dielectric material portion 165 are collectively referred to as a first-tier structure.

First-tier memory openings and first-tier support openings may be formed through the first-tier structure. Optionally, upper regions of the first-tier memory openings and the first-tier support openings may be laterally expanded by an isotropic etch that etches the material of the upper intermediate insulating layer 170B at a greater etch rate than the material of the lower intermediate insulating layer 170A. For example, a wet etch process using dilute hydrofluoric acid may be used to laterally expand upper regions of the first-tier memory openings and the first-tier support openings. The first-tier memory openings and the first-tier support openings may be filled with sacrificial fill material portions including a sacrificial fill material (such as amorphous silicon, amorphous carbon, organosilicate glass, or an organic or inorganic polymer), and an upper subset of the alternating stack (32, 42) and an insulating cap layer 70 may be formed. The insulating cap layer 70 and the upper subset of the alternating stack (32, 42) may be patterned to form second patterned stepped surfaces. A second retro-stepped dielectric material portion 265 may be formed over the second patterned stepped surfaces of the upper subset of the alternating stack (32, 42). The upper subset of the alternating stack (32, 42), the insulating cap layer 70, and the second retro-stepped dielectric material portion 265 are collectively referred to as a second-tier structure. Drain select level isolation structures 72 may be optionally formed.

Second-tier memory openings and second-tier support openings may be formed through the second-tier structure such that portions of the sacrificial fill material that fills the first-tier memory openings and the first-tier support openings are physically exposed. The sacrificial fill material may be removed selective to the materials of the insulating layers 32, the sacrificial material layers 42, the semiconductor material layer 10, the intermediate insulating layer 170, and the insulating cap layer 70 to provide memory openings 49 in the memory array region 100 and to provide support openings 19 in the staircase region 300.

Figure 18B:
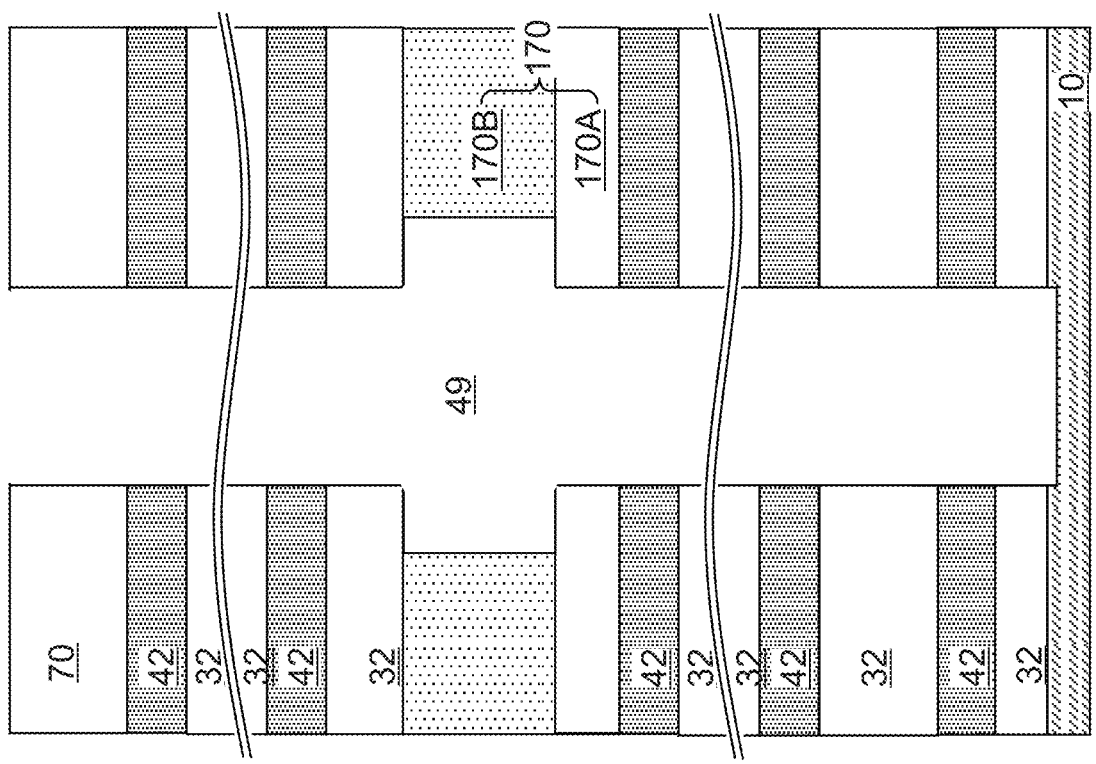

Referring to FIG. 18B, the processing steps of FIG. 5B may be optionally performed to form a pedestal channel portion 11 at the bottom of each memory opening 49 (and at the bottom of each support openings 19).

Referring to FIG. 18C, the processing steps of FIG. 5C may be performed to form an amorphous aluminum oxide layer 501 in the memory openings 49 and the support openings 19 and over the insulating cap layer 70 as a continuous dielectric material layer.

Referring to FIG. 18D, the processing steps of FIG. 5D may be performed to convert the amorphous aluminum oxide layer 501 into an in-process polycrystalline aluminum oxide blocking dielectric layer 51'. The thickness of the in-process polycrystalline aluminum oxide blocking dielectric layer 51' may be in a range from 2.5 nm to 12.5 nm, although lesser and greater thicknesses may also be used. The in-process polycrystalline aluminum oxide blocking dielectric layer 51' may comprise edges at which a physically exposed vertical surface of the in-process polycrystalline aluminum oxide blocking dielectric layer 51' directly adjoins a physically exposed horizontal surface of the in-process polycrystalline aluminum oxide blocking dielectric layer 51'. For example, a circular or elliptical bottom edge of a physically exposed inner vertical surface of the in-process polycrystalline aluminum oxide blocking dielectric layer 51' may directly adjoin a physically exposed horizontal top surface of the in-process polycrystalline aluminum oxide blocking dielectric layer 51' at the bottom of each memory opening 49. In addition, each laterally protruding portions of the in-process polycrystalline aluminum oxide blocking dielectric layer 51' located at the level of the upper intermediate insulating layer 170B may have a respective physically exposed inner vertical surface having a circular or elliptical upper edge and a circular or elliptical lower edge. Each circular or elliptical upper edge of the in-process polycrystalline aluminum oxide blocking dielectric layer 51' directly adjoins a physically exposed horizontal bottom surface of an annular portion of the in-process polycrystalline aluminum oxide blocking dielectric layer 51' that underlies a bottommost insulating layer within the upper subset of the alternating stack (32, 42). Each circular or elliptical lower edge of the in-process polycrystalline aluminum oxide blocking dielectric layer 51' directly adjoins a physically exposed horizontal top surface of an annular portion of the in-process polycrystalline aluminum oxide blocking dielectric layer 51' that overlies the lower intermediate insulating layer 170A.

Referring to FIG. 18E, the processing steps of FIG. 5E may be performed to slim the in-process polycrystalline aluminum oxide blocking dielectric layer 51' into an inner polycrystalline aluminum oxide blocking dielectric layer 51. The isotropic etch process may include a wet etch process using a basic etchant such as ammonium hydroxide and/or methyl hydroxide, or an acidic etchant such as phosphoric acid. The duration of the isotropic etch process may be controlled such that the thickness of the inner polycrystalline aluminum oxide blocking dielectric layer 51 after the etch process is in a range from 2 nm to 4 nm. Corner rounding of the in-process polycrystalline aluminum oxide blocking dielectric layer 51' may occur as a result of the isotropic etch process.

The thickness of the inner polycrystalline aluminum oxide blocking dielectric layer 51 after the isotropic etch process is herein referred to as a slimmed thickness t1. The material of the in-process polycrystalline aluminum oxide blocking dielectric layer 51' is isotropically etched from a bottom periphery of each inner sidewall of the in-process polycrystalline aluminum oxide blocking dielectric layer 51' that adjoins a planar bottom portion of the in-process polycrystalline aluminum oxide blocking dielectric layer 51' that contacts an underlying pedestal channel portion 11. The isotropic etch process removes the annular physical edge between each inner sidewall and a horizontal top surface of the in-process polycrystalline aluminum oxide blocking dielectric layer 51', and forms a concave surface having a uniform radius of curvature within a region in which a physically exposed vertical surface of the inner polycrystalline aluminum oxide blocking dielectric layer 51 indirectly adjoins a physically exposed horizontal surface of the inner polycrystalline aluminum oxide blocking dielectric layer 51 through the concave surface.

Within each memory opening 49, a first annular concave surface may be formed above, and in the vicinity of, an annular periphery of an interface between a pedestal channel portion 11 and the inner polycrystalline aluminum oxide blocking dielectric layer 51, a second annular concave surface may be formed above, and in the vicinity of, an annular periphery at which an inner sidewall of the upper intermediate insulating layer 170B contacts a horizontal top surface of the lower intermediate insulating layer 170A, and a third annular concave surface may be formed below, and in the vicinity of, an annular periphery at which an inner sidewall of the upper intermediate insulating layer 170B contacts a horizontal bottom surface of the bottommost insulating layer 32 within the upper subset of the alternating stack (32, 42). Each annular concave surface may have a radius of curvature Rb, which may be the same as the etch distance of the isotropic etch process. The radius of curvature Rb may be the same as the difference between the initial thickness t0 and the slimmed thickness t1.

Figure 19:
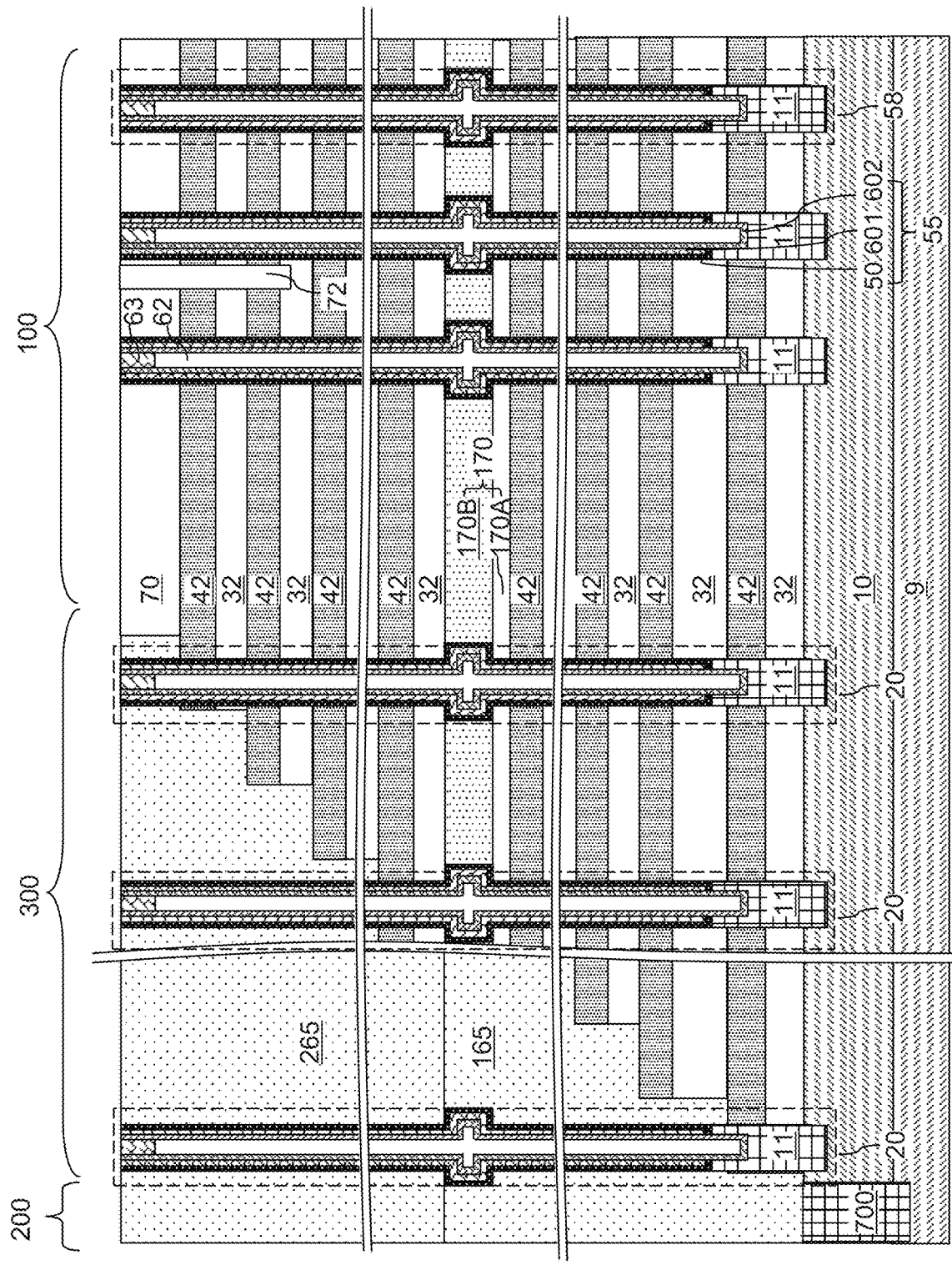
FIG. 19 is a vertical cross-sectional view of the second exemplary structure at the processing step of FIG. 18F.

Referring to FIGS. 18F and 19, the processing steps of FIGS. 5F-5K may be sequentially performed to form a memory film 50, a vertical semiconductor channel 60, a dielectric core 62, and a drain region 63 within each memory opening 49. A memory opening fill structure 58 is formed within each memory opening 49, and a support pillar structure 20 is formed within each support opening 19.

Figure 20:
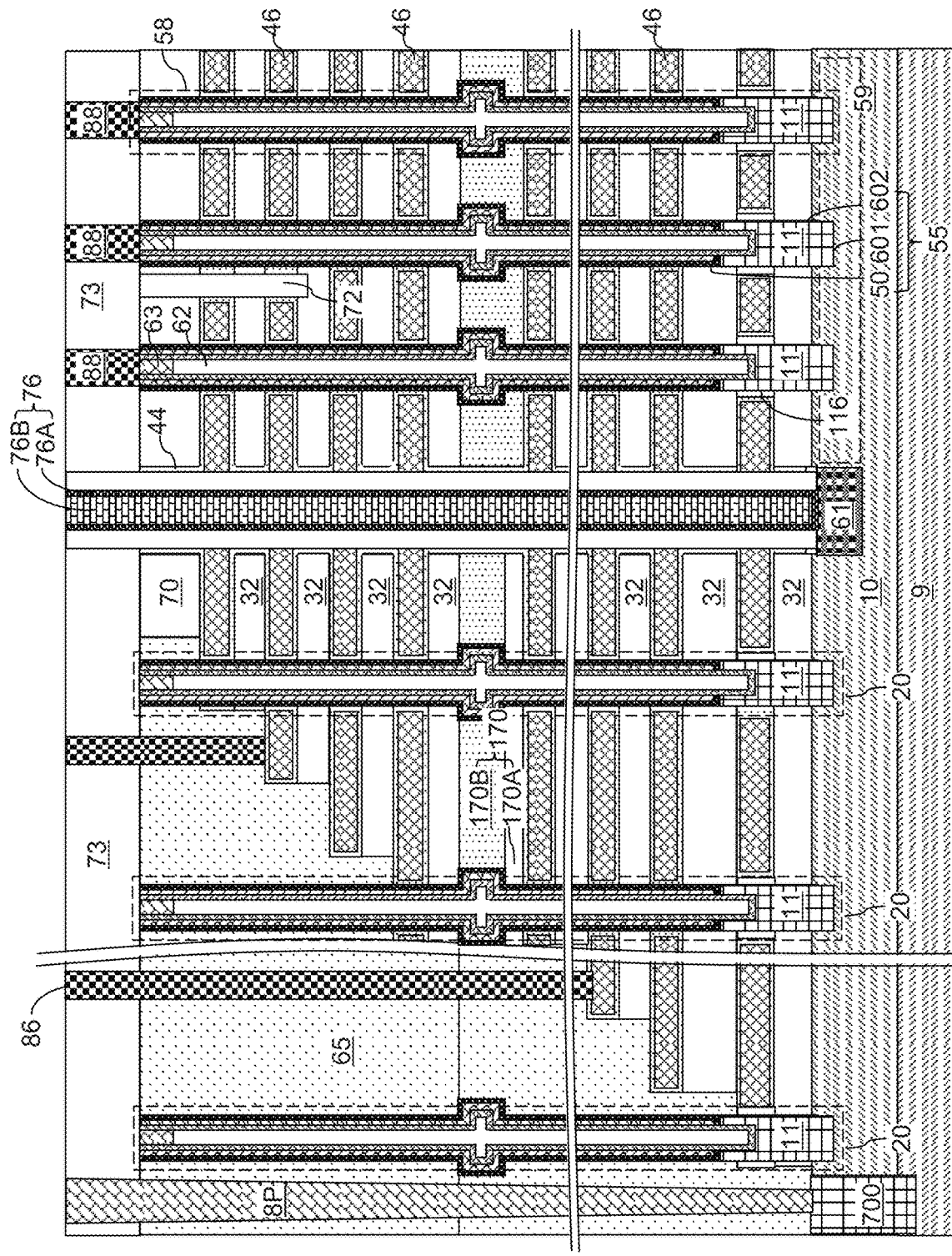
FIG. 20 is a vertical cross-sectional view of the second exemplary structure after replacement of the sacrificial material layers with electrically conductive layers and formation of various contact via structures according to an embodiment of the present disclosure.

Referring to FIG. 20, the processing steps of FIGS. 7A and 7B, 8, 9A-9E, 10, 11A-11C, 12A and 12B, and 13A and 13B may be performed to provide the outer polycrystalline aluminum oxide blocking dielectric layer 44, the electrically conductive layers 46, the backside contact via structures 76, the source regions 61, and various additional contact via structures (88, 86, 8P).

According to an embodiment of the present disclosure, corner rounding of the inner polycrystalline aluminum oxide blocking dielectric layer 51 and/or the outer polycrystalline aluminum oxide blocking dielectric layer 44 occurs because of the isotropic nature of each etch process that is used to slim the inner polycrystalline aluminum oxide blocking dielectric layer 51 and/or the outer polycrystalline aluminum oxide blocking dielectric layer 44. For example, the in-process polycrystalline aluminum oxide blocking dielectric layer 51' and/or the in-process polycrystalline aluminum oxide blocking dielectric layer 44 may have a respective initial thickness (t0 or u0), the inner polycrystalline aluminum oxide blocking dielectric layer 51 and/or the outer polycrystalline aluminum oxide blocking dielectric layer 44 may have a respective slimmed thickness (t1 or u1), and concave corners of the remaining polycrystalline aluminum oxide layer may have a diagonal thickness of $\sqrt{2}$ times the initial thickness (t0 or u0) less the slimmed thickness (t1 or u1).

FIG. 21 shows vertical cross-sectional views of four test structures that were tested during demonstration of an embodiment of the present disclosure. Each of the four test structures included a silicon substrate, a 50 nm thick silicon oxide layer (that emulates an insulating layer 32), an aluminum oxide layer having different thicknesses and/or using different processing steps for formation, a 3 nm thick TiN layer, and a 10 nm thick tungsten layer (that emulates a conductive fill material layer). A 2 nm thick polycrystalline aluminum oxide layer was provided in the first test structure by deposition and anneal of an amorphous aluminum oxide layer prior to deposition of the 3 nm thick TiN layer. A 3 nm thick polycrystalline aluminum oxide layer was provided in the second test structure by deposition and anneal of an amorphous aluminum oxide layer prior to deposition of the 3 nm thick TiN layer. A 5 nm thick polycrystalline aluminum oxide layer was provided in the third test structure by deposition and anneal of an amorphous aluminum oxide layer prior to deposition of the 3 nm thick TiN layer. A 5 nm thick polycrystalline aluminum oxide layer was initially formed in the fourth test structure by deposition and anneal of an amorphous aluminum oxide layer, and a subsequent etch process was performed to provide a 3 nm thick polycrystalline aluminum oxide layer prior to deposition of the 3 nm thick TiN layer.

Figure 22A:
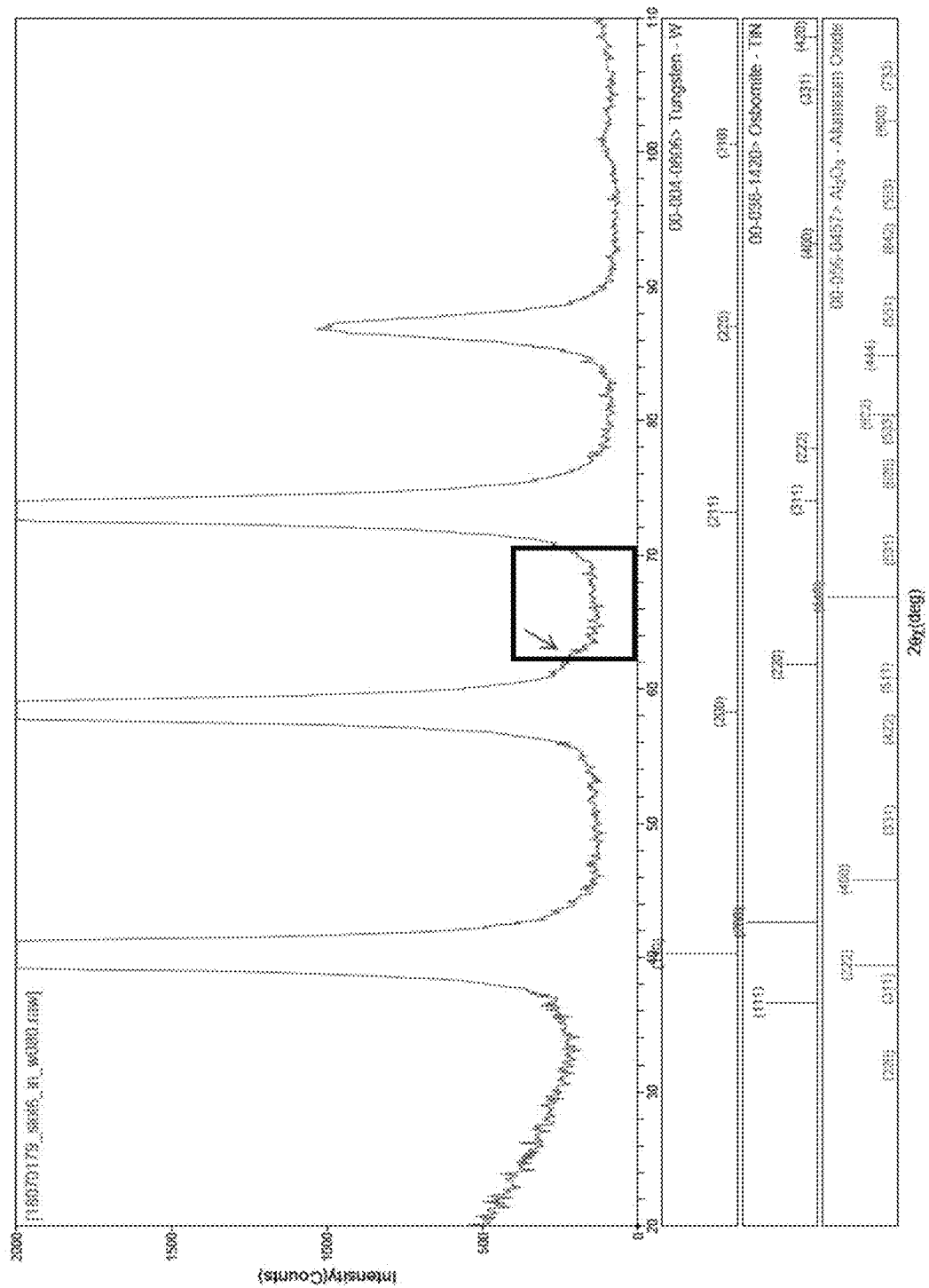
FIGS. 22A-22D illustrate X-ray diffraction data for the four first exemplary structures of FIG. 21.
Figure 22B:
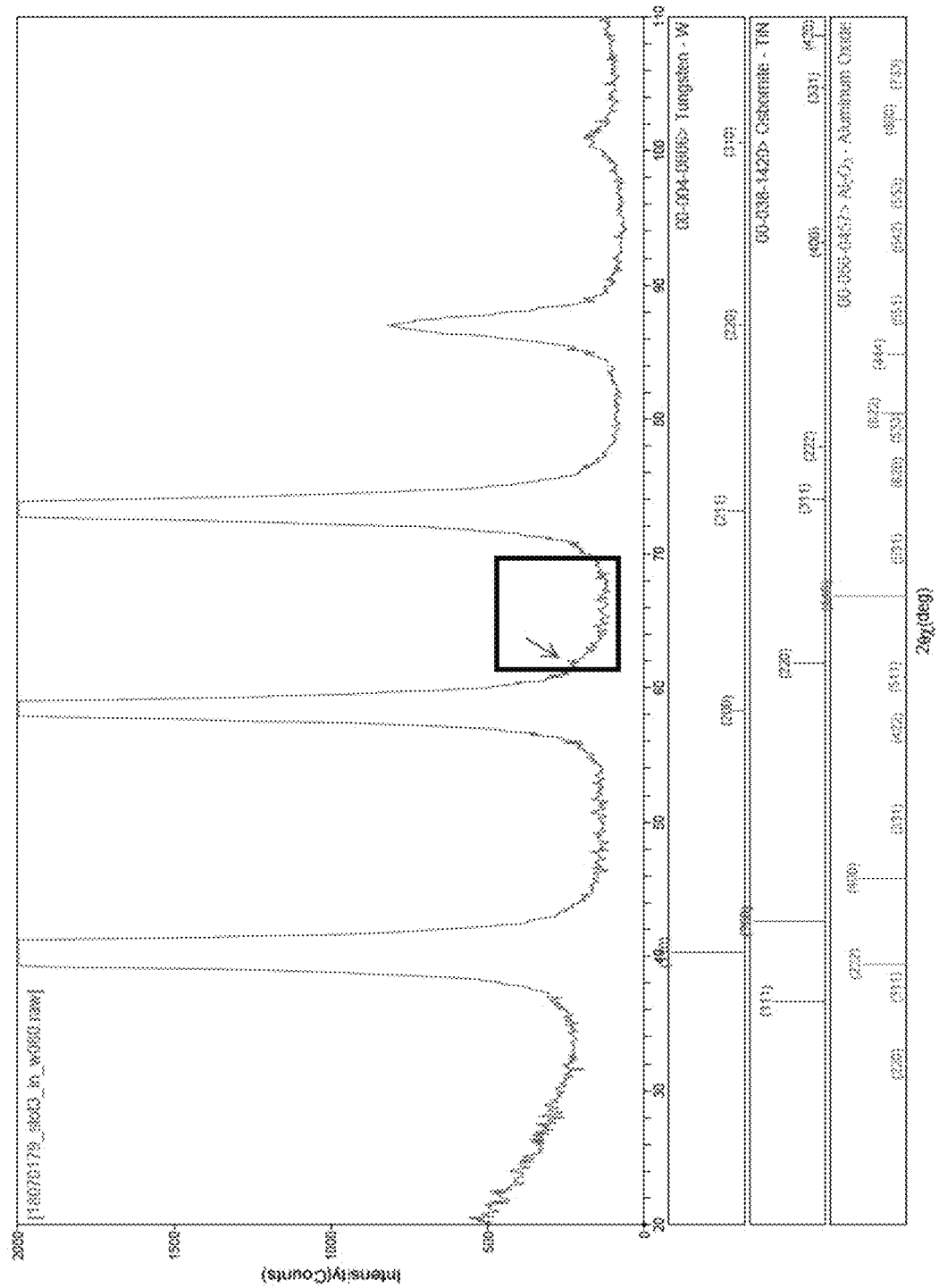
Figure 22C:
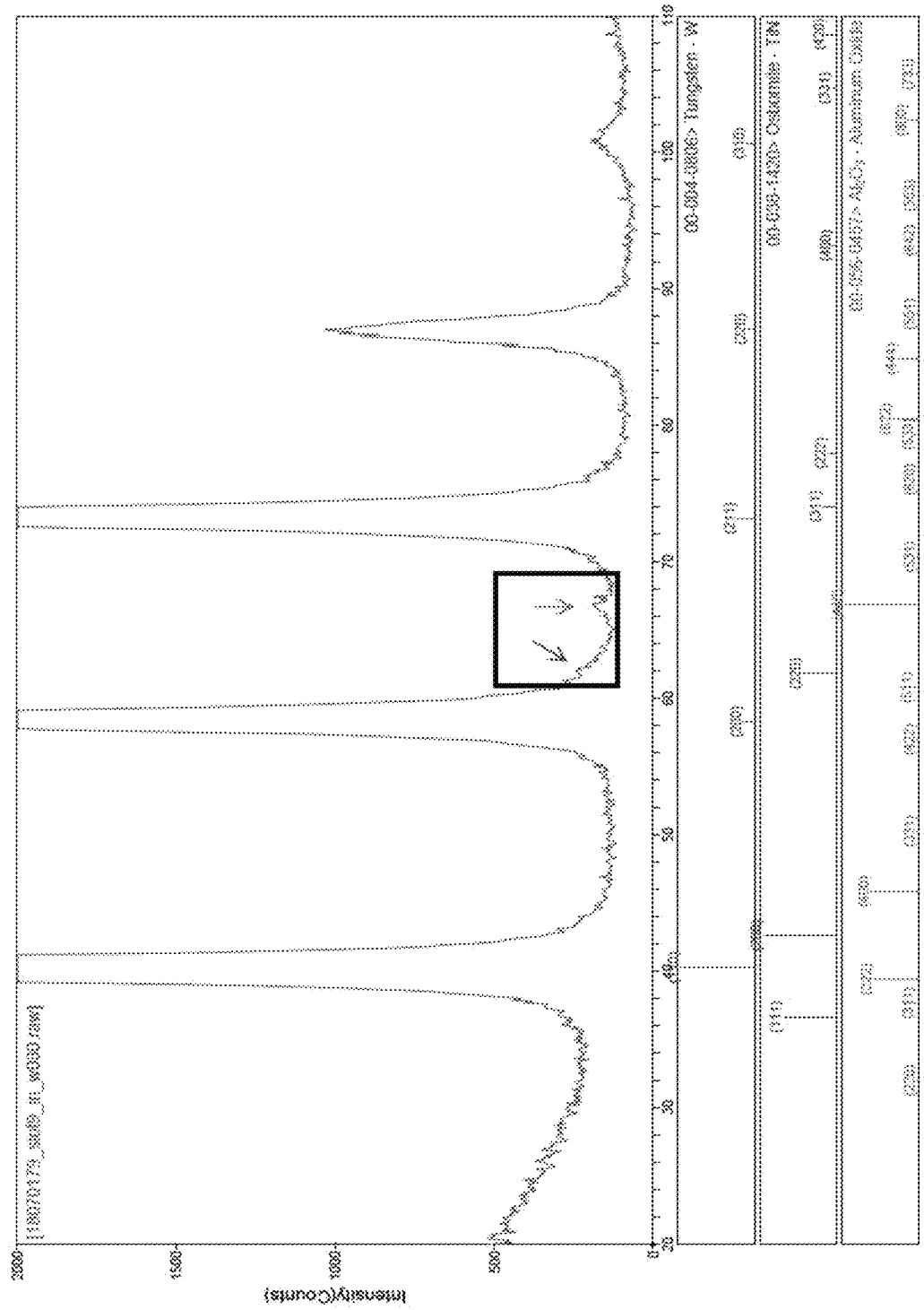
Figure 22D:
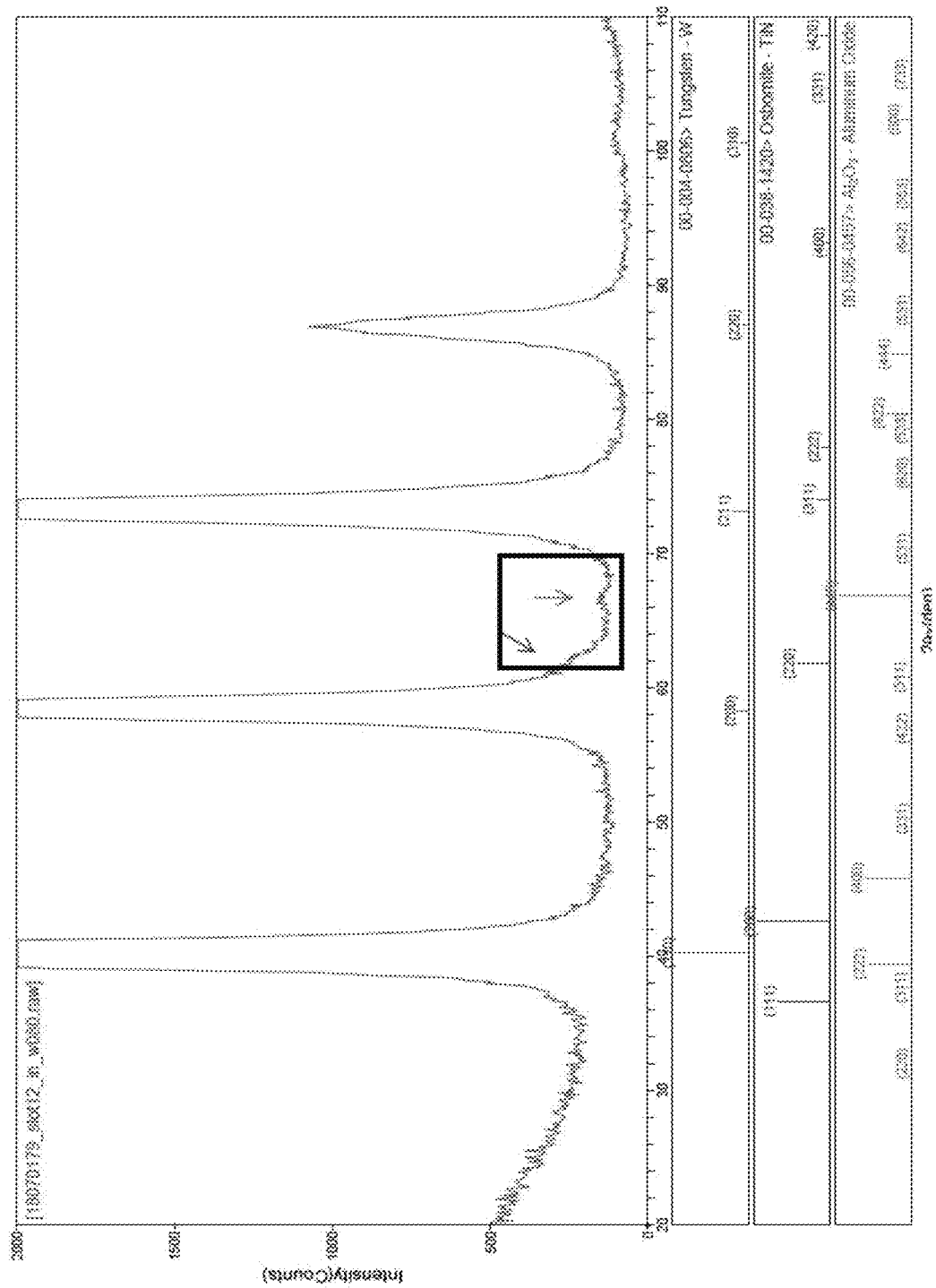

FIGS. 22A-22D illustrate X-ray diffraction data for the four test structures of FIG. 21. FIG. 22A shows the X-ray diffraction data for the first test structure, FIG. 22B shows the X-ray diffraction data for the second test structure, FIG. 22C shows the X-ray diffraction data for the third test structure, and FIG. 22D shows the X-ray diffraction data for the fourth test structure. FIGS. 22A and 22B do not show any peaks from polycrystalline aluminum oxide. In contrast, FIGS. 22C and 22D show peaks from polycrystalline aluminum oxide. Thus, a thickness of at least 4 nm is implemented to form large enough grains in the polycrystalline aluminum oxide layer for detection of diffraction peaks in an X-ray diffraction measurement. Presence of X-ray diffraction peaks for aluminum oxide crystals in the graph of FIG. 22D and absence of X-ray diffraction peaks for aluminum oxide crystals in the graph of FIG. 22B means that the fourth test structure includes larger grains of aluminum oxide than the second test structure. This is due to the greater thickness of aluminum oxide at the time of crystallization anneal. In other words, a polycrystalline aluminum oxide layer derived from an initially thicker amorphous aluminum oxide and etched back to a final thickness has larger grain sizes than polycrystalline aluminum oxide layer obtained by annealing an amorphous aluminum oxide layer of a lesser thickness and having the same final thickness.

Figure 23:
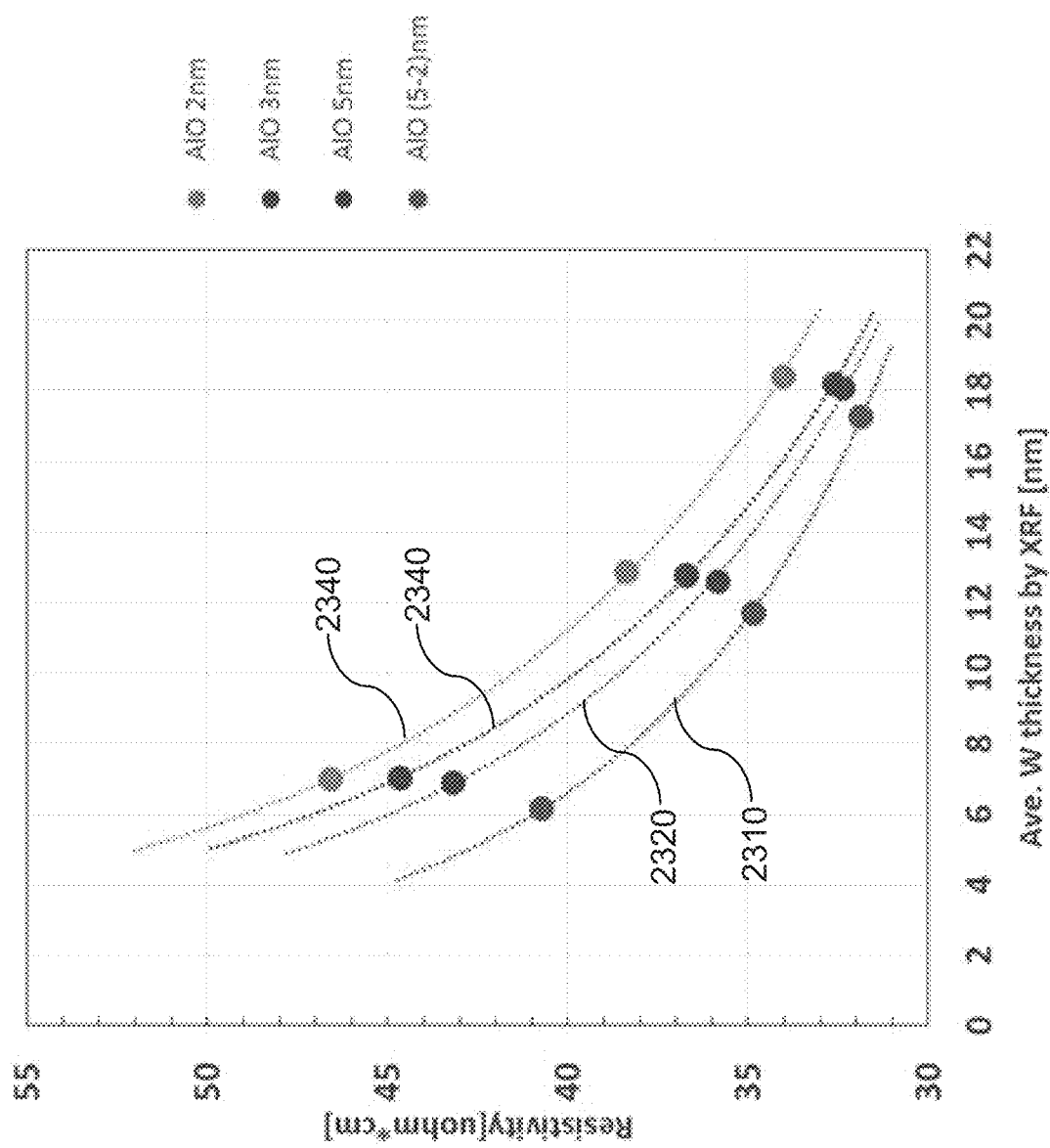
FIG. 23 is a graph comparing resistivity of tungsten formed on various aluminum oxide layers of the four first exemplary structures of FIG. 21.

FIG. 23 is a graph comparing resistivity of tungsten formed on various aluminum oxide layers of the four first exemplary structures of FIG. 21. A first curve 2310 is a fit to a first set of resistivity data obtained from layer stacks including the configuration of structure 1 of FIG. 21, i.e., a configuration employing a 2 nm thick polycrystalline aluminum oxide layer. A second curve 2320 is a fit to a second set of resistivity data obtained from layer stacks including the configuration of structure 2 of FIG. 21, i.e., a configuration employing a 3 nm thick polycrystalline aluminum oxide layer. A third curve 2330 is a fit to a third set of resistivity data obtained from layer stacks including the configuration of structure 3 of FIG. 21, i.e., a configuration employing a 5 nm thick polycrystalline aluminum oxide layer. A fourth curve 2340 is a fit to a fourth set of resistivity data obtained from layer stacks including the configuration of structure 4 of FIG. 21, i.e., a configuration employing an original 5 nm thick polycrystalline aluminum oxide layer that is thinned down to a 3 nm thick polycrystalline aluminum oxide layer prior to deposition of a TiN layer and a W layer. The resistivity of tungsten is the highest for the first test structure, followed by the second, third, and the fourth test structures in that order. Thus, the process of the fourth test structure provides a lower electrical resistivity than the process of the second test structure. It is believed that the polycrystalline aluminum oxide of the fourth test structure has larger grain boundaries than the polycrystalline aluminum oxide of the second test structure.

Two resistance reduction effects are present in the data of FIG. 23. One is the effect from the increase of the thickness of the polycrystalline aluminum oxide layer, which is about 5%. Another is the effect due to slimming of the polycrystalline aluminum oxide layer, which is about 7%. Without wishing to be bound by any particular theory, the inventors believe that the thickness effect is due to the crystal continuity of the TiN layer and the tungsten layer form the underlying polycrystalline aluminum oxide layer. In other words, it is believed that larger aluminum oxide grains help enlargement of grains in the TiN and W layers. It is also postulated that slimming could affect the tungsten crystal orientation by stripping surface portions of an initial polycrystalline aluminum oxide layer that has smaller grains.

The X-ray diffraction data suggests that the polycrystalline aluminum oxide layer formed by a slimming process provides larger grain sizes for the remaining polycrystalline aluminum oxide layer than a polycrystalline aluminum oxide layer having a same thickness and formed by an anneal of a thinner amorphous aluminum oxide layer without use of a slimming process. Thus, a slimmed polycrystalline aluminum oxide layer is expected to provide better block property without an increase in the film thickness. For example, improved block property may provide, for example, data retention improvement through reduction of trap site in the polycrystalline aluminum oxide material and effective suppression of fluorine diffusion.

Referring to all drawings and according to various embodiments of the present disclosure, a three-dimensional memory device is provided, which comprises: an alternating stack of insulating layers 32 and electrically conductive layers 46 located over a substrate (9, 10); and a memory stack structure 55 extending through the alternating stack (32, 46) and comprising a vertical semiconductor channel 60 laterally surrounded by a vertical stack of charge storage elements (comprising portions of a charge storage layer 54 located at levels of the electrically conductive layers 46), wherein: a polycrystalline aluminum oxide blocking dielectric layer (51 and/or 44) is located between each charge storage element and a neighboring one of the electrically conductive layers 46; and a diagonal thickness of the polycrystalline aluminum oxide blocking dielectric layer (51 and/or 44) between an inner concave surface and outer angled surfaces (such as a horizontal surface and a vertical surface of the polycrystalline aluminum oxide blocking dielectric layer (51 and/or 44)) is greater than a thickness (t1 or u1) of a vertical portion of the polycrystalline aluminum oxide blocking dielectric layer (51 and/or 44).

In one embodiment, the inner concave surface of the polycrystalline aluminum oxide blocking dielectric layer (51 and/or 44) has a uniform radius of curvature.

In one embodiment, the inner concave surface of the polycrystalline aluminum oxide blocking dielectric layer (51 and/or 44) extends by an angle of 90 degrees (corresponding to an extension of the inner concave surface from a horizontal direction to a vertical direction as illustrated in FIGS. 5E, 9D, 15D, and 18E) in a vertical cross-sectional view around a center of curvature for the inner concave surface.

In one embodiment, the outer angled surfaces comprise: a vertical outer surface of the polycrystalline aluminum oxide blocking dielectric layer (51 and/or 44); and a horizontal outer surface of the polycrystalline aluminum oxide blocking dielectric layer (51 and/or 44) that is directly adjoined to a bottom edge of the vertical outer surface of the polycrystalline aluminum oxide blocking dielectric layer (51 and/or 44).

In one embodiment, the memory stack structure 55 is located within a memory opening 49 that vertically extends through the alternating stack (32, 46); and the polycrystalline aluminum oxide blocking dielectric layer (51 and/or 44) contacts sidewalls of the insulating layers 32 of the alternating stack (32, 46).

In one embodiment, the three-dimensional memory device comprises: a charge storage layer 54 located within an inner sidewall of the polycrystalline aluminum oxide blocking dielectric layer 51, wherein the charge storage layer 54 comprises the vertical stack of charge storage elements; and a drain region 63 contacting an upper end of the vertical semiconductor channel 60.

Figure 16D:
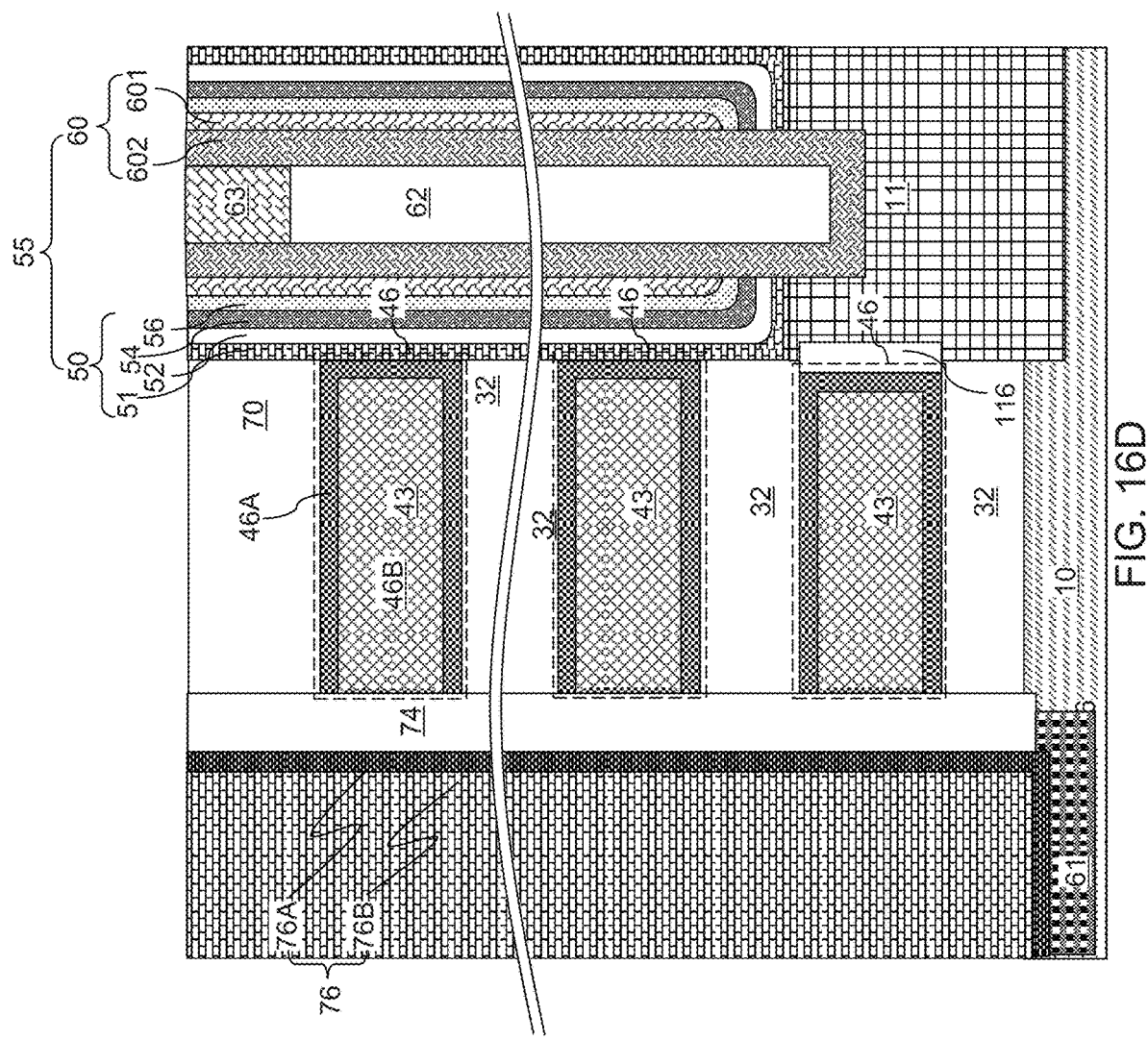

In one embodiment, an outer sidewall of the polycrystalline aluminum oxide blocking dielectric layer 51 is in direct contact with an element selected from: one of the electrically conductive layers 46 (as illustrated in FIG. 16D); and a backside blocking dielectric layer (comprising an outer polycrystalline aluminum oxide blocking dielectric layer 44) embedding one of the electrically conductive layers (as illustrated in FIGS. 12B, 15F, and 20).

In one embodiment, a memory opening fill structure 58 including the memory stack structure 55 vertically extends through the alternating stack (32, 46); and the polycrystalline aluminum oxide blocking dielectric layer 44 directly contacts: an overlying one of the insulating layers 32; an underlying one of the insulating layers 32; and an outer sidewall of the memory opening fill structure 58.

In one embodiment, the polycrystalline aluminum oxide blocking dielectric layer 44 directly contacts a horizontal top surface, an upper convex corner surface, a vertical sidewall surface, a lower convex corner surface, and a horizontal bottom surface of one of the electrically conductive layers 46 (as illustrated in FIGS. 12B and 15F).

In one embodiment, the alternating stack (32, 46) comprises: stepped surfaces in a staircase region 300 in which each of the electrically conductive layers 46 other than a bottommost one of the electrically conductive layers 46 laterally extends farther than any overlying one of the electrically conductive layers 46; a retro-stepped dielectric material portion {65, (165, 265)} overlying the stepped surfaces; and contact via structures 86 contacting a respective one of the electrically conductive layers 46.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (comprising a subset of the at least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion (such as a vertical semiconductor channel 60) of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming an alternating stack of insulating layers and sacrificial material layers over a substrate;
   forming a memory stack structure through the alternating stack, wherein the memory stack structure comprises a vertical semiconductor channel laterally surrounded by a vertical stack of charge storage elements; and
   replacing the sacrificial material layers with material portions comprising electrically conductive layers,
wherein:
   a polycrystalline aluminum oxide blocking dielectric layer is provided between each charge storage element and a neighboring one of the electrically conductive layers; and
   the polycrystalline aluminum oxide blocking dielectric layer is formed by:
   depositing an amorphous aluminum oxide layer;
   converting the amorphous aluminum oxide layer into an in-process polycrystalline aluminum oxide blocking dielectric layer by an anneal; and
   thinning the in-process polycrystalline aluminum oxide blocking dielectric layer into the polycrystalline aluminum oxide layer by etching back a surface portion of the in-process polycrystalline aluminum oxide blocking dielectric layer using an etch process;
wherein:
   the amorphous aluminum oxide layer is deposited directly on physically exposed surfaces of the insulating layers;
   the in-process polycrystalline aluminum oxide blocking dielectric layer comprises an edge at which a physically exposed vertical surface of the in-process polycrystalline aluminum oxide blocking dielectric layer directly adjoins a physically exposed horizontal surface of the in-process polycrystalline aluminum oxide blocking dielectric layer; and
   the etch process removes the edge and forms a concave surface having a uniform radius of curvature within a region in which a physically exposed vertical surface of the polycrystalline aluminum oxide blocking dielectric layer indirectly adjoins a physically exposed horizontal surface of the polycrystalline aluminum oxide blocking dielectric layer through the concave surface.

2. The method of claim 1, wherein the etch process comprises an isotropic etch process that reduces a thickness of a vertical portion of the in-process polycrystalline aluminum oxide blocking dielectric layer by a percentage in a range from 15% to 85%.

3. The method of claim 1, wherein the radius of curvature is the same as an etch distance of the etch process.

4. The method of claim 1, further comprising:
   forming a memory opening through the alternating stack, wherein a sidewall of the memory opening comprises physically exposed surfaces of layers within the alternating stack; and
   forming the amorphous aluminum oxide layer on the sidewall of the memory opening.

5. The method of claim 4, further comprising conformally depositing a charge storage layer on the polycrystalline aluminum oxide layer, wherein the charge storage layer comprises the vertical stack of charge storage elements.

6. The method of claim 5, further comprising:
forming backside recesses by removing the sacrificial material layers selective to the insulating layers and the polycrystalline aluminum oxide layer; and
depositing an element selected from a backside blocking dielectric layer and one of the electrically conductive layers directly on physically exposed surface portions of the polycrystalline aluminum oxide layer within the backside recesses.

7. The method of claim 1, further comprising
forming backside recesses by removing the sacrificial material layers selective to the insulating layers and the memory stack structure;
forming the amorphous aluminum oxide layer on physically exposed surfaces of the insulating layers and the memory stack structure in the backside recesses.

8. The method of claim 7, further comprising depositing the electrically conductive layers directly on the polycrystalline aluminum oxide layer.

9. The method of claim 1, further comprising:
forming stepped surfaces by patterning the alternating stack, wherein each of the sacrificial material layers other than a bottommost one of the sacrificial material layers laterally extends farther than any overlying one of the sacrificial material layers;
forming a retro-stepped dielectric material portion over the stepped surfaces; and
forming contact via structures directly on a respective one of the electrically conductive layers.

* * * * *